United States Patent
Imada et al.

(10) Patent No.: US 8,404,584 B2
(45) Date of Patent: Mar. 26, 2013

(54) METHOD OF MANUFACTURING SEMICONDUCTOR DEVICE

(75) Inventors: Tadahiro Imada, Kawasaki (JP); Kouta Yoshikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 13/098,735

(22) Filed: May 2, 2011

(65) Prior Publication Data
US 2011/0207319 A1    Aug. 25, 2011

Related U.S. Application Data

(63) Continuation of application No. PCT/JP2008/071947, filed on Dec. 3, 2008.

(51) Int. Cl.
*H01L 21/44* (2006.01)

(52) U.S. Cl. ........ 438/653; 438/691; 438/692; 438/694; 257/635; 257/637; 257/642; 257/758; 257/759; 257/70; 257/E21.584

(58) Field of Classification Search .................. None
See application file for complete search history.

(56) References Cited

U.S. PATENT DOCUMENTS

| | | | |
|---|---|---|---|
| 5,723,909 A * | 3/1998 | Yano et al. | 257/760 |
| 2007/0122752 A1* | 5/2007 | Asako et al. | 428/34 |
| 2007/0228568 A1 | 10/2007 | Oku et al. | |
| 2007/0232075 A1* | 10/2007 | Imada et al. | 438/758 |
| 2008/0108153 A1 | 5/2008 | Miyajima | |
| 2008/0241499 A1 | 10/2008 | Sinapi et al. | |

FOREIGN PATENT DOCUMENTS

| | | |
|---|---|---|
| JP | 7-066287 A | 3/1995 |
| JP | 2006-073800 A | 3/2006 |
| JP | 2007-073914 A | 3/2007 |
| JP | 2007-294854 A | 11/2007 |
| JP | 2008-117903 A | 5/2008 |
| JP | 2008-243901 A | 10/2008 |

OTHER PUBLICATIONS

Wikipedia document attached on HDMS data.*
Chen F. et al. "Investigation of CVD SiCOH Low-k Time-dependent Dielectric Breakdown at 65nm Node Technology," IEEE 43rd Annual International Reliability Physics Symposium, 2005, pp. 501-507.
Imada T. et al. "TDDB Characteristics of Low-k Dielectrics after Plasma Damage Recovery Process," 2007 AMC Proceedings, 2007, P.V.2.
Ishii A. et al. "Interface Engineering for Highly-Reliable 65nm-Node Cu/ULK (k=2.6) Interconnect Integration," IEEE IITC Proceedings, 2005, pp. 21-23.
International Search Report of PCT/JP2008/071947, mailing date Mar. 10, 2009.

* cited by examiner

*Primary Examiner* — Julio J Maldonado
*Assistant Examiner* — Yasser Abdelaziez
(74) *Attorney, Agent, or Firm* — Westerman, Hattori, Daniels & Adrian, LLP

(57) ABSTRACT

The method of manufacturing the semiconductor device includes forming an insulating film above a semiconductor substrate, forming an opening in the insulating film, forming a conductive film above the insulating film with the opening formed, removing the conductive film above the insulating film to bury the conductive film in the opening, and processing a surface of the insulating film with a silicon compound including Si—N or Si—Cl.

13 Claims, 18 Drawing Sheets

DAMAGE RECOVERING TREATMENT WITH SILICON COMPOUND

US 8,404,584 B2

METHOD OF MANUFACTURING SEMICONDUCTOR DEVICE

CROSS REFERENCE TO RELATED APPLICATIONS

This application is a Continuation of International Application No. PCT/JP2008/071947, with an international filing date of Dec. 3, 2008, which designating the United States of America, the entire contents of which are incorporated herein by reference.

FIELD

The embodiments discussed herein are related to a method of manufacturing a semiconductor device, more specifically, a method of manufacturing a semiconductor device including an interconnection.

BACKGROUND

It has been conventionally known that, in the semiconductor device, leakage current in the insulating film between the interconnections add to the power consumption. Such leakage current has not much influential on the semiconductor device as a whole of the generation whose interconnection pitch exceeds 1 µm.

However, with the interconnection pitch being, e.g., not more than 1 µm, the leakage current becomes more influential on the power consumption due to the smaller interconnection pitches and the increased interconnection scales. When the circuit is formed with the interconnections of not more than 1 µm-pitch, the leakage current between the interconnections becomes to be influential on the characteristics and the lifetime of the semiconductor devices.

Presently, as a method of forming the interconnections of the semiconductor devices, the so-called damascene method is used. In the damascene method, first, interconnection trench of an interconnection pattern is formed in an insulating film by etching. Next, on the insulating film with the interconnection trench formed in, an interconnection material, such as copper or others, is deposited. Then, the excessive interconnection material on the insulating film is polished off by CMP (Chemical Mechanical Polishing) method to bury the interconnection material in the interconnection trench. Thus, the interconnection buried in the insulating film is formed.

The following are examples of related: Japanese Laid-open Patent Publication No. 2007-294854; F. Chen et al., IEEE IRPS Proceedings 43th Annual, pp. 501-507, 2005; A. Ishii et al., IEEE IITC Proceedings, pp. 21-23, 2005; and T. Imada et al., 2007 AMC Proceedings, P.V.2.

However, in the damascene method, in polishing the interconnection material by CMP method, the surface of the insulating film with the interconnection material buried in is chemically and mechanically damaged. Such damage of the insulating film surface causes increases of the leakage current, degradation of the TDDB (Time Dependent Dielectric Breakdown) characteristics, etc., which is one factor for decreases of the manufacturing yields and reliability of the semiconductor devices.

SUMMARY

According to one aspect of an embodiment, there is provided a method of manufacturing a semiconductor device including forming an insulating film above a semiconductor substrate, forming an opening in the insulating film, forming a conductive film above the insulating film with the opening formed, removing the conductive film above the insulating film by CMP to bury the conductive film in the opening and making a processing of exposing a silicon compound including Si—N or Si—Cl to a surface of the insulating film or applying the silicon compound to the surface of the insulating film.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

A method of manufacturing a semiconductor device according to a first embodiment will be described with reference to FIGS. 1A to 2C. FIGS. 1A-2C are sectional views illustrating the method of manufacturing the semiconductor device according to the present embodiment.

Figure 1A:
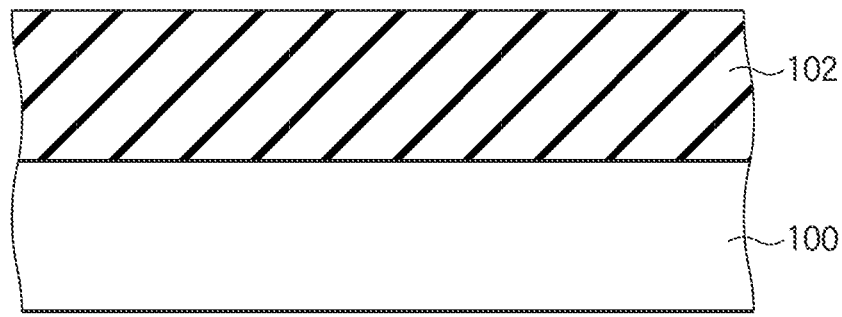
FIGS. 1A-1C and 2A-2C are sectional views illustrating a method of manufacturing a semiconductor device according to a first embodiment.

First, an insulating film 102 is formed above a base substrate 100 (FIG. 1A). The base substrate 100 includes a semiconductor substrate, such as a silicon substrate and a semiconductor substrate with MIS transistors or other elements, or one, two or more interconnection layers formed on. The insulating film 102 includes an inter-layer insulating film for the insulation between the interconnections, etc., a stopper film which functions as the polish stopper in polishing by CMP method, and a stopper film which functions as the etching stopper in forming an opening, such as interconnection trench, by etching, and others.

As the insulating film 102, for example, a silica-based insulating film, such as SiOC film, SiC film, SiN film, SiF film, or others, can be used. Other than such silica-based insulating films, various insulating films can be used. The method of forming the insulating film 102 can be suitably selected out of CVD method, coating method, etc. in accordance with a film species. The SiOC film may contain N (nitrogen), H (hydrogen), etc. in the film. The SiC film may contain O (oxygen), N, H, etc. in the film. The SiN film may contain O, C, H, etc. in the film. When the interconnection pitch is, e.g., not more than 1 µm, preferably the insulating film 102 is a low-dielectric constant film whose relative dielectric constant is, e.g., not more than 3.

Figure 1B:
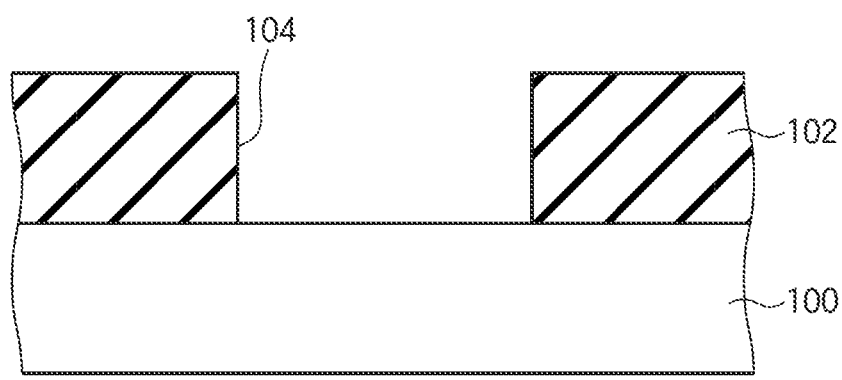

Next, by photolithography and dry etching, an opening 104 is formed in the insulating film 102 (FIG. 1B). The opening is an interconnection trench for an interconnection to be buried in. The opening 104 can be a contact hole for a contact plug to be buried in.

Figure 1C:
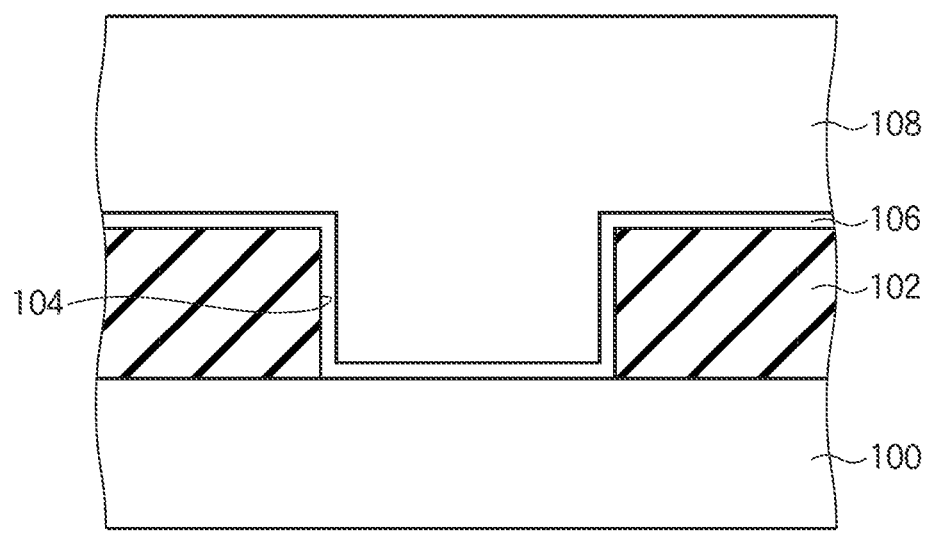

Then, above the insulating film 102 with the opening 104 formed in, a barrier metal 106 and a conductive film 108 are sequentially formed, filling the opening 104 (FIG. 1C). As the barrier metal 106, for example, titanium nitride (TiN) film, tantalum nitride (TaN) or others can be used. As the conductive film 108, for example, copper (Cu) film, aluminum (Al) film, gold (Au) film, platinum film (Pt) film, tungsten (W) film or others can be used.

Figure 2A:
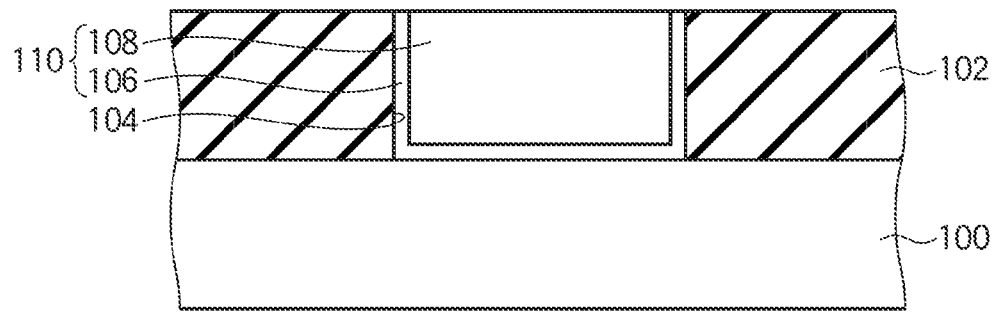

Next, the conductive film 108 and the barrier metal 106 above the insulating film 102 are polished off by CMP method. Thus, the interconnection 110 of the barrier metal 106 and the conductive film 108 buried in the opening 104 is formed (FIG. 2A). It is possible that as the opening 104, a contact hole is formed, and a contact plug including the barrier metal 106 the conductive film 108 buried in the opening 104 is formed.

Figure 2B:
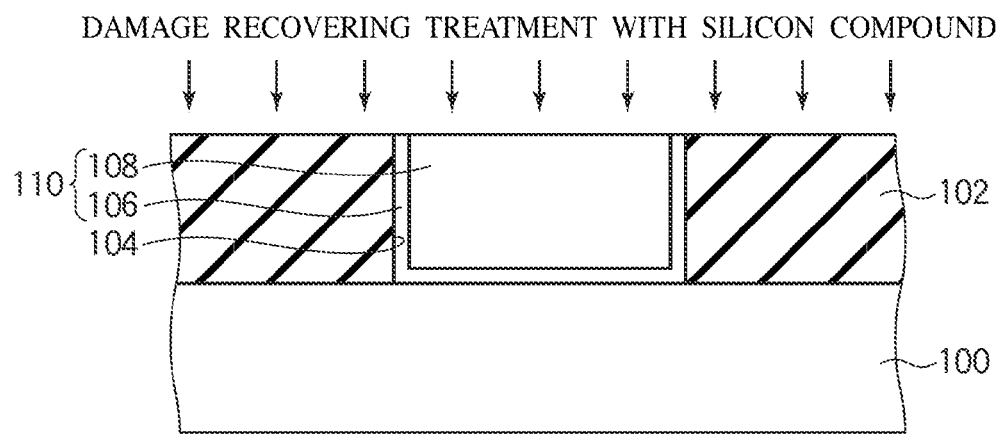

Then, a treatment for recovering the damage in the surface of the insulating film made in polishing the conductive film by CMP is made with a silicon compound of a prescribed molecular structure (FIG. 2B).

Specifically, this treatment is for reacting silanol groups (Si—OH groups) generated on the surface of the insulating film 102 by the damage made in polishing the conductive film 108 and the barrier metal 106 by CMP and the silicon compound of the prescribed molecular structure with each other.

In polishing off the conductive film 108 and the barrier metal 106 above the surface of the insulating film 102 by CMP, the surface of the insulating film 102 is chemically and mechanically damaged. Resultantly, Si—OH groups are generated on the surface of the insulating film 102, and fine cracks are generated. Such Si—OH groups and cracks are one factor for causing increase of the leakage current and degradation of the TDDB characteristics.

Then, in the method of manufacturing the semiconductor device according to the present embodiment, as the damage recovering treatment, the Si—OH groups generated on the surface of the insulating film 102 and the silicon compound are reacted with each other to thereby convert the Si—OH groups to Si—O—Si bonds to make the surface of the insulating film 102 hydrophobic. The surface of the insulating film 102 is thus made hydrophobic to thereby decrease water to be adsorbed to the insulating film 102. Resultantly, the leakage current can be decreased, and the TDDB characteristics can be improved. Thus, according to the method of manufacturing the semiconductor device according to the present embodiment, a semiconductor device of small power consumption and high reliability can be manufactured with high yields.

As the silicon compound to be used in the damage recovering treatment, a silicon compound which is reactive with Si—OH groups in the polish by CMP may be used, and for example, a silicon compound having at least any one of the parts expressed by the chemical formulas (1) and (2) described below may be used.

Si—N (1)

Si—Cl (2)

The atoms to combine with the bonds not expressed by the chemical formulas (1) and (2) can be, e.g., C, O, N, Cl, etc. N and C may combine with the same Si or may combine with discrete Si atoms. When N and C combine with discrete Si atoms, generally, the Si atom combined with N and the Si atom combined with Cl are combined with each other via other atoms, such as C, O, etc.

The Si—N bond and the Si—C bond expressed by the chemical formulas (1) and (2) readily react with the Si—OH groups on the surface of the insulating film 102 during the damage recovering treatment and generate Si—O—Si bonds. The Si—N bonds and the Si—Cl bonds readily react with the Si—O—H groups on the surface of the insulating film 102 and generate the Si—O—Si bonds by treatment, such as irradiation of electromagnetic waves, exposure to plasmas, heating processing, etc. The irradiation of electromagnetic waves is, e.g., irradiation of infrared ray, ultraviolet ray, X ray, α ray, γ ray, electron beam, etc. For the heating processing, a hot plate, a heating furnace, for example, is used.

The Si—N bonds and the Si—Cl bonds may not completely react and may reside on the insulation film 102 and the interconnection 110. However, these bonds often cause rise of the dielectric constant due to humidity absorption, etc. Accordingly, preferably the residue ratio of these bonds in the insulating film is low. Specifically, the residue ratio is preferably, e.g., not more than 500 wt ppm. This is because when the residue ratio is above this, the dielectric constant easily rises.

As the silicon compound to be used in such damage recovering treatment, more specifically, a silicon compound including at least any one of the parts expressed by the chemical formulas (3) to (17) described

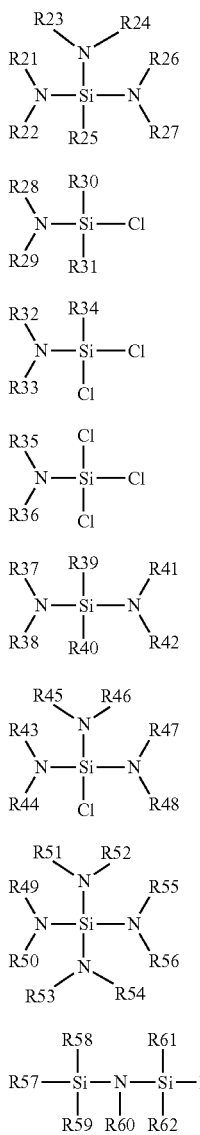

In the chemical formulas (3) to (17), R1-R63 represent groups selected independently in the respective formulas or independently of the respective formulas out of a group consisting of hydrogen, alkyl group with a carbon number of 1-20, alkenyl group with a carbon number of 2-20, alkynyl group, alkylcarbonyl group, alkenylalkyl group and aryl group with a carbon number of 6-20.

As specific examples of the silicon compound including the part expressed by the chemical formula (3) are compounds as exemplified below. That is, chlorotrimethylsilane is exemplified. Chlorotriethylsilane is also exemplified. Chlorotripropylsilane is also exemplified. Chlorotriisopropylsilane is also exemplified. Chlorotrivinylsilane is also exemplified. Chlorotriphenylsilane is also exemplified. Chlorotri(n-butyl)silane is also exemplified. Chlorotri(s-butyl)silane is also exemplified. Chlorotri(t-butyl)silane is also exemplified. Chlorodiethylmethylsilane is also exemplified. Chlorodimethylpropylsilane is also exemplified. Chlorodiethylpropylsilane is also exemplified. Chlorodimethylisopropylsilane is also exemplified. Chlorodiethylisopropylsilane is also exemplified. Chlorodiisopropylpropylsilance is also exemplified. Chlorodimethylvinylsilane is also exemplified. Chlorodiethylvinylsilane is also exemplified. Chlorodipropylvinylsilane is also exemplified. Chlorodiisopropylvinylsilane is also exemplified. Chlorodimethylphenylsilane is also exemplified. Chlorodiethylphenylsilane is also exemplified. Chlorodiphenylpropylsilane is also exemplified. Chlorodiisopropylphenylsilane is also exemplified. Chlorodiphenylvinylsilane is also exemplified. Chlorodi(n-butyl)methylsilane is also exemplified. Chlorodi(n-butyl)ethylsilane is also exemplified. Chlorodi(n-butyl)propylsilane is also exemplified. Chlorodi(n-butyl)isopropylsilane is also exemplified. Chlorodi(n-butyl)vinylsilane is also exemplified. Chlorodi(n-butyl)phenylsilane is also exemplified. Chlorodi(s-butyl)methylsilane is also exemplified. Chlorodi(s-butyl)ethylsilane is also exemplified. Chlorodi(s-butyl)propylsilane is also exemplified. Chlorodi(s-butyl)isopropylsilane is also exemplified. Chlorodi(s-butyl)vinylsilane is also exemplified. Chlorodi(s-butyl)phenylsilane is also exemplified. Chlorodi(n-butyl)s-butylsilane is also exemplified. Chlorodi(t-butyl)methylsilane is also exemplified. Chlorodi(t-butyl)ethylsilane is also exemplified. Chlorodi(t-butyl)propylsilane is also exemplified. Chlorodi(t-butyl)isopropylsilane is also exemplified. Chlorodi(t-butyl)vinylsilane is also exemplified. Chlorodi(t-butyl)phenylsilane is also exemplified. Chlorodi(n-butyl)t-butylsilane is also exemplified. Chlorodi(s-butyl)t-butylsilane is also exemplified. Chloromethylethylpropylsilane is also exemplified. Chloromethylethylisopropylsilane is also exemplified. Chloromethylethylvinylsilane is also exemplified. Chloromethylethylphenylsilane is also exemplified. Chloromethylethyl-n-butylsilane is also exemplified. Chloromethylethyl-s-butylsilane is also exemplified. Chloromethylethyl-t-butylsilane is also exemplified. Chloroethylpropylisopropylsilane is also exemplified. Chloroethylpropylvinylsilane is also exemplified. Chloroethylpropylphenylsilane is also exemplified. Chloroethylpropyl-n-butylsilane is also exemplified. Chloroethylpropyl-s-butylsilane is also exemplified. Chloroethylpropyl-t-butylsilane is also exemplified. Chloropropylisopropylvinylsilane is also exemplified. Chloropropylisopropylphenylsilane is also exemplified. Chloropropylisopropyl-n-butylsilane is also exemplified. Chloropropylisopropyl-s-butylsilane is also exemplified. Chloropropylisopropyl-t-butylsilane is also exemplified. Chloroisopropylvinylphenylsilane is also exemplified. Chloroisopropylvinyl-n-butylsilane is also exemplified. Chloroisopropylvinyl-s-butylsilane is also exemplified. Chloroisopropylvinyl-t-butylsilane is also exemplified. Chlorovinylphenyl-n-butylsilane is also exemplified. Chlorovinylphenyl-s-butylsilane is also exemplified. Chlorovinylphenyl-t-butylsilane is also exemplified. Chlorovinyl-n-butyl-s-butylsilane is also exemplified. Chlorovinyl-s-butyl-t-butylsilane is also exemplified. Chlorovinyl-t-butyl-n-butylsilane is also exemplified. Chlorodimethylsilane is also exemplified. Chlorodiethylsilane is also exemplified. Chlorodipropylsilane is also exemplified. Chlorodiisopropylsilane is also exemplified. Chlorodivinylsilane is also exemplified. Chlorodiphenylsilane is also exemplified. Chlorodi(n-butyl)silane is also exemplified. Chlorodi(s-butyl)silane is also exemplified. Chlorodi(t-butyl)silane is also exemplified. Chloroethylmethylsilane is also exemplified. Chloromethylpropylsilane is also exemplified. Chloroethylpropylsilane is also exemplified. Chloromethylisopropylsilane is also exemplified. Chloroethylisopropylsilane is also exemplified. Chloroisopropylpropylsilane is also exemplified. Chloromethylvinylsilane is also exemplified. Chloroethylvinylsilane is also exemplified. Chloropropylvinylsilane is also exemplified. Chloroisopropylvinylsilane is also exemplified. Chloromethylphenylsilane is also exemplified. Chloroethylphenylsilane is also exemplified. Chlorophenylpropylsilane is also exemplified. Chloroisopropylphenylsilane is also exemplified. Chlorophenylvinylsilane is also exemplified. Chloro-n-butylmethylsilane is also exemplified. Chloro-n-butylethylsilane is also exemplified. Chloro-n-butylpropylsilane is also exemplified. Chloro-n-butylisopropylsilane is also exemplified. Chloro-n-butylvinylsilane is also exemplified. Chloro-n-butylphenylsilane is also exemplified. Chloro-s-butylmethylsilane is also exemplified. Chloro-s-butylethylsilane is also exemplified. Chloro-s-butylpropylsilane is also exemplified. Chloro-s-butylisopropylsilane is also exemplified. Chloro-s-butylvinylsilane is also exemplified. Chloro-s-butylphenylsilane is also exemplified. Chloro-n-butyl-s-butylsilane is also exemplified. Chloro-t-butylmethylsilane is also exemplified. Chloro-t-butylethylsilane is also exemplified. Chloro-t-butylpropylsilane is also exemplified. Chloro-t-butylisopropylsilane is also exemplified. Chloro-t-butylvinylsilane is also exemplified. Chloro-t-butylphenylsilane is also exemplified. Chloro-n-butyl-t-butylsilane is also exemplified. Chloro-s-butyl-t-butylsilane is also exemplified. Chloromethylsilane is also exemplified. Chloroethylsilane is also exemplified. Chloropropylsilane is also exemplified. Chloroisopropylsilane is also exemplified. Chlorovinylsilane is also exemplified. Chlorophenysilane is also exemplified. Chloro-n-butylsilane is also exemplified. Chloro-s-butylsilane is also exemplified. Chloro-t-butylsilane is also exemplified. Chlorosilane is also exemplified.

As specific examples of the silicon compound including the part expressed by the chemical formula (4) are compounds as exemplified below. That is, dichlorosilane is exemplified. Dichloromethylsilane is also exemplified. Dichloroethylsilane is also exemplified. Dichloropropylsilane is also exemplified. Dichloroisopropylsilane is also exemplified. Dichlorovinylsilane is also exemplified. Dichlorophenylsilane is also exemplified. Dichloro-n-butylsilane is also exemplified. Dichloro-s-butylsilane is also exemplified. Dichloro-t-butylsilane is also exemplified. Dichlorodimethylsilane is also exemplified. Dichlorodiethylsilane is also exemplified. Dichlorodipropylsilane is also exemplified. Dichlorodiisopropylsilane is also exemplified. Dichlorodivinylsilane is also exemplified. Dichlorodiphenylsilane is also exemplified. Dichlorodi(n-butyl)silane is also exemplified. Dichlorodi(s-butyl)silane is also exemplified. Dichlorodi(t-butyl)silane is also exemplified. Dichloroethylmethylsilane is also exemplified. Dichloromethylpropylsilane is also exemplified. Dichloroethylpropylsilane is also exemplified. Dichloromethylisopropylsilane is also exemplified. Dichloroethylisopropylsilane is also exemplified. Dichloroisopropylpropylsilane is also exemplified. Dichloromethylvinylsilane is also exemplified. Dichloroethylvinylsilane is also exemplified. Dichloropropylvinylsilane is also exemplified. Dichloroisopropylvinylsilane is also exemplified. Dichloromethylphenylsilane is also exemplified. Dichloroethylphenylsilane is also exemplified. Dichlorophenylpropylsilane is also exemplified. Dichloroisopropylphenylsilane is also exemplified. Dichlorophenylvinylsilane is also exemplified. Dichloro-n-butylmethylsilane is also exemplified. Dichloro-n-butylethylsilane is also exemplified. Dichloro-n-butylpropylsilane is also exemplified. Dichloro-n-butylisopropylsilane is also exemplified. Dichloro-n-butylvinylsilane is also exemplified. Dichloro-n-butylphenylsilane is also exemplified. Dichloro-s-butylmethylsilane is also exemplified. Dichloro-s-butylethylsilane is also exemplified. Dichloro-s-butylpropylsilane is also exemplified. Dichloro-s-butylisopropylsilane is also exemplified. Dichloro-s-butylvinylsilane is also exemplified. Dichloro-s-butylphenylsilane is also exemplified. Dichloro-n-butyl-s-butylsilane is also exemplified. Dichloro-t-butylmethylsilane is also exemplified. Dichloro-t-butylethylsilane is also exemplified. Dichloro-t-butylpropylsilane is also exemplified. Dichloro-t-butylisopropylsilane is also exemplified. Dichloro-t-butylvinylsilane is also exemplified. Dichloro-t-butylphenylsilane is also exemplified. Dichloro-n-butyl-t-butylsilane is also exemplified. Dichloro-s-butyl-t-butylsilane is also exemplified.

As specific examples of the silicon compound including the part expressed by the chemical formula (5) are the compounds as exemplified below. That is, trichlorosilane is exemplified. Trichloromethylsilane is also exemplified. Trichloroethylsilane is also exemplified. Trichloropropylsilane is also exemplified. Trichloroisopropylsilane is also exemplified. Trichlorovinylsilane is also exemplified. Trichlorophenylsilane is also exemplified. Trichloro-n-butylsilane is also exemplified. Trichloro-s-butylsilane is also exemplified. Trichloro-t-butylsilane is also exemplified.

As a specific example of the silicon compound including the part expressed by the chemical formula (6), tetrachlorosilane, for example, is given.

As specific examples of the silicon compound including the part expressed by the chemical formula (7) are compounds as exemplified below. That is, dimethylaminotrimethylsilane is exemplified. Dimethylaminotriethylsilane is also exemplified. Dimethylaminotripropylsilane is also exemplified. Dimethylaminotriisopropylsilane is also exemplified. Dimethylaminotrivinylsilane is also exemplified. Dimethylaminotriphenylsilane is also exemplified. Dimethylaminotri(n-butyl)silane is also exemplified. Dimethylaminotri(s-butyl)silane is also exemplified. Dimethylaminotri(t-butyl)silane is also exemplified. Dimethylaminodiethylmethylsilane is also exemplified. Dimethylaminodimethylpropylsilane is also exemplified. Dimethylaminodiethylpropylsilane is also exemplified. Dimethylaminodimethylisopropylsilane is also exemplified. Dimethylaminodiethylisopropylsilane is also exemplified. Dimethylaminodiisopropylpropylsilane is also exemplified. Dimethylaminodimethylvinylsilane is also exemplified. Dimethylaminodiethylvinylsilane is also exemplified. Dimethylaminodipropylvinylsilane is also exemplified. Dimethylaminodiisopropylvinylsilane is also exemplified. Dimethylaminodimethylphenylsilane is also exemplified. Dimethylaminodiethylphenylsilane is also exemplified. Dimethylaminodiphenylpropylsilane is also exemplified. Dimethylaminodiisopropylphenylsilane is also exemplified. Dimethylaminodiphenylvinylsilane is also exemplified. Dimethylaminodi(n-butyl)methylsilane is also exemplified. Dimethylaminodi(n-butyl)ethylsilane is also exemplified. Dimethylaminodi(n-butyl)propylsilane is also exemplified. Dimethylaminodi(n-butyl)isopropylsilane is also exemplified. Dimethylaminodi(n-butyl)vinylsilane is also exemplified. Dimethylaminodi(n-butyl)phenylsilane is also exemplified. Dimethylaminodi(s-butyl)methylsilane is also exemplified. Dimethylaminodi(s-butyl)ethylsilane is also exemplified. Dimethylaminodi(s-butyl)propylsilane is also exemplified. Dimethylaminodi(s-butyl)isopropylsilane is also exemplified. Dimethylaminodi(s-butyl)vinylsilane is also exemplified. Dimethylaminodi(s-butyl)phenylsilane is also exemplified. Dimethylaminodi(n-butyl)s-butylsilane is also exemplified. Dimethylaminodi(t-butyl)methylsilane is also exemplified. Dimethylaminodi(t-butyl)ethylsilane is also exemplified. Dimethylaminodi(t-butyl)propylsilane is also exemplified. Dimethylaminodi(t-butyl)isopropylsilane is also exemplified. Dimethylaminodi(t-butyl)vinylsilane is also exemplified. Dimethylaminodi(t-butyl)phenylsilane is also exemplified. Dimethylaminodi(n-butyl)t-butylsilane is also exemplified. Dimethylaminodi(s-butyl)t-butylsilane is also exemplified. Dimethylaminomethylethylpropylsilane is also exemplified. Dimethylaminomethylethylisopropylsilane is also exemplified. Dimethylaminomethylethylvinylsilane is also exemplified. Dimethylaminomethylethylphenylsilane is also exemplified. Dimethylaminomethylethyl-n-butylsilane is also exemplified. Dimethylaminomethylethyl-s-butylsilane is also exemplified. Dimethylaminomethylethyl-t-butylsilane is also exemplified. Dimethylaminoethylpropylisopropylsilane is also exemplified. Dimethylaminoethylpropylvinylsilane is also exemplified. Dimethylaminoethylpropylphenylsilane is also exemplified. Dimethylaminoethylpropyl-n-butylsilane is also exemplified. Dimethylaminoethylpropyl-s-butylsilane is also exemplified. Dimethylaminoethylpropyl-t-butylsilane is also exemplified. Dimethylaminoporpylisopropylvinylsilane is also exemplified. Dimethylaminopropylisopropylphenylsilane is also exemplified. Dimethylaminopropylisopropyl-n-butylsilane is also exemplified. Dimethylaminopropylisopropyl-s-butylsilane is also exemplified. Dimethylaminopropylisopropyl-t-butylsilane is also exemplified. Dimethylaminoisopropylvinylphenylsilane is also exemplified. Dimethylaminoisopropylvinyl-n-butylsilane is also exemplified. Dimethylaminoisopropylvinyl-s-butylsilane is also exemplified. Dimethylaminoisopropylvinyl-t-butylsilane is also exemplified. Dimethylaminovinylphenyl-n-butylsilane is also exemplified. Dimethylaminovinylphenyl-s-butylsilane is also exemplified. Dimethylaminovinylphenyl-t-butylsilane is also exemplified. Dimethylaminovinyl-n-butyl-s-butylsilane is also exemplified. Dimethylaminovinyl-s-buty-t-butylsilane is also exemplified. Dimethylaminovinyl-t-butyl-n-butylsilane is also exemplified. Dimethylaminodimethylsilane is also exemplified. Dimethylaminodiethylsilane is also exemplified. Dimethylaminodipropylsilane is also exemplified. Dimethylaminodiisopropylsilane is also exemplified. Dimethylaminodivinylsilane is also exemplified. Dimethylaminodiphenylsilane is also exemplified. Dimethylaminodi(n-butyl)silane is also exemplified. Dimethylaminodi(s-butyl)silane is also exemplified. Dimethylaminodi(t-butyl)silane is also exemplified. Dimethylaminoethylmethylsilane is also exemplified. Dimethylaminomethylpropylsilane is also exemplified. Dimethylaminoethylpropylsilane is also exemplified. Dimethylaminomethylisopropylsilane is also exemplified. Dimethylaminoethylisopropylsilane is also exemplified. Dimethylaminoisopropylpropylsilane is also exemplified. Dimethylaminomethylvinylsilane is also exemplified. Dimethylaminoethylvinylsilane is also exemplified. Dimethylaminopropylvinylsilane is also exemplified. Dimethylaminoisopropylvinylsilane is also exemplified. Dimethylaminomethylphenylsilane is also exemplified. Dimethylaminoethylphenylsilane is also exemplified. Dimethylaminophenylpropylsilane is also exemplified. Dimethylaminoisopropylphenylsilane is also exemplified. Dimethylaminophenylvinylsilane is also exemplified. Dimethylamino-n-butylmethylsilane is also exemplified. Dimethyloamino-n-butylethylsilane is also exemplified. Dimethylamino-n-butylpropylsilane is also exemplified. Dimethylamino-n-butylisopropylsilane is also exemplified. Dimethylamino-n-butylvinylsilane is also exemplified. Dimethylamino-n-butylphenylsilane is also exemplified. Dimethylamino-s-butylmethylsilane is also exemplified. Dimethylamino-s-butylethylsilane is also exemplified. Dimethylamino-s-butylpropylsilane is also exemplified. Dimethylamino-s-butylisopropylsilane is also exemplified. Dimethylamino-s-butylvinylsilane is also exemplified. Dimethylamino-s-butylphenylsilane is also exemplified. Dimethylamino-n-butyl-s-butylsilane is also exemplified. Dimethylamino-t-butylmethylsilane is also exemplified. Dimethylamino-t-butylethylsilane is also exemplified. Dimethylamino-t-butylpropylsilane is also exemplified. Dimethylamino-t-butylisopropylsilane is also exemplified. Dimethylamino-t-butylvinylsilane is also exemplified. Dimethylamino-t-butylphenylsilane is also exemplified. Dimethylamino-n-butyl-t-butylsilane is also exemplified. Dimethylamino-s-butyl-t-butylsilane is also exemplified. Dimethylaminomethylsilane is also exemplified. Dimethylaminoethylsilane is also exemplified. Dimethylaminopropylsilane is also exemplified. Dimethylaminoisopropylsilane is also exemplified. Dimethylaminovinylsilane is also exemplified. Dimethylaminophenylsilane is also exemplified. Dimethylamino-n-butylsilane is also exemplified. Dimethylamino-s-butylsilane is also exemplified. Dimethylamino-t-butylsilane is also exemplified. Dimethylaminosilane is also exemplified. Diethylaminotrimethylsilane is also exemplified. Diethylaminotriethylsilane is also exemplified. Diethylaminotripropylsilane is also exemplified. Diethylaminotriisopropylsilane is also exemplified. Diethylaminotrivinylsilane is also exemplified. Diethylaminotriphenylsilane is also exemplified. Diethylaminotri(n-butyl)silane is also exemplified. Diethylaminotri(s-butyl)silane is also exemplified. Diethylaminotri(t-butyl)silane is also exemplified. Diethylaminodiethylmethylsilane is also exemplified. Diethylaminodimethylpropylsilane is also exemplified. Diethylaminodiethylpropylsilane is also exemplified. Diethylaminodimethylisopropylsilane is also exemplified. Diethylaminodiethylisopropylsilane is also exemplified. Diethylaminodiisopropylpropylsilane is also exemplified. Diethylaminodimethylvinylsilane is also exemplified. Diethylaminodiethylvinylsilane is also exemplified. Diethylaminodipropylvinylsilane is also exemplified. Diethylaminodiisopropylvinylsilane is also exemplified. Diethylaminodimethylphenylsilane is also exemplified. Diethylaminodiethylphenylsilane is also exemplified. Diethylaminodiphenylpropylsilane is also exemplified. Diethylaminodiisopropylphenylsilane is also exemplified. Diethylaminodiphenylvinylsilane is also exemplified. Diethylaminodi(n-butyl)methylsilane is also exemplified. Diethylaminodi(n-butyl)ethylsilane is also exemplified. Diethylaminodi(n-butyl)propylsilane is also exemplified. Diethylaminodi(n-butyl)isopropylsilane is also exemplified. Diethylaminodi(n-butyl)vinylsilane is also exemplified. Diethylaminodi(n-butyl)phenylsilane is also exemplified. Diethylaminodi(s-butyl)methylsilane is also exemplified. Diethylaminodi(s-butyl)ethylsilane is also exemplified. Diethylaminodi(s-butyl)propylsilane is also exemplified. Diethylaminodi(s-butyl)isopropylsilane is also exemplified. Diethylaminodi(s-butyl)vinylsilane is also exemplified. Diethylaminodi(s-butyl)phenylsilane is also exemplified. Diethylaminodi(n-butyl)s-butylsilane is also exemplified. Diethylaminodi(t-butyl)methylsilane is also exemplified. Diethylaminodi(t-butyl)ethylsilane is also exemplified. Diethylaminodi(t-butyl)propylsilane is also exemplified. Diethylaminodi(t-butyl)isopropylsilane is also exemplified. Diethylaminodi(t-butyl)vinylsilane is also exemplified. Diethylaminodi(t-butyl)phenylsilane is also exemplified. Diethylaminodi(n-butyl)t-butylsilane is also exemplified. Diethylaminodi(s-butyl)t-butylsilane is also exemplified. Diethylaminomethylethylpropylsilane is also exemplified. Diethylaminomethylethylisopropylsilane is also exemplified. Diethylaminomethylethylvinylsilane is also exemplified. Diethylaminomethylethylphenylsilane is also exemplified. Diethylaminomethylethyl-n-butylsilane is also exemplified. Diethylaminomethylethyl-s-butylsilane is also exemplified. Diethylaminomethylethyl-t-butylsilane is also exemplified. Diethylaminoethylpropylisopropylsilane is also exemplified. Diethylaminoethylpropylvinylsilane is also exemplified. Diethylaminoethylpropylphenylsilane is also exemplified. Diethylaminoethylpropyl-n-butylsilane is also exemplified. Diethylaminoethylpropyl-s-butylsilane is also exemplified. Diethylaminoethylpropyl-t-butylsilane is also exemplified. Diethylaminopropylisopropylvinylsilane is also exemplified. Diethylaminopropylisopropylphenylsilane is also exemplified. Diethylaminopropylisopropyl-n-butylsilane is also exemplified. Diethylaminopropylisopropyl-s-butylsilane is also exemplified. Diethylaminopropylisopropyl-t-butylsilane is also exemplified. Diethylaminoisopropylvinylphenylsilane is also exemplified. Diethylaminoisopropylvinyl-n-butylsilane is also exemplified. Diethylaminoisopropylvinyl-s-butylsilane is also exemplified. Diethylaminoisopropylvinyl-t-butylsilane is also exemplified. Diethylaminovinylphenyl-n-butylsilane is also exemplified. Diethylaminovinylphenyl-s-butylsilane is also exemplified. Diethylaminovinylphenyl-t-butylsilane is also exemplified. Diethylaminovinyl-n-butyl-s-butylsilane is also exemplified. Diethylaminovinyl-s-butyl-t-butylsilane is also exemplified. Diethylaminovinyl-t-butyl-n-butylsilane is also exemplified. Diethylaminodimethylsilane is also exemplified. Diethylaminodiethylsilane is also exemplified. Diethylaminodipropylsilane is also exemplified. Diethylaminodiisopropylsilane is also exemplified. Diethylaminodivinylsilane is also exemplified. Diethylaminodiphenylsilane is also exemplified. Diethylaminodi(n-butyl)silane is also exemplified. Diethylaminodi(s-butyl)silane is also exemplified. Diethylaminodi(t-butyl)silane is also exemplified. Diethylaminoethylmethylsilane is also exemplified. Diethylaminomethylpropylsilane is also exemplified. Diethylaminoethylpropylsilane is also exemplified. Diethylaminomethylisopropylsilane is also exemplified. Diethylaminoethylisopropylsilane is also exemplified. Diethylaminoisopropylpropylsilane is also exemplified. Diethylaminomethylvinylsilane is also exemplified. Diethylaminoethylvinylsilane is also exemplified. Diethylaminopropylvinylsilane is also exemplified. Diethylaminoisopropylvinylsilane is also exemplified. Diethylaminomethylphenylsilane is also exemplified. Diethylaminoethylphenylsilane is also exemplified. Diethylaminophenylpropylsilane is also exemplified. Diethylaminoisopropylphenylsilane is also exemplified. Diethylaminophenylvinylsilane is also exemplified. Diethylamino-n-butylmethylsilane is also exemplified. Diethylamino-n-butylethylsilane is also exemplified. Diethylamino-n-butylpropylsilane is also exemplified. Diethylamino-n-butylisopropylsilane is also exemplified. Diethylamino-n-butylvinylsilane is also exemplified. Diethylamino-n-butylphenylsilane is also exemplified. Diethylamino-s-butylmethylsilane is also exemplified. Diethylamino-s-butylethylsilane is also exemplified. Diethylamino-s-butylpropylsilane is also exemplified. Diethylamino-s-butylisopropylsilane is also exemplified. Diethylamino-s-butylvinylsilane is also exemplified. Diethylamino-s-butylphenylsilane is also exemplified. Diethylamino-n-butyl-s-butylsilane is also exemplified. Diethylamino-t-butylmethylsilane is also exemplified. Diethylamino-t-butylethylsilane is also exemplified. Diethylamino-t-butylpropylsilane is also exemplified. Diethylamino-t-butylisopropylsilane is also exemplified. Diethylamino-t-butylvinylsilane is also exemplified. Diethylamino-t-butylphenylsilane is also exemplified. Diethylamino-n-butyl-t-butylsilane is also exemplified. Diethylamino-s-butyl-t-butylsilane is also exemplified. Diethylaminomethylsilane is also exemplified. Diethylaminoethylsilane is also exemplified. Diethylaminopropylsilane is also exemplified. Diethylaminoisopropylsilane is also exemplified. Diethylaminovinylsilane is also exemplified. Diethylaminophenylsilane is also exemplified. Diethylamino-n-butylsilane is also exemplified. Diethylamino-s-butylsilane is also exemplified. Diethylamino-t-butylsilane is also exemplified. Diethylaminosilane is also exemplified. Methylaminotrimethylsilane is also exemplified. Methylaminotriethylsilane is also exemplified. Methylaminotripropylsilane is also exemplified. Methylaminotriisopropylsilane is also exemplified. Methylaminotrivinylsilane is also exemplified. Methylaminotriphenylsilane is also exemplified. Methylaminotri(n-butyl)silane is also exemplified. Methylaminotri(s-butyl)silane is also exemplified. Methylaminotri(t-butyl)silane is also exemplified. Methylaminodiethylmethylsilane is also exemplified. Methylaminodimethylpropylsilane is also exemplified. Methylaminodiethylpropylsilane is also exemplified. Methylaminodimethylisopropylsilane is also exemplified. Methylaminodiethylisopropylsilane is also exemplified. Methylaminodiisopropylpropylsilane is also exemplified. Methylaminodimethylvinylsilane is also exemplified. Methylaminodiethylvinylsilane is also exemplified. Methylaminodipropylvinylsilane is also exemplified. Methylaminodiisopropylvinylsilane is also exemplified. Methylaminodimethylphenylsilane is also exemplified. Methylaminodiethylphenylsilane is also exemplified. Methylaminodiphenylpropylsilane is also exemplified. Methylaminodiisopropylphenylsilane is also exemplified. Methylaminodiphenylvinylsilane is also exemplified. Methylaminodi(n-butyl)methylsilane is also exemplified. Methylaminodi(n-butyl)ethylsilane is also exemplified. Methylaminodi(n-butyl)propylsilane is also exemplified. Methylaminodi(n-butyl)isopropylsilane is also exemplified. Methylaminodi(n-butyl)vinylsilane is also exemplified. Methylaminodi(n-butyl)phenylsilane is also exemplified. Methylaminodi(s-butyl)methylsilane is also exemplified. Methylaminodi(s-butyl)ethylsilane is also exemplified. Methylaminodi(s-butyl)propylsilane is also exemplified. Methylaminodi(s-butyl)isopropylsilane is also exemplified. Methylaminodi(s-butyl)vinylsilane is also exemplified. Methylaminodi(s-butyl)phenylsilane is also exemplified. Methylaminodi(n-butyl)s-butylsilane is also exemplified. Methylaminodi(t-butyl)methylsilane is also exemplified. Methylaminodi(t-butyl)ethylsilane is also exemplified. Methylaminodi(t-butyl)propylsilane is also exemplified. Methylaminodi(t-butyl)isopropylsilane is also exemplified. Methylaminodi(t-butyl)vinylsilane is also exemplified. Methylaminodi(t-butyl)phenylsilane is also exemplified. Methylaminodi(n-butyl)t-butylsilane is also exemplified. Methylaminodi(s-butyl)t-butylsilane is also exemplified. Methylaminomethylethylpropylsilane is also exemplified. Methylaminomethylethylisopropylsilane is also exemplified. Methylaminomethylethylvinylsilane is also exemplified. Methylaminomethylethylphenylsilane is also exemplified. Methylaminomethylethyl-n-butylsilane is also exemplified. Methylaminomethylethyl-s-butylsilane is also exemplified. Methylaminomethylethyl-t-butylsilane is also exemplified. Methylaminoethylpropylisopropylsilane is also exemplified. Methylaminoethylpropylvinylsilane is also exemplified. Methylaminoethylpropylphenylsilane is also exemplified. Methylaminoethylpropyl-n-butylsilane is also exemplified. Methylaminoethylpropyl-s-butylsilane is also exemplified. Methylaminoethylpropyl-t-butylsilane is also exemplified. Methylaminopropylisopropylvinylsilane is also exemplified.

Methylaminopropylisopropylphenylsilane is also exemplified. Methylaminopropylisopropyl-n-butylsilane is also exemplified. Methylaminopropylisopropyl-s-butylsilane is also exemplified. Methylaminopropylisopropyl-t-butylsilane is also exemplified. Methylaminoisopropylvinylphenylsilane is also exemplified. Methylaminoisopropylvinyl-n-butylsilane is also exemplified. Methylaminoisopropylvinyl-s-butylsilane is also exemplified. Methylaminoisopropylvinyl-t-butylsilane is also exemplified. Methylaminovinylphenyl-n-butylsilane is also exemplified. Methylaminovinylphenyl-s-butylsilane is also exemplified. Methylaminovinylphenyl-t-butylsilane is also exemplified. Methylaminovinyl-n-butyl-s-butylsilane is also exemplified. Methylaminovinyl-s-butyl-t-butylsilane is also exemplified. Methylaminovinyl-t-butyl-n-butylsilane is also exemplified. Methylaminodimethylsilane is also exemplified. Methylaminodiethylsilane is also exemplified. Methylaminodipropylsilane is also exemplified. Methylaminodiisopropylsilane is also exemplified. Methylaminodivinylsilane is also exemplified. Methylaminodiphenylsilane is also exemplified. Methylaminodi(n-butyl)silane is also exemplified. Methylaminodi(s-butyl)silane is also exemplified. Methylaminodi(t-butyl)silane is also exemplified. Methylaminoethylmethylsilane is also exemplified. Methylaminomethylpropylsilane is also exemplified. Methylaminoethylpropylsilane is also exemplified. Methylaminomethylisopropylsilane is also exemplified. Methylaminoethylisopropylsilane is also exemplified. Methylaminoisopropylpropylsilane is also exemplified. Methylaminomethylvinylsilane is also exemplified. Methylaminoethylvinylsilane is also exemplified. Methylaminopropylvinylsilane is also exemplified. Methylaminoisopropylvinylsilane is also exemplified. Methylaminomethylphenylsilane is also exemplified. Methylaminoethylphenylsilane is also exemplified. Methylaminophenylpropylsilane is also exemplified. Methylaminoisopropylphenylsilane is also exemplified. Methylaminophenylvinylsilane is also exemplified. Methylamino-n-butylmethylsilane is also exemplified. Methylamino-n-butylethylsilane is also exemplified. Methylamino-n-butylpropylsilane is also exemplified. Methylamino-n-butylisopropylsilane is also exemplified. Methylamino-n-butylvinlysilane is also exemplified. Methylamino-n-butylphenylsilane is also exemplified. Methylamino-s-butylmethylsilane is also exemplified. Methylamino-s-butylethylsilane is also exemplified. Methylamino-s-butylpropylsilane is also exemplified. Methylamino-s-butylisopropylsilane is also exemplified. Methylamino-s-butylvinylsilane is also exemplified. Methylamino-s-butylphenylsilane is also exemplified. Methylamino-n-butyl-s-butylsilane is also exemplified. Methylamino-t-butylmethylsilane is also exemplified. Methylamino-t-butylethylsilane is also exemplified. Methylamino-t-butylpropylsilane is also exemplified. Methylamino-t-butylisopropylsilane is also exemplified. Methylamino-t-butylvinylsilane is also exemplified. Methylamino-t-butylphenylsilane is also exemplified. Methylamino-n-butyl-t-butylsilane is also exemplified. Methylamino-s-butyl-t-butylsilane is also exemplified. Methylaminomethylsilane is also exemplified. Methylaminoethylsilane is also exemplified. Methylaminopropylsilane is also exemplified. Methylaminoisopropylsilane is also exemplified. Methylaminovinylsilane is also exemplified. Methylaminophenylsilane is also exemplified. Methylamino-n-butylsilane is also exemplified. Methylamino-s-butylsilane is also exemplified. Methylamino-t-butylsilane is also exemplified. Methylaminosilane is also exemplified. Ethylaminotrimethylsilane is also exemplified. Ethylaminotriethylsilane is also exemplified. Ethylaminotripropylsilane is also exemplified. Ethylaminotriisopropylsilane is also exemplified. Ethylaminotrivinylsilane is also exemplified. Ethylaminotriphenylsilane is also exemplified. Ethylaminotri(n-butyl)silane is also exemplified. Ethylaminotri(s-butyl)silane is also exemplified. Ethylaminotri(t-butyl)silane is also exemplified. Ethylaminodiethylmethylsilane is also exemplified. Ethylaminodimethylpropylsilane is also exemplified. Ethylaminodiethylpropylsilane is also exemplified. Ethylaminodimethylisopropylsilane is also exemplified. Ethylaminodiethylisopropylsilane is also exemplified. Ethylaminodiisopropylpropylsilane is also exemplified. Ethylaminodimethylvinylsilane is also exemplified. Ethylaminodiethylvinylsilane is also exemplified. Ethylaminodipropylvinylsilane is also exemplified. Ethylaminodiisopropylvinylsilane is also exemplified. Ethylaminodimethylphenylsilane is also exemplified. Ethylaminodiethylphenysilane is also exemplified. Ethylaminodiphenylpropylsilane is also exemplified. Ethylaminodiisopropylphenylsilane is also exemplified. Ethylaminodiphenylvinylsilane is also exemplified. Ethylaminodi(n-butyl)methylsilane is also exemplified. Ethylaminodi(n-butyl)ethylsilane is also exemplified. Ethylaminodi(n-butyl)propylsilane is also exemplified. Ethylaminodi(n-butyl)isopropylsilane is also exemplified. Ethylaminodi(n-butyl)vinylsilane is also exemplified. Ethylaminodi(n-butyl)phenylsilane is also exemplified. Ethylaminodi(s-butyl)methylsilane is also exemplified. Ethylaminodi(s-butyl)ethylsilane is also exemplified. Ethylaminodi(s-butyl)propylsilane is also exemplified. Ethylaminodi(s-butyl)isopropylsilane is also exemplified. Ethylaminodi(s-butyl)vinylsilane is also exemplified. Ethylaminodi(s-butyl)phenylsilane is also exemplified. Ethylaminodi(n-butyl)s-butylsilane is also exemplified. Ethylaminodi(t-butyl)methylsilane is also exemplified. Ethylaminodi(t-butyl)ethylsilane is also exemplified. Ethylaminodi(t-butyl)propylsilane is also exemplified. Ethylaminodi(t-butyl)isopropylsilane is also exemplified. Ethylaminodi(t-butyl)vinylsilane is also exemplified. Ethylaminodi(t-butyl)phenylsilane is also exemplified. Ethylaminodi(n-butyl)t-butylsilane is also exemplified. Ethylaminodi(s-butyl)t-butylsilane is also exemplified. Ethylaminomethylethylpropylsilane is also exemplified. Ethylaminomethylethylisopropylsilane is also exemplified. Ethylaminomethylethylvinylsilane is also exemplified. Ethylaminomethylethylphenylsilane is also exemplified. Ethylaminomethylethyl-n-butylsilane is also exemplified. Ethylaminomethylethyl-s-butylsilane is also exemplified. Ethylaminomethylethyl-t-butylsilane is also exemplified. Ethylaminoethylpropylisopropylsilane is also exemplified. Ethylaminoethylpropylvinylsilane is also exemplified. Ethylaminoethylpropylphenylsilane is also exemplified. Ethylaminoethylpropyl-n-butylsilane is also exemplified. Ethylaminoethylpropyl-s-butylsilane is also exemplified. Ethylaminoethylpropyl-t-butylsilane is also exemplified. Ethylaminopropylisopropylvinylsilane is also exemplified. Ethylaminopropylisopropylphenylsilane is also exemplified. Ethylaminopropylisopropyl-n-butylsilane is also exemplified. Ethylaminopropylisopropyl-s-butylsilane is also exemplified. Ethylaminopropylisopropyl-t-butylsilane is also exemplified. Ethylaminoisopropylvinylphenylsilane is also exemplified. Ethylaminoisopropylvinyl-n-butylsilane is also exemplified. Ethylaminoisopropylvinyl-s-butylsilane is also exemplified. Ethylaminoisopropylvinyl-t-butylsilane is also exemplified. Ethylaminovinylphenyl-n-butylsilane is also exemplified. Ethylaminovinylphenyl-s-butylsilane is also exemplified. Ethylaminovinylphenyl-t-butylsilane is also exemplified. Ethylaminovinyl-n-butyl-s-butylsilane is also exemplified. Ethylaminovinyl-s-butyl-t-butylsilane is also exemplified. Ethylaminovinyl-t-butyl-n-butylsilane is also exemplified. Ethylaminodimethylsilane is also exemplified. Ethylaminodiethylsilane is also exemplified. Ethylaminodipropylsilane is also exemplified. Ethylaminodiisopropylsilane is also exemplified. Ethylaminodivinylsilane is also exemplified. Ethylaminodiphenylsilane is also exemplified. Ethylaminodi(n-butyl)silane is also exemplified. Ethylaminodi(s-butyl)silane is also exemplified. Ethylaminodi(t-butyl)silane is also exemplified. Ethylaminoethylmethylsilane is also exemplified. Ethylaminomethylpropylsilane is also exemplified. Ethylaminoethylpropylsilane is also exemplified. Ethylaminomethylisopropylsilane is also exemplified. Ethylaminoethylisopropylsilane is also exemplified. Ethylaminoisopropylpropylsilane is also exemplified. Ethylaminomethylvinylsilane is also exemplified. Ethylaminoethylvinylsilane is also exemplified. Ethylaminopropylvinylsilane is also exemplified. Ethylaminoisopropylvinylsilane is also exemplified. Ethylaminomethylphenylsilane is also exemplified. Ethylaminoethylphenylsilane is also exemplified. Ethylaminophenylpropylsilane is also exemplified. Ethylaminoisopropylphenylsilane is also exemplified. Ethylaminophenylvinylsilane is also exemplified. Ethylamino-n-butylmethylsilane is also exemplified. Ethylamino-n-butylethylsilane is also exemplified. Ethylamino-n-butylpropylsilane is also exemplified. Ethylamino-n-butylisopropylsilane is also exemplified. Ethylamino-n-butylvinylsilane is also exemplified. Ethylamino-n-butylphenylsilane is also exemplified. Ethylamino-s-butylmethylsilane is also exemplified. Ethylamino-s-butylethylsilane is also exemplified. Ethylamino-s-butylpropylsilane is also exemplified. Ethylamino-s-butylisopropylsilane is also exemplified. Ethylamino-s-butylvinylsilane is also exemplified. Ethylamino-s-butylphenylsilane is also exemplified. Ethylamino-n-butyl-s-butylsilane is also exemplified. Ethylamino-t-butylmethylsilane is also exemplified. Ethylamino-t-butylethylsilane is also exemplified. Ethylamino-t-butylpropylsilane is also exemplified. Ethylamino-t-butylisopropylsilane is also exemplified. Ethylamino-t-butylvinylsilane is also exemplified. Ethylamino-t-butylphenylsilane is also exemplified. Ethylamino-n-butyl-t-butylsilane is also exemplified. Ethylamino-s-butyl-t-butylsilane is also exemplified. Ethylaminomethylsilane is also exemplified. Ethylaminoethylsilane is also exemplified. Ethylaminopropylsilane is also exemplified. Ethylaminoisopropylsilane is also exemplified. Ethylaminovinylsilane is also exemplified. Ethylaminophenylsilane is also exemplified. Ethylamino-n-butylsilane is also exemplified. Ethylamino-s-butylsilane is also exemplified. Ethylamino-t-butylsilane is also exemplified. Ethylaminosilane is also exemplified.

As specific examples of the silicon compound including the part expressed by the chemical formula (8) are compounds as exemplified below. That is, bis(dimethylamino)chloromethylsilane is exemplified. Bis(dimethylamino)chloroethylsilane is also exemplified. Bis(dimethylamino)chloropropylsilane is also exemplified. Bis(dimethylamino)chloroisopropylsilane is also exemplified. Bis(dimethylamino)chlorovinylsilane is also exemplified. Bis(dimethylamino)chlorophenylsilane is also exemplified. Bis(dimethylamino)chloro-n-butylsilane is also exemplified. Bis(dimethylamino)chloro-s-butylsilane is also exemplified. Bis(dimethylamino)chloro-t-butylsilane is also exemplified. Bis(dimethylamino)chlorosilane is also exemplified. Bis(diethylamino)chloromethylsilane is also exemplified. Bis(diethylamino)chloroethylsilane is also exemplified. Bis(diethylamino)chloropropylsilane is also exemplified. Bis(diethylamino)chloroisopropylsilane is also exemplified. Bis(diethylamino)chlorovinylsilane is also exemplified. Bis(diethylamino)chlorophenylsilane is also exemplified. Bis(diethylamino)chloro-n-butylsilane is also exemplified. Bis(diethylamino)chloro-s-butylsilane is also exemplified. Bis(diethylamino)chloro-t-butylsilane is also exemplified. Bis(diethylamino)chlorosilane is also exemplified. Bis(methylamino)chloromethylsilane is also exemplified. Bis(methylamino)chloroethylsilane is also exemplified. Bis(methylamino)chloropropylsilane is also exemplified. Bis(methylamino)chloroisopropylsilane is also exemplified. Bis(methylamino)chlorovinylsilane is also exemplified. Bis(methylamino)chlorophenylsilane is also exemplified. Bis(methylamino)chloro-n-butylsilane is also exemplified. Bis(methylamino)chloro-s-butylsilane is also exemplified. Bis(methylamino)chloro-t-butylsilane is also exemplified. Bis(methylamino)chlorosilane is also exemplified. Bis(ethylamino)chloromethylsilane is also exemplified. Bis(ethylamino)chloroethylsilane is also exemplified. Bis(ethylamino)chloropropylsilane is also exemplified. Bis(ethylamino)chloroisopropylsilane is also exemplified. Bis(ethylamino)chlorovinylsilane is also exemplified. Bis(ethylamino)chlorophenylsilane is also exemplified. Bis(ethylamino)chloro-n-butylsilane is also exemplified. Bis(ethylamino)chloro-s-butylsilane is also exemplified. Bis(ethylamino)chloro-t-butylsilane is also exemplified. Bis(ethylamino)chlorosilane is also exemplified. Dimethylaminodiethylaminochloromethylsilane is also exemplified. Dimethylaminodiethylaminochloroethylsilane is also exemplified. Dimethylaminodiethylaminochloropropylsilane is also exemplified. Dimethylaminodiethylaminochloroisopropylsilane is also exemplified. Dimethylaminodiethylaminochlorovinylsilane is also exemplified. Dimethylaminodiethylaminochlorophenylsilane is also exemplified. Dimethylaminodiethylaminochloro-n-butylsilane is also exemplified. Dimethylaminodiethylaminochloro-s-butylsilane is also exemplified. Dimethylaminodiethylaminochloro-t-butylsilane is also exemplified. Dimethylaminodiethylaminochlorosilane is also exemplified. Methylaminodiethylaminochloromethylsilane is also exemplified. Methylaminodiethylaminochloroethylsilane is also exemplified. Methylaminodiethylaminochloropropylsilane is also exemplified. Methylaminodiethylaminochloroisopropylsilane is also exemplified. Methylaminodiethylaminochlorovinylsilane is also exemplified. Methylaminodiethylaminochlorophenylsilane is also exemplified. Methylaminodiethylaminochloro-n-butylsilane is also exemplified. Methylaminodiethylaminochloro-s-butylsilane is also exemplified. Methylaminodiethylaminochloro-t-butylsilane is also exemplified. Methylaminodiethylaminochlorosilane is also exemplified. Dimethylaminoethylaminochloromethylsilane is also exemplified. Dimethylaminoethylaminochloroethylsilane is also exemplified. Dimethylaminoethylaminochloropropylsilane is also exemplified. Dimethylaminoethylaminochloroisopropylsilane is also exemplified. Dimethylaminoethylaminochlorovinylsilane is also exemplified. Dimethylaminoethylaminochlorophenylsilane is also exemplified. Dimethylaminoethylaminochloro-n-butylsilane is also exemplified. Dimethylaminoethylaminochloro-s-butylsilane is also exemplified. Dimethylaminoethylaminochloro-t-butylsilane is also exemplified. Dimethylaminoethylaminochlorosilane is also exemplified. Methylaminoethylaminochloromethylsilane is also exemplified.

Methylaminoethylaminochloroethylsilane is also exemplified. Methylaminoethylaminochloropropylsilane is also exemplified. Methylaminoethylaminochloroisopropylsilane is also exemplified. Methylaminoethylaminochlorovinylsilane is also exemplified. Methylaminoethylaminochlorophenylsilane is also exemplified. Methylaminoethylaminochloro-n-butylsilane is also exemplified. Methylaminoethylaminochloro-s-butylsilane is also exemplified. Methylaminoethylaminochloro-t-butylsilane is also exemplified. Methylaminoethylaminochlorosilane is also exemplified. Methylaminodimethylaminochloromethylsilane is also exemplified. Methylaminodimethylaminochloroethylsilane is also exemplified. Methylaminodimethylaminochloropropylsilane is also exemplified. Methylaminodimethylaminochloroisopropylsilane is also exemplified. Methylaminodimethylaminochlorovinylsilane is also exemplified. Methylaminodimethylaminochlorophenylsilane is also exemplified. Methylaminodimethylaminochloro-n-butylsilane is also exemplified. Methylaminodimethylaminochloro-s-butylsilane is also exemplified. Methylaminodimethylaminochloro-t-butylsilane is also exemplified. Methylaminodimethylaminochlorosilane is also exemplified. Ethylaminodiethylaminochloromethylsilane is also exemplified. Ethylaminodiethylaminochloroethylsilane is also exemplified. Ethylaminodiethylaminochloropropylsilane is also exemplified. Ethylaminodiethylaminochloroisopropylsilane is also exemplified. Ethylaminodiethylaminochlorovinylsilane is also exemplified. Ethylaminodiethylaminochlorophenylsilane is also exemplified. Ethylaminodiethylaminochloro-n-butylsilane is also exemplified. Ethylaminodiethylaminochloro-s-butylsilane is also exemplified. Ethylaminodiethylaminochloro-t-butylsilane is also exemplified. Ethylaminodiethylaminochlorosilane is also exemplified.

As specific examples of the silicon compound including the part expressed by the chemical formula (9) are compounds as exemplified below. That is, dimethylaminodiethylaminodichlorosilane is exemplified. Dimethylaminoethylaminodichlorosilane is also exemplified. Methylaminodiethylaminodichlorosilane is also exemplified. Methylaminoethylaminodichlorosilane is also exemplified. Methylaminomethylaminodichlorosilane is also exemplified. Ethylaminoethylaminodichlorosilane is also exemplified.

As specific examples of the silicon compound including the part expressed by the chemical formula (10) are compounds as exemplified below. That is, tris(dimethylamino)methylsilane is exemplified. Tris(dimethylamino)ethylsilane is also exemplified. Tris(dimethylamino)propylsilane is also exemplified. Tris(dimethylamino)isopropylsilane is also exemplified. Tris(dimethylamino)vinylsilane is also exemplified. Tris(dimethylamino)phenylsilane is also exemplified. Tris(dimethylamino)n-butylsilane is also exemplified. Tris(dimethylamino)s-butylsilane is also exemplified. Tris(dimethylamino)t-butylsilane is also exemplified. Tris(dimethylamino)silane is also exemplified. Tris(methylamino)methylsilane is also exemplified. Tris(methylamino)ethylsilane is also exemplified. Tris(methylamino)propylsilane is also exemplified. Tris(methylamino)isopropylsilane is also exemplified. Tris(methylamino)vinylsilane is also exemplified. Tris(methylamino)phenylsilane is also exemplified. Tris(methylamino)n-butylsilane is also exemplified. Tris(methylamino)s-butylsilane is also exemplified. Tris(methylamino)t-butylsilane is also exemplified. Tris(methylamino)silane is also exemplified. Tris(diethylamino)methylsilane is also exemplified. Tris(diethylamino)ethylsilane is also exemplified. Tris(diethylamino)propylsilane is also exemplified. Tris(diethylamino)isopropylsilane is also exemplified. Tris(diethylamino)vinylsilane is also exemplified. Tris(diethylamino)phenylsilane is also exemplified. Tris(diethylamino)n-butylsilane is also exemplified. Tris(diethylamino)s-butylsilane is also exemplified. Tris(diethylamino)t-butylsilane is also exemplified. Tris(diethylamino)silane is also exemplified. Tris(ethylamino)methylsilane is also exemplified. Tris(ethylamino)ethylsilane is also exemplified. Tris(ethylamino)propylsilane is also exemplified. Tris(ethylamino)isopropylsilane is also exemplified. Tris(ethylamino)vinylsilane is also exemplified. Tris(ethylamino)phenylsilane is also exemplified. Tris(ethylamino)n-butylsilane is also exemplified. Tris(ethylamino)s-butylsilane is also exemplified. Tris(ethylamino)t-butylsilane is also exemplified. Tris(ethylamino)silane is also exemplified. Bis(ethylamino)methylaminomethylsilane is also exemplified. Bis(ethylamino)methylaminoethylsilane is also exemplified. Bis(ethylamino)methylaminopropylsilane is also exemplified. Bis(ethylamino)methylaminoisopropylsilane is also exemplified. Bis(ethylamino)methylaminovinylsilane is also exemplified. Bis(ethylamino)methylaminophenylsilane is also exemplified. Bis(ethylamino)methylamino-n-butylsilane is also exemplified. Bis(ethylamino)methylamino-s-butylsilane is also exemplified. Bis(ethylamino)methylamino-t-butylsilane is also exemplified. Bis(ethylamino)methylaminosilane is also exemplified. Bis(ethylamino)diethylaminomethylsilane is also exemplified. Bis(ethylamino)diethylaminoethylsilane is also exemplified. Bis(ethylamino)diethylaminopropylsilane is also exemplified. Bis(ethylamino)diethylaminoisopropylsilane is also exemplified. Bis(ethylamino)diethylaminovinylsilane is also exemplified. Bis(ethylamino)diethylaminophenylsilane is also exemplified. Bis(ethylamino)diethylamino-n-butylsilane is also exemplified. Bis(ethylamino)diethylamino-s-butylsilane is also exemplified. Bis(ethylamino)diethylamino-t-butylsilane is also exemplified. Bis(ethylamino)diethylaminosilane is also exemplified. Bis(ethylamino)dimethylaminomethylsilane is also exemplified. Bis(ethylamino)dimethylaminoethylsilane is also exemplified. Bis(ethylamino)dimethylaminopropylsilane is also exemplified. Bis(ethylamino)dimethylaminoisopropylsilane is also exemplified. Bis(ethylamino)dimethylaminovinylsilane is also exemplified. Bis(ethylamino)dimethylaminophenylsilane is also exemplified. Bis(ethylamino)dimethylamino-n-butylsilane is also exemplified. Bis(ethylamino)dimethylamino-s-butylsilane is also exemplified. Bis(ethylamino)dimethylamino-t-butylsilane is also exemplified. Bis(ethylamino)dimethylaminosilane is also exemplified. Bis(methylamino)ethylaminomethylsilane is also exemplified. Bis(methylamino)ethylaminomethylsilane is also exemplified. Bis(methylamino)ethylaminoethylsilane is also exemplified. Bis(methylamino)ethylaminopropylsilane is also exemplified. Bis(methylamino)ethylaminoisopropylsilane is also exemplified. Bis(methylamino)ethylaminovinylsilane is also exemplified. Bis(methylamino)ethylaminophenylsilane is also exemplified. Bis(methylamino)ethylamino-n-butylsilane is also exemplified. Bis(methylamino)ethylamino-s-butylsilane is also exemplified. Bis(methylamino)ethylamino-t-butylsilane is also exemplified. Bis(methylamino)ethylaminosilane is also exemplified. Bis(methylamino)diethylaminomethylsilane is also exemplified. Bis(methylamino)diethylaminoethylsilane is also exemplified. Bis(methylamino)diethylaminopropylsilane is also exemplified. Bis(methylamino)diethylaminoisopropylsilane is also exemplified. Bis(methylamino)diethylaminovinylsilane is also exemplified. Bis(methylamino)diethylaminophenylsilane is also exemplified. Bis(methylamino)diethylamino-n- butylsilane is also exemplified. Bis(methylamino)diethylamino-s-butylsilane is also exemplified. Bis(methylamino)diethylamino-t-butylsilane is also exemplified. Bis(methylamino)diethylaminosilane is also exemplified. Bis(methylamino)dimethylaminomethylsilane is also exemplified. Bis(methylamino)dimethylaminoethylsilane is also exemplified. Bis(methylamino)dimethylaminopropylsilane is also exemplified. Bis(methylamino)dimethylaminoisopropylsilane is also exemplified. Bis(methylamino)dimethylaminovinylsilane is also exemplified. Bis(methylamino)dimethylaminophenylsilane is also exemplified. Bis(methylamino)dimethylamino-n-butylsilane is also exemplified. Bis(methylamino)dimethylamino-s-butylsilane is also exemplified. Bis(methylamino)dimethylamino-t-butylsilane is also exemplified. Bis(methylamino)dimethylaminosilane is also exemplified. Bis(diethylamino)ethylaminomethylsilane is also exemplified. Bis(diethylamino)ethylaminoethylsilane is also exemplified. Bis(diethylamino)ethylaminopropylsilane is also exemplified. Bis(diethylamino)ethylaminoisopropylsilane is also exemplified. Bis(diethylamino)ethylaminovinylsilane is also exemplified. Bis(diethylamino)ethylaminophenylsilane is also exemplified. Bis(diethylamino)ethylamino-n-butylsilane is also exemplified. Bis(diethylamino)ethylamino-s-butylsilane is also exemplified. Bis(diethylamino)ethylamino-t-butylsilane is also exemplified. Bis(diethylamino)ethylaminosilane is also exemplified. Bis(diethylamino)methylaminomethylsilane is also exemplified. Bis(diethylamino)methylaminoethylsilane is also exemplified. Bis(diethylamino)methylaminopropylsilane is also exemplified. Bis(diethylamino)methylaminoisopropylsilane is also exemplified. Bis(diethylamino)methylaminovinylsilane is also exemplified. Bis(diethylamino)methylaminophenylsilane is also exemplified. Bis(diethylamino)methylamino-n-butylsilane is also exemplified. Bis(diethylamino)methylamino-s-butylsilane is also exemplified. Bis(diethylamino)methylamino-t-butylsilane is also exemplified. Bis(diethylamino)methylaminosilane is also exemplified. Bis(diethylamino)dimethylaminomethylsilane is also exemplified. Bis(diethylamino)dimethylaminoethylsilane is also exemplified. Bis(diethylamino)dimethylaminopropylsilane is also exemplified. Bis(diethylamino)dimethylaminoisopropylsilane is also exemplified. Bis(diethylamino)dimethylaminovinylsilane is also exemplified. Bis(diethylamino)dimethylaminophenylsilane is also exemplified. Bis(diethylamino)dimethylamino-n-butylsilane is also exemplified. Bis(diethylamino)dimethylamino-s-butylsilane is also exemplified. Bis(diethylamino)dimethylamino-t-butylsilane is also exemplified. Bis(diethylamino)dimethylaminosilane is also exemplified. Bis(dimethylamino)ethylaminomethylsilane is also exemplified. Bis(dimethylamino)ethylaminoethylsilane is also exemplified. Bis(dimethylamino)ethylaminopropylsilane is also exemplified. Bis(dimethylamino)ethylaminoisopropylsilane is also exemplified. Bis(dimethylamino)ethylaminovinylsilane is also exemplified. Bis(dimethylamino)ethylaminophenylsilane is also exemplified. Bis(dimethylamino)ethylamino-n-butylsilane is also exemplified. Bis(dimethylamino)ethylamino-s-butylsilane is also exemplified. Bis(dimethylamino)ethylamino-t-butylsilane is also exemplified. Bis(dimethylamino)ethylaminosilane is also exemplified. Bis(dimethylamino)methylaminomethylsilane is also exemplified. Bis(dimethylamino)methylaminoethylsilane is also exemplified. Bis(dimethylamino)methylaminopropylsilane is also exemplified. Bis(dimethylamino)methylaminoisopropylsilane is also exemplified. Bis(dimethylamino)methylaminovinylsilane is also exemplified. Bis(dimethylamino)methylaminophenylsilane is also exemplified. Bis(dimethylamino)methylamino-n-butylsilane is also exemplified. Bis(dimethylamino)methylamino-s-butylsilane is also exemplified. Bis(dimethylamino)methylamino-t-butylsilane is also exemplified. Bis(dimethylamino)methylaminosilane is also exemplified. Bis(dimethylamino)diethylaminomethylsilane is also exemplified. Bis(dimethylamino)diethylaminoethylsilane is also exemplified. Bis(dimethylamino)diethylaminoopropylsilane is also exemplified. Bis(dimethylamino)diethylaminoisopropylsilane is also exemplified. Bis(dimethylamino)diethylaminovinylsilane is also exemplified. Bis(dimethylamino)diethylaminophenylsilane is also exemplified. Bis(dimethylamino)diethylamino-n-butylsilane is also exemplified. Bis(dimethylamino)diethylamino-s-butylsilane is also exemplified. Bis(dimethylamino)diethylamino-t-butylsilane is also exemplified. Bis(dimethylamino)diethylaminosilane is also exemplified. Ethylaminomethylaminodiethylaminomethylsilane is also exemplified. Ethylaminomethylaminodiethylaminoethylsilane is also exemplified. Ethylaminomethylaminodiethylaminopropylsilane is also exemplified. Ethylaminomethylaminodiethylaminoisopropylsilane is also exemplified. Ethylaminomethylaminodiethylaminovinylsilane is also exemplified. Ethylaminomethylaminodiethylaminophenylsilane is also exemplified. Ethylaminomethylaminodiethylamino-n-butylsilane is also exemplified. Ethylaminomethylaminodiethylamino-s-butylsilane is also exemplified. Ethylaminomethylaminodiethylamino-t-butylsilane is also exemplified. Ethylaminomethylaminodiethylaminosilane is also exemplified. Ethylaminomethylaminodimethylaminomethylsilane is also exemplified. Ethylaminomethylaminodimethylaminoethylsilane is also exemplified. Ethylaminomethylaminodimethylaminopropylsilane is also exemplified. Ethylaminomethylaminodimethylaminoisopropylsilane is also exemplified. Ethylaminomethylaminodimethylaminovinylsilane is also exemplified. Ethylaminomethylaminodimethylaminophenylsilane is also exemplified. Ethylaminomethylaminodimethylamino-n-butylsilane is also exemplified. Ethylaminomethylaminodimethylamino-s-butylsilane is also exemplified. Ethylaminomethylaminodimethylamino-t-butylsilane is also exemplified. Ethylaminomethylaminodimethylaminosilane is also exemplified. Eethylaminodiethylaminodimethylaminomethylsilane is also exemplified. Ethylaminodiethylaminodimethylaminoethylsilane is also exemplified. Ethylaminodiethylaminodimethylaminopropylsilane is also exemplified. Ethylaminodiethylaminodimethylaminoisopropylsilane is also exemplified. Ethylaminodiethylaminodimethylaminovinylsilane is also exemplified. Ethylaminodiethylaminodimethylaminophenylsilane is also exemplified. Ethylaminodiethylaminodimethylamino-n-butylsilane is also exemplified. Ethylaminodiethylaminodimethylamino-s-butylsilane is also exemplified. Ethylaminodiethylaminodimethylamino-t-butylsilane is also exemplified. Ethylaminodiethylaminodimethylaminosilane is also exemplified. Methylaminodiethylaminodimethylaminomethylsilane is also exemplified. Methylaminodiethylaminodimethylaminoethylsilane is also exemplified. Methylaminodiethylaminodimethylaminopropylsilane is also exemplified. Methylaminodiethylaminodimethylaminoisopropylsilane is also exemplified. Methylaminodiethylaminodimethylaminovinylsilane is also exemplified. Methylaminodiethylaminodimethylaminophenylsilane is also exemplified. Methylaminodiethylaminodimethylamino-n-butylsilane is also exemplified. Methylaminodiethylaminodimethylaminos-butylsilane is also exemplified. Methylaminodiethylaminodimethylamino-t-butylsilane is also exemplified. Methylaminodiethylaminodimethylaminosilane is also exemplified.

As specific examples of the silicon compound including the part expressed by the chemical formula (II) are compounds as exemplified below. That is, Chloro(dimethylamino)dimethylsilane is exemplified. Chloro(dimethylamino)diethylsilane is also exemplified. Chloro(dimethylamino)dipropylsilane is also exemplified. Chloro(dimethylamino)diisopropylsilane is also exemplified. Chloro(dimethylamino)divinylsilane is also exemplified. Chloro(dimethylamino)diphenylsilane is also exemplified. Chloro(dimethylamino)di(n-butyl)silane is also exemplified. Chloro(dimethylamino)di(s-butyl)silane is also exemplified. Chloro(dimethylamino)di(t-butyl)silane is also exemplified. Chloro(dimethylamino)ethylmethylsilane is also exemplified. Chloro(dimethylamino)methylpropylsilane is also exemplified. Chloro(dimethylamino)ethylpropylsilane is also exemplified. Chloro(dimethylamino)methylisopropylsilane is also exemplified. Chloro(dimethylamino)ethylisopropylsilane is also exemplified. Chloro(dimethylamino)isopropylpropylsilane is also exemplified. Chloro(dimethylamino)methylvinylsilane is also exemplified. Chloro(dimethylamino)ethylvinylsilane is also exemplified. Chloro(dimethylamino)propylvinylsilane is also exemplified. Chloro(dimethylamino)isopropylvinylsilane is also exemplified. Chloro(dimethylamino)methylphenylsilane is also exemplified. Chloro(dimethylamino)ethylphenylsilane is also exemplified. Chloro(dimethylamino)phenylpropylsilane is also exemplified. Chloro(dimethylamino)isopropylphenylsilane is also exemplified. Chloro(dimethylamino)phenylvinylsilane is also exemplified. Chloro(dimethylamino)n-butylmethylsilane is also exemplified. Chloro(dimethylamino)n-butylethylsilane is also exemplified. Chloro(dimethylamino)n-butylpropylsilane is also exemplified. Chloro(dimethylamino)n-butylisopropylsilane is also exemplified. Chloro(dimethylamino)n-butylvinylsilane is also exemplified. Chloro(dimethylamino)n-butylphenylsilane is also exemplified. Chloro(dimethylamino)s-butylmethylsilane is also exemplified. Chloro(dimethylamino)s-butylethylsilane is also exemplified. Chloro(dimethylamino)s-butylpropylsilane is also exemplified. Chloro(dimethylamino)s-butylisopropylsilane is also exemplified. Chloro(dimethylamino)s-butylvinylsilane is also exemplified. Chloro(didmethlamino)s-butylphenylsilane is also exemplified. Chloro(dimethylamino)n-butyl-s-butylsilane is also exemplified. Chloro(dimethylamino)t-butylmethylsilane is also exemplified. Chloro(dimethylamino)t-butylethylsilane is also exemplified. Chloro(dimethylamino)t-butylpropylsilane is also exemplified. Chloro(dimethylamino)t-butylisopropylsilane is also exemplified. Chloro(dimethylamino)t-butylvinylsilane is also exemplified. Chloro(dimethylamino)t-butylphenylsilane is also exemplified. Chloro(dimethylamino)n-butyl-t-butylsilane is also exemplified. Chloro(dimethylamino)s-butyl-t-butylsilane is also exemplified. Chloro(dimethylamino)methylsilane is also exemplified. Chloro(dimethylamino)ethylsilane is also exemplified. Chloro(dimethylamino)propylsilane is also exemplified. Chloro(dimethylamino)isopropylsilane is also exemplified. Chloro(dimethylamino)vinysilane is also exemplified. Chloro(dimethylamino)phenylsilane is also exemplified. Chloro(dimethylamino)n-butylsilane is also exemplified. Chloro(dimethylamino)s-butylsilane is also exemplified. Chloro(dimethylamino)t-butylsilane is also exemplified. Chloroo(dimethylamino)silane is also exemplified. Chloro(diethylamino)dimethylsilane is also exemplified. Chloro(diethylamino)diethylsilane is also exemplified. Chloro(diethylamino)dipropylsilane is also exemplified. Chloro(diethylamino)diisopropylsilane is also exemplified. Chloro(diethylamino)divinylsilane is also exemplified. Chloro(diethylamino)diphenylsilane is also exemplified. Chloro(diethylamino)di(n-butyl)silane is also exemplified. Chloro(diethylamino)di(s-butyl)silane is also exemplified. Chloro(diethylamino)di(t-butyl)silane is also exemplified. Chloro(diethylamino)ethylmethylsilane is also exemplified. Chloro(diethylamino)methylpropylsilane is also exemplified. Chloro(diethylamino)ethylpropylsilane is also exemplified. Chloro(diethylamino)methylisopropylsilane is also exemplified. Chloro(diethylamino)ethylisopropylsilane is also exemplified. Chloro(diethylamino)isopropylpropylsilane is also exemplified. Chloro(diethylamino)methylvinylsilane is also exemplified. Chloro(diethylamino)ethylvinylsilane is also exemplified. Chloro(diethylamino)propylvinylsilane is also exemplified. Chloro(diethylamino)isopropylvinylsilane is also exemplified. Chloro(diethylamino)methylphenylsilane is also exemplified. Chloro(diethylamino)ethylphenylsilane is also exemplified. Chloro(diethylamino)phenylpropylsilane is also exemplified. Chloro(diethylamino)isopropylphenylsilane is also exemplified. Chloro(diethylamino)phenyvinylsilane is also exemplified. Chloro(diethylamino)n-butylmethylsilane is also exemplified. Chloro(diethylamino)n-butylethylsilane is also exemplified. Chloro(diethylamino)n-butylpropylsilane is also exemplified. Chloro(diethylamino)n-butylisopropylsilane is also exemplified. Chloro(diethylamino)n-butylvinylsilane is also exemplified. Chloro(diethylamino)n-butylphenylsilane is also exemplified. Chloro(diethylamino)s-butylmethylsilane is also exemplified. Chloro(diethylamino)s-butylethylsilane is also exemplified. Chloro(diethylamino)s-butylpropylsilane is also exemplified. Chloro(diethylamino)s-butylisopropylsilane is also exemplified. Chloro(diethylamino)s-butylvinylsilane is also exemplified. Chloro(diethylamino)s-butylphenylsilane is also exemplified. Chloro(diethylamino)n-butyl-s-butylsilane is also exemplified. Chloro(diethylamino)t-butylmethylsilane is also exemplified. Chloro(diethylamino)t-butylethylsilane is also exemplified. Chloro(diethylamino)t-butylpropylsilane is also exemplified. Chloro(diethylamino)t-butylisopropylsilane is also exemplified. Chloro(diethylamino)t-butylvinylsilane is also exemplified. Chloro(diethylamino)t-butylphenylsilane is also exemplified. Chloro(diethylamino)n-butyl-t-butylsilane is also exemplified. Chloro(diethylamino)s-butyl-t-butylsilane is also exemplified. Chloro(diethylamino)methylsilane is also exemplified. Chloro(diethylamino)ethylsilane is also exemplified. Chloro(diethylamino)propylsilane is also exemplified. Chloro(diethylamino)isopropylsilane is also exemplified. Chloro(diethylamino)vinylsilane is also exemplified. Chloro(diethylamino)phenylsilane is also exemplified. Chloro(diethylamino)n-butylsilane is also exemplified. Chloro(diethylamino)s-butylsilane is also exemplified. Chloro(diethylamino)t-butylsilane is also exemplified. Chloro(diethylamino)silane is also exemplified. Chloro(methylamino)dimethylsilane is also exemplified. Chloro(methylamino)diethylsilane is also exemplified. Chloro(methylamino)dipropylsilane is also exemplified. Chloro(methylamino)diisopropylsilane is also exemplified. Chloro(methylamino)divinylsilane is also exemplified. Chloro(methylamino)diphenylsilane is also exemplified. Chloro(methylamino)di(n-butyl)silane is also exemplified. Chloro(methylamino)di(s-butyl)silane is also exemplified. Chloro(methylamino)di(t-butyl)silane is also exemplified. Chloro(methylamino)ethylmethylsilane is also exemplified. Chloro(methylamino)methylpropylsilane is also exemplified.

Chloro(methylamino)ethylpropylsilane is also exemplified. Chloro(methylamino)methylisopropylsilane is also exemplified. Chloro(methylamino)ethylisopropylsilane is also exemplified. Chloro(methylamino)isopropylpropylsilane is also exemplified. Chloro(methylamino)methylvinylsilane is also exemplified. Chloro(methylamino)ethylvinylsilane is also exemplified. Chloro(methylamino)propylvinylsilane is also exemplified. Chloro(methylamino)isopropylvinylsilane is also exemplified. Chloro(methylamino)methylphenylsilane is also exemplified. Chloro(methylamino)ethylphenylsilane is also exemplified. Chloro(methylamino)phenylpropylsilane is also exemplified. Chloro(methylamino)isopropylphenylsilane is also exemplified. Chloro(methylamino)phenylvinylsilane is also exemplified. Chloro(methylamino)n-butylmethylsilane is also exemplified. Chloro(methylamino) n-butylethylsilane is also exemplified. Chloro(methylamino) n-butylpropylsilane is also exemplified. Chloro (methylamino)n-butylisopropylsilane is also exemplified. Chloro(methylamino)n-butylvinylsilane is also exemplified. Chloro(methylamino)n-butylphenylsilane is also exemplified. Chloro(methylamino)s-butylmethylsilane is also exemplified. Chloro(methylamino)s-butylethylsilane is also exemplified. Chloro(methylamino)s-butylpropylsilane is also exemplified. Chloro(methylamino)s-butylisopropylsilane is also exemplified. Chloro(methylamino)s-butylvinylsilane is also exemplified. Chloro(methylamino)s-butylphenylsilane is also exemplified. Chloro(methylamino)n-butyl-s-butylsilane is also exemplified. Chloro(methylamino)t-butylmethylsilane is also exemplified. Chloro(methylamino)t-butylethylsilane is also exemplified. Chloro(methylamino)t-butylpropylsilane is also exemplified. Chloro(methylamino) t-butylisopropylsilane is also exemplified. Chloro (methylamino)t-butylvinylsilane is also exemplified. Chloro (methylamino)t-butylphenylsilane is also exemplified. Chloro(methylamino)n-butyl-t-butylsilane is also exemplified. Chloro(methylamino)s-butyl-t-butylsilane is also exemplified. Chloro(methylamino)methylsilane is also exemplified. Chloro(methylamino)ethylsilane is also exemplified. Chloro(methylamino)propylsilane is also exemplified. Chloro(methylamino)isopropylsilane is also exemplified. Chloro(methylamino)vinylsilane is also exemplified. Chloro(methylamino)phenylsilane is also exemplified. Chloro(methylamino)n-butylsilane is also exemplified. Chloro(methylamino)s-butylsilane is also exemplified. Chloro(methylamino)t-butylsilane is also exemplified. Chloro(methylamino)silane is also exemplified. Chloro(ethylamino)dimethylsilane is also exemplified. Chloro(ethylamino)diethylsilane is also exemplified. Chloro(ethylamino)dipropylsilane is also exemplified. Chloro(ethylamino)diisopropylsilane is also exemplified. Chloro(ethylamino)divinylsilane is also exemplified. Chloro(ethylamino)diphenylsilane is also exemplified. Chloro(ethylamino)di(n-butyl)silane is also exemplified. Chloro(ethylamino)di(s-butyl)silane is also exemplified. Chloro(ethylamino)di(t-butyl)silane is also exemplified. Chloro(ethylamino)ethylmethylsilane is also exemplified. Chloro(ethylamino)methlpropylsilane is also exemplified. Chloro(ethylamino)ethylpropylsilane is also exemplified. Chloro(ethylamino)methylisopropylsilane is also exemplified. Chloro(ethylamino)ethylisopropylsilane is also exemplified. Chloro(ethylamino)isopropypropylsilane is also exemplified. Chloro(ethylamino)methylvinylsilane is also exemplified. Chloro(ethylamino)ethylvinylsilane is also exemplified. Chloro(ethylamino)propylvinylsilane is also exemplified. Chloro(ethylamino)isopropylvinylsilane is also exemplified. Chloro(ethylamino)methylphenylsilane is also exemplified. Chloro(ethylamino)ethylphenylsilane is also exemplified. Chloro(ethylamino)phenylpropylsilane is also exemplified. Chloro(ethylamino)isopropyphenylsilane is also exemplified. Chloro(ethylamino)phenylvinylsilane is also exemplified. Chloro(ethylamino)n-butylmethylsilane is also exemplified. Chloro(ethylamino)n-butylethylsilane is also exemplified. Chloro(ethylamino)n-butylpropylsilane is also exemplified. Chloro(ethylamino)n-butylisopropylsilane is also exemplified. Chloro(ethylamino)n-butylvinylsilane is also exemplified. Chloro(ethylamino)n-butylphenylsilane is also exemplified. Chloro(ethylamino)s-butylmethylsilane is also exemplified. Chloro(ethylamino)s-butylethylsilane is also exemplified. Chloro(ethylamino)s-butylpropylsilane is also exemplified. Chloro(ethylamino)s-butylisopropylsilane is also exemplified. Chloro(ethylamino)s-butylvinylsilane is also exemplified. Chloro(ethylamino)s-butylphenylsilane is also exemplified. Chloro(ethylamino)n-butyl-s-butylsilane is also exemplified. Chloro(ethylamino)t-butylmethylsilane is also exemplified. Chloro(ethylamino)t-butylethylsilane is also exemplified. Chloro(ethylamino)t-butylpropylsilane is also exemplified. Chloro(ethylamino)t-butylisopropylsilane is also exemplified. Chloro(ethylamino)t-butylvinylsilane is also exemplified. Chloro(ethylamino)t-butylphenylsilane is also exemplified. Chloro(ethylamino)n-butyl-t-butylsilane is also exemplified. Chloro(ethylamino)s-butyl-t-butylsilane is also exemplified. Chloro(ethylamino)methylsilane is also exemplified. Chloro(ethylamino)ethylsilane is also exemplified. Chloro(ethylamino)propylsilane is also exemplified. Chloro(ethylamino)isopropylsilane is also exemplified. Chloro(ethylamino)vinylsilane is also exemplified. Chloro (ethylamino)phenylsilane is also exemplified. Chloro(ethylamino)n-butylsilane is also exemplified. Chloro(ethylamino)s-butylsilane is also exemplified. Chloro(ethylamino) t-butylsilane is also exemplified. Chloro(ethylamino)silane is also exemplified.

As specific examples of the silicon compound including the part expressed by the chemical formula (12) are compounds as exemplified below. That is, dichloro(dimethylamino)methylsilane is exemplified. Dichloro(dimethylamino)ethylsilane is also exemplified. Dichloro(dimethylamino)propylsilane is also exemplified. Dichloro(dimethylamino)isopropylsilane is also exemplified. Dichloro(dimethylamino)vinylsilane is also exemplified. Dichloro(dimethylamino)phenylsilane is also exemplified. Dichloro(dimethylamino)n-butylsilane is also exemplified. Dichloro(dimethylamino)s-butylsilane is also exemplified. Dichloro(dimethylamino)t-butylsilane is also exemplified. Dichloro(dimethylamino)silane is also exemplified. Dichloro(diethylamino)methylsilane is also exemplified. Dichloro(diethylamino)ethylsilane is also exemplified. Dichloro(diethylamino)propylsilane is also exemplified. Dichloro(diethylamino)isopropylsilane is also exemplified. Dichloro(diethylamino)vinylsilane is also exemplified. Dichloro(diethylamino)phenylsilane is also exemplified. Dichloro(diethylamino)n-butylsilane is also exemplified. Dichloro(diethylamino)s-butylsilane is also exemplified. Dichloro(diethylamino)t-butylsilane is also exemplified. Dichloro(diethylamino)silane is also exemplified. Dichloro(methylamino)methylsilane is also exemplified. Dichloro(methylamino)ethylsilane is also exemplified. Dichloro(methylamino)propylsilane is also exemplified. Dichloro(methylamino)isopropylsilane is also exemplified. Dichloro(methylamino)vinylsilane is also exemplified. Dichloro(methylamino)phenylsilane is also exemplified. Dichloro(methylamino)n-butylsilane is also exemplified. Dichloro(methylamino)s-butylsilane is also exemplified. Dichloro(methylamino)t-butylsilane is also exemplified. Dichloro(methylamino)silane is also exemplified. Dichloro (ethylamino)methylsilane is also exemplified. Dichloro(ethylamino)ethylsilane is also exemplified. Dichloro(ethylamino)propylsilane is also exemplified. Dichloro(ethylamino)isopropylsilane is also exemplified. Dichloro(ethylamino)vinylsilane is also exemplified. Dichloro(ethylamino)phenylsilane is also exemplified. Dichloro(ethylamino)n-butylsilane is also exemplified. Dichloro(ethylamino)s-butylsilane is also exemplified. Dichloro(ethylamino)t-butylsilane is also exemplified. Dichloro(ethylamino)silane is also exemplified.

As specific examples of the silicon compound including the part expressed by the chemical formula (13) are compounds as exemplified below. That is, trichloro(dimethylamino)silane is exemplified. Trichloro(diethylamino)silane is also exemplified. Trichloro(methylamino)silane is also exemplified. Trichloro(ethylamino)silane is also exemplified.

As specific examples of the silicon compound including the part expressed by the chemical formula (14) are compounds as exemplified below. That is, bis(dimethylamino)dimethylsilane is exemplified. Bis(dimethylamino)diethylsilane is also exemplified. Bis(dimethylamino)dipropylsilane is also exemplified. Bis(dimethylamino)diisopropylsilane is also exemplified. Bis(dimethylamino)divinylsilane is also exemplified. Bis(dimethylamino)diphenylsilane is also exemplified. Bis(dimethylamino)di(n-butyl)silane is also exemplified. Bis(dimethylamino)di(s-butyl)silane is also exemplified. Bis(dimethylamino)di(t-butyl)silane is also exemplified. Bis(dimethylamino)ethylmethylsilane is also exemplified. Bis(dimethylamino)methylpropylsilane is also exemplified. Bis(dimethylamino)ethylpropylsilane is also exemplified. Bis(dimethylamino)methylisopropylsilane is also exemplified. Bis(dimethylamino)ethylisopropylsilane is also exemplified. Bis(dimethylamino)isopropylpropylsilane also is exemplified. Bis(dimethylamino)methylvinylsilane also is exemplified. Bis(dimethylamino)ethylvinylsilane is also exemplified. Bis(dimethylamino)propylvinylsilane is also exemplified. Bis(dimethylamino)isopropylvinylsilane is also exemplified. Bis(dimethylamino)methylphenylsilane is also exemplified. Bis(dimethylamino)ethylphenylsilane is also exemplified. Bis(dimethylamino)phenylpropylsilane is also exemplified. Bis(dimethylamino)isopropylphenylsilane is also exemplified. Bis(dimethylamino)phenylvinylsilane is also exemplified. Bis(dimethylamino)n-butylmethylsilane is also exemplified. Bis(dimethylamino)n-butylethylsilane is also exemplified. Bis(dimethylamino)n-butylpropylsilane is also exemplified. Bis(dimethylamino)n-butylisopropylsilane is also exemplified. Bis(dimethylamino)n-butylvinylsilane is also exemplified. Bis(dimethylamino)n-butylphenylsilane is also exemplified. Bis(dimethylamino)s-butylmethylsilane is also exemplified. Bis(dimethylamino)s-butylethylsilane is also exemplified. Bis(dimethylamino)s-butylpropylsilane is also exemplified. Bis(dimethylamino)s-butylisopropylsilane is also exemplified. Bis(dimethylamino)s-butylvinylsilane is also exemplified. Bis(dimethylamino)s-butylphenylsilane is also exemplified. Bis(dimethylamino)n-butyl-s-butylsilane is also exemplified. Bis(dimethylamino)t-butylmethylsilane is also exemplified. Bis(dimethylamino)t-butylethylsilane is also exemplified. Bis(dimethylamino)t-butylpropylsilane is also exemplified. Bis(dimethylamino)t-butylisopropylsilane is also exemplified. Bis(dimethylamino)t-butylvinylsilane is also exemplified. Bis(dimethylamino)t-butylphenylsilane is also exemplified. Bis(dimethylamino)n-butyl-t-butylsilane is also exemplified. Bis(dimethylamino)s-butyl-t-butylsilane is also exemplified. Bis(dimethylamino)methylsilane is also exemplified. Bis(dimethylamino)ethylsilane is also exemplified. Bis(dimethylamino)propylsilane is also exemplified. Bis(dimethylamino)isopropylsilane is also exemplified. Bis(dimethylamino)vinylsilane is also exemplified. Bis(dimethylamino)phenylsilane is also exemplified. Bis(dimethylamino)n-butylsilane is also exemplified. Bis(dimethylamino)s-butylsilane is also exemplified. Bis(dimethylamino)t-butylsilane is also exemplified. Bis(dimethylamino)silane is also exemplified. Bis(methylamino)dimethylsilane is also exemplified. Bis(methylamino)diethylsilane is also exemplified. Bis(methylamino)dipropylsilane is also exemplified. Bis(methylamino)diisopropylsilane is also exemplified. Bis(methylamino)divinylsilane is also exemplified. Bis(methylamino)diphenylsilane is also exemplified. Bis(methylamino)di(n-butyl)silane is also exemplified. Bis(methylamino)di(s-butyl)silane is also exemplified. Bis(methylamino)di(t-butyl)silane is also exemplified. Bis(methylamino)ethylmethylsilane is also exemplified. Bis(methylamino)methylpropylsilane is also exemplified. Bis(methylamino)ethylpropylsilane is also exemplified. Bis(methylamino)methylisopropylsilane is also exemplified. Bis(methylamino)ethylisopropylsilane is also exemplified. Bis(methylamino)isopropylpropylsilane is also exemplified. Bis(methylamino)methylvinylsilane is also exemplified. Bis(methylamino)ethylvinylsilane is also exemplified. Bis(methylamino)propylvinylsilane is also exemplified. Bis(methylamino)isopropylvinylsilane is also exemplified. Bis(methylamino)methylphenylsilane is also exemplified. Bis(methylamino)ethylphenylsilane is also exemplified. Bis(methylamino)phenylpropylsilane is also exemplified. Bis(methylamino)isopropylphenylsilane is also exemplified. Bis(methylamino)phenylvinylsilane is also exemplified. Bis(methylamino)n-butylmethylsilane is also exemplified. Bis(methylamino)n-butylethylsilane is also exemplified. Bis(methylamino)n-butylpropylsilane is also exemplified. Bis(methylamino)n-butylisopropylsilane is also exemplified. Bis(methylamino)n-butylbinylsilane is also exemplified. Bis(methylamino)n-butylphenylsilane is also exemplified. Bis(methylamino)s-butylmethylsilane is also exemplified. Bis(methylamino)s-butylethylsilane is also exemplified. Bis(methylamino)s-butylpropylsilane is also exemplified. Bis(methylamino)s-butylisopropylsilane is also exemplified. Bis(methylamino)s-butylvinylsilane is also exemplified. Bis(methylamino)s-butylphenylsilane is also exemplified. Bis(methylamino)n-butyl-s-butylsilane is also exemplified. Bis(methylamino)t-butylmethylsilane is also exemplified. Bis(methylamino)t-butylethylsilane is also exemplified. Bis(methylamino)t-butylpropylsilane is also exemplified. Bis(methylamino)t-butylisopropylsilane is also exemplified. Bis(methylamino)t-butylvinylsilane is also exemplified. Bis(methylamino)t-butylphenylsilane is also exemplified. Bis(methylamino)n-butyl-t-butylsilane is also exemplified. Bis(methylamino)s-butyl-t-butylsilane is also exemplified. Bis(methylamino)methylsilane is also exemplified. Bis(methylamino)ethylsilane is also exemplified. Bis(methylamino)propylsilane is also exemplified. Bis(methylamino)isopropylsilane is also exemplified. Bis(methylamino)vinylsilane is also exemplified. Bis(methylamino)phenylsilane is also exemplified. Bis(methylamino)n-butylsilane is also exemplified. Bis(methylamino)s-butylsilane is also exemplified. Bis(methylamino)t-butylsilane is also exemplified. Bis(methylamino)silane is also exemplified. Bis(diethylamino)dimethylsilane is also exemplified. Bis(diethylamino)diethylsilane is also exemplified. Bis(diethylamino)dipropylsilane is also exemplified. Bis(diethylamino)diisopropylsilane is also exemplified. Bis(diethylamino)divinylsilane is also exemplified. Bis(diethylamino)diphenylsilane is also exemplified. Bis(diethylamino)di(n- butyl)silane is also exemplified. Bis(diethylamino)di(s-butyl)silane is also exemplified. Bis(diethylamino)di(t-butyl)silane is also exemplified. Bis(diethylamino)ethylmethylsilane is also exemplified. Bis(diethylamino)methylpropylsilane is also exemplified. Bis(diethylamino)ethylpropylsilane is also exemplified. Bis(diethylamino)methylisopropylsilane is also exemplified. Bis(diethylamino)ethylisopropylsilane is also exemplified. Bis(diethylamino)isopropylpropylsilane is also exemplified. Bis(diethylamino)methylvinylsilane is also exemplified. Bis(diethylamino)ethylvinylsilane is also exemplified. Bis(diethylamino)propylvinylsilane is also exemplified. Bis(diethylamino)isopropylvinylsilane is also exemplified. Bis(diethylamino)methylphenylsilane is also exemplified. Bis(diethylamino)ethylphenylsilane is also exemplified. Bis(diethylamino)phenylpropylsilane is also exemplified. Bis(diethylamino)isopropylphenylsilane is also exemplified. Bis(diethylamino)phenylvinylsilane is also exemplified. Bis(diethylamino)n-butylmethylsilane is also exemplified. Bis(diethylamino)n-butylethylsilane is also exemplified. Bis(diethylamino)n-butylpropylsilane is also exemplified. Bis(diethylamino)n-butylisopropylsilane is also exemplified. Bis(diethylamino)n-butylvinylsilane is also exemplified. Bis(diethylamino)n-butylphenylsilane is also exemplified. Bis(diethylamino)s-butylmethylsilane is also exemplified. Bis(diethylamino)s-butylethylsilane is also exemplified. Bis(diethylamino)s-butylpropylsilane is also exemplified. Bis(diethylamino)s-butylisopropylsilane is also exemplified. Bis(diethylamino)s-butylvinylsilane is also exemplified. Bis(diethylamino)s-butylphenylsilane is also exemplified. Bis(diethylamino)n-butyl-s-butylsilane is also exemplified. Bis(diethylamino)t-butylmethylsilane is also exemplified. Bis(diethylamino)t-butylethylsilane is also exemplified. Bis(diethylamino)t-butylpropylsilane is also exemplified. Bis(diethylamino)t-butylisopropylsilane is also exemplified. Bis(diethylamino)t-butylvinylsilane is also exemplified. Bis(diethylamino)t-butylphenylsilane is also exemplified. Bis(diethylamino)n-butyl-t-butylsilane is also exemplified. Bis(diethylamino)s-butyl-t-butylsilane is also exemplified. Bis(diethylamino)methylsilane is also exemplified. Bis(diethylamino)ethylsilane is also exemplified. Bis(diethylamino)propylsilane is also exemplified. Bis(diethylamino)isopropylsilane is also exemplified. Bis(diethylamino)vinylsilane is also exemplified. Bis(diethylamino)phenylsilane is also exemplified. Bis(diethylamino)n-butylsilane is also exemplified. Bis(diethylamino)s-butylsilane is also exemplified. Bis(diethylamino)t-butylsilane is also exemplified. Bis(diethylamino)silane is also exemplified. Bis(ethylamino)dimethylsilane is also exemplified. Bis(ethylamino)diethylsilane is also exemplified. Bis(ethylamino)dipropylsilane is also exemplified. Bis(ethylamino)diisopropylsilane is also exemplified. Bis(ethylamino)divinylsilane is also exemplified. Bis(ethylamino)diphenylsilane is also exemplified. Bis(ethylamino)di(n-butyl)silane is also exemplified. Bis(ethylamino)di(s-butyl)silane is also exemplified. Bis(ethylamino)di(t-butyl)silane is also exemplified. Bis(ethylamino)ethylmethylsilane is also exemplified. Bis(ethylamino)methylpropylsilane is also exemplified. Bis(ethylamino)ethylpropylsilane is also exemplified. Bis(ethylamino)methylisopropylsilane is also exemplified. Bis(ethylamino)ethylisopropylsilane is also exemplified. Bis(ethylamino)isopropylpropylsilane is also exemplified. Bis(ethylamino)methylvinylsilane is also exemplified. Bis(ethylamino)ethylvinylsilane is also exemplified. Bis(ethylamino)propylvinylsilane is also exemplified. Bis(ethylamino)isopropylvinylsilane is also exemplified. Bis(ethylamino)methylphenylsilane is also exemplified. Bis(ethylamino)ethylphenylsilane is also exemplified. Bis(ethylamino)phenylpropylsilane is also exemplified. Bis(ethylamino)isopropylphenylsilane is also exemplified. Bis(ethylamino)phenylvinylsilane is also exemplified. Bis(ethylamino)n-butylmethylsilane is also exemplified. Bis(ethylamino)n-butylethylsilane is also exemplified. Bis(ethylamino)n-butylpropylsilane is also exemplified. Bis(ethylamino)n-butylisopropylsilane is also exemplified. Bis(ethylamino)n-butylvinylsilane is also exemplified. Bis(ethylamino)n-butylphenylsilane is also exemplified. Bis(ethylamino)s-butylmethylsilane is also exemplified. Bis(ethylamino)s-butylethylsilane is also exemplified. Bis(ethylamino)s-butylpropylsilane is also exemplified. Bis(ethylamino)s-butylisopropylsilane is also exemplified. Bis(ethylamino)s-butylvinylsilane is also exemplified. Bis(ethylamino)s-butylphenylsilane is also exemplified. Bis(ethylamino)n-butyl-s-butylsilane is also exemplified. Bis(ethylamino)t-butylmethylsilane is also exemplified. Bis(ethylamino)t-butylethylsilane is also exemplified. Bis(ethylamino)t-butylpropylsilane is also exemplified. Bis(ethylamino)t-butylisopropylsilane is also exemplified. Bis(ethylamino)t-butylvinylsilane is also exemplified. Bis(ethylamino)t-butylphenylsilane is also exemplified. Bis(ethylamino)n-butyl-t-butylsilane is also exemplified. Bis(ethylamino)s-butyl-t-butylsilane is also exemplified. Bis(ethylamino)methylsilane is also exemplified. Bis(ethylamino)ethylsilane is also exemplified. Bis(ethylamino)propylsilane is also exemplified. Bis(ethylamino)isopropylsilane is also exemplified. Bis(ethylamino)vinylsilane is also exemplified. Bis(ethylamino)phenylsilane is also exemplified. Bis(ethylamino)n-butylsilane is also exemplified. Bis(ethylamino)s-butylsilane is also exemplified. Bis(ethylamino)t-butylsilane is also exemplified. Bis(ethylamino)silane is also exemplified. Ethylaminomethylaminodimethysilane is also exemplified. Ethylaminomethylaminodiethylsilane is also exemplified. Ethylaminomethylaminodipropylsilane is also exemplified. Ethylaminomethylaminodiisopropylsilane is also exemplified. Ethylaminomethylaminodivinylsilane is also exemplified. Ethylaminomethylaminodiphenylsilane is also exemplified. Ethylaminomethylaminodi(n-butyl)silane is also exemplified. Ethylaminomethylaminodi(s-butyl)silane is also exemplified. Ethylaminomethylaminodi(t-butyl)silane is also exemplified. Ethylaminomethylaminoethylmethylsilane is also exemplified. Ethylaminomethylaminoethylpropylsilane is also exemplified. Ethylaminomethylaminoethylpropylsilane is also exemplified. Ethylaminomethylaminomethylisopropylsilane is also exemplified. Ethylaminomethylaminoethylisopropylsilane is also exemplified. Ethylaminomethylaminoisopropylpropylsilane is also exemplified. Ethylaminomethylaminomethylvinylsilane is also exemplified. Ethylaminomethylaminoethylvinylsilane is also exemplified. Ethylaminomethylaminopropylvinylsilane is also exemplified. Ethylaminomethylaminoisopropylvinylsilane is also exemplified. Ethylaminomethylaminomethylphenylsilane is also exemplified. Ethylaminomethylaminoethylphenylsilane is also exemplified. Ethylaminomethylaminophenylpropylsilane is also exemplified. Ethylaminomethylaminoisopropylphenylsilane is also exemplified. Ethylaminomethylaminophenylvinylsilane is also exemplified. Ethylaminomethylamino-n-butylmethylsilane is also exemplified. Ethylaminomethylamino-n-butylethylsilane is also exemplified. Ethylaminomethylamino-n-butylpropylsilane is also exemplified. Ethylaminomethylamino-n-butylisopropylsilane is also exemplified. Ethylaminomethylamino-n-butylvinylsilane is also exemplified. Ethylaminomethylaminon-butylphenylsilane is also exemplified. Ethylaminomethylamino-s-butylmethylsilane is also exemplified. Ethylaminomethylamino-s-butylethylsilane is also exemplified. Ethylaminomethylamino-s-butylpropylsilane is also exemplified. Ethylaminomethylamino-s-butylisopropylsilane is also exemplified. Ethylaminomethylamino-s-butylvinylsilane is also exemplified. Ethylaminomethylamino-s-butylphenylsilane is also exemplified. Ethylaminomethylamino-n-butyl-s-butylsilane is also exemplified. Ethylaminomethylamino-t-butylmethylsilane is also exemplified. Ethylaminomethylamino-t-butylethylsilane is also exemplified. Ethylaminomethylamino-t-butylpropylsilane is also exemplified. Ethylaminomethylamino-t-butylisopropylsilane is also exemplified. Ethylaminomethylamino-t-butylvinylsilane is also exemplified. Ethylaminomethylamino-t-butylphenylsilane is also exemplified. Ethylaminomethylamino-n-butyl-t-butylsilane is also exemplified. Ethylaminomethylamino-s-butyl-t-butylsilane is also exemplified. Ethylaminomethylaminomethylsilane is also exemplified. Ethylaminomethylaminoethylsilane is also exemplified. Ethylaminomethylaminopropylsilane is also exemplified. Ethylaminomethylaminoisopropylsilane is also exemplified. Ethylaminomethylaminovinylsilane is also exemplified. Ethylaminomethylaminophenylsilane is also exemplified. Ethylaminomethylamino-n-butylsilane is also exemplified. Ethylaminomethylamino-s-butylsilane is also exemplified. Ethylaminomethylamino-t-butylsilane is also exemplified. Ethylaminomethylaminosilane is also exemplified. Diethylaminomethylaminodimethylsilane is also exemplified. Diethylaminomethylaminodiethylsilane is also exemplified. Diethylaminomethylaminodipropylsilane is also exemplified. Diethylaminomethylaminodiisopropylsilane is also exemplified. Diethylaminomethylaminodivinylsilane is also exemplified. Diethylaminomethylaminodiphenysilane is also exemplified. Diethylaminomethylaminodi(n-butyl)silane is also exemplified. Diethylaminomethylaminodi(s-butyl)silane is also exemplified. Diethylaminomethylaminodi(t-butyl)silane is also exemplified. Diethylaminomethylaminoethylmethylsilane is also exemplified. Diethylaminomethylaminomethylpropylsilane is also exemplified. Diethylaminomethylaminoethylpropylsilane is also exemplified. Diethylaminomethylaminomethylisopropylsilane is also exemplified. Diethylaminomethylaminoethylisopropylsilane is also exemplified. Diethylaminomethylaminoisopropylpropylsilane is also exemplified. Diethylaminomethylaminomethylvinylsilane is also exemplified. Diethylaminomethylaminoethylvinylsilane is also exemplified. Diethylaminomethylaminopropylvinylsilane is also exemplified. Diethylaminomethylaminoisopropylvinylsilane is also exemplified. Diethylaminomethylaminomethylphenylsilane is also exemplified. Diethylaminomethylaminoethyphenylsilane is also exemplified. Diethylaminomethylaminophenylpropylsilane is also exemplified. Diethylaminomethylaminoisopropylphenylsilane is also exemplified. Diethylaminomethylaminophenylvinylsilane is also exemplified. Diethylaminomethylamino-n-butylmethylsilane is also exemplified. Diethylaminomethylamino-n-butylethylsilane is also exemplified. Diethylaminomethylamino-n-butylpropylsilane is also exemplified. Diethylaminomethylamino-n-butylisopropylsilane is also exemplified. Diethylaminomethylamino-n-butylvinylsilane is also exemplified. Diethylaminomethylamino-n-butylphenylsilane is also exemplified. Diethylaminomethylamino-s-butylmethylsilane is also exemplified. Diethylaminomethylamino-s-butyethylsilane is also exemplified. Diethylaminomethylamino-s-butylpropylsilane is also exemplified. Diethylaminomethylamino-s-butylisopropylsilane is also exemplified. Diethylaminomethylamino-s-butylvinylsilane is also exemplified. Diethylaminomethylamino-s-butylphenylsilane is also exemplified. Diethylaminomethylamino-n-butyl-s-butylsilane is also exemplified. Diethylaminomethylamino-t-butylmethylsilane is also exemplified. Diethylaminomethylamino-t-butylethylsilane is also exemplified. Diethylaminomethylamino-t-butylpropylsilane is also exemplified. Diethylaminomethylamino-t-butylisopropylsilane is also exemplified. Diethylaminomethylamino-t-butylvinylsilane is also exemplified. Diethylaminomethylamino-t-butylphenylsilane is also exemplified. Diethylaminomethylamino-n-butyl-t-butylsilane is also exemplified. Diethylaminomethylamino-s-butyl-t-butylsilane is also exemplified. Diethylaminomethylaminomethylsilane is also exemplified. Diethylaminomethylaminoethylsilane is also exemplified. Diethylaminomethylaminopropylsilane is also exemplified. Diethylaminomethylaminoisopropylsilane is also exemplified. Diethylaminomethylaminovinylsilane is also exemplified. Diethylaminomethylaminophenylsilane is also exemplified. Diethylaminomethylamino-n-butylsilane is also exemplified. Diethylaminomethylamino-s-butylsilane is also exemplified. Diethylaminomethylamino-t-butylsilane is also exemplified. Diethylaminomethylaminoosilane is also exemplified. Ethylaminodimethylaminodimethylsilane is also exemplified. Ethylaminodimethylaminodiethylsilane is also exemplified. Ethylaminodimethylaminodipropylsilane is also exemplified. Ethylaminodimethylaminodiisopropylsilane is also exemplified. Ethylaminodimethylaminodivinylsilane is also exemplified. Ethylaminodimethylaminodiphenylsilane is also exemplified. Ethylaminodimethylaminodi(n-butyl)silane is also exemplified. Ethylaminodimethylaminodi(s-butyl)silane is also exemplified. Ethylaminodimethylaminodi(t-butyl)silane is also exemplified. Ethylaminodimethylaminoethylmethylsilane is also exemplified. Ethylaminodimethylaminomethylpropylsilane is also exemplified. Ethylaminodimethylaminoethylpropylsilane is also exemplified. Ethylaminodimethylaminomethylisopropylsilane is also exemplified. Ethylaminodimethylaminoethylisopropylsilane is also exemplified. Ethylaminodimethylaminoisopropypropylsilane is also exemplified. Ethylaminodimethylaminomethylvinylsilane is also exemplified. Ethylaminodimethylaminoethylvinylsilane is also exemplified. Ethylaminodimethylaminopropylvinylsilane is also exemplified. Ethylaminodimethylaminoisopropylvinylsilane is also exemplified. Ethylaminodimethylaminomethylphenylsilane is also exemplified. Ethylaminodimethylaminoethylphenylsilane is also exemplified. Ethylaminodimethylaminophenylpropylsilane is also exemplified. Ethylaminodimethylaminoisopropylphenylsilane is also exemplified. Ethylaminodimethylaminophenylvinylsilane is also exemplified. Ethylaminodimethylamino-n-butylmethylsilane is also exemplified. Ethylaminodimethylamino-n-butylethylsilane is also exemplified. Ethylaminodimethylamino-n-butylpropylsilane is also exemplified. Ethylaminodimethylamino-n-butylisopropylsilane is also exemplified. Ethylaminodimethylamino-n-butylvinylsilane is also exemplified. Ethylaminodimethylamino-n-butylphenylsilane is also exemplified. Ethylaminodimethylamino-s-butylmethylsilane is also exemplified. Ethylaminodimethylamino-s-butylethylsilane is also exemplified. Ethylaminodimethylamino-s-butylpropylsilane is also exemplified. Ethylaminodimethylamino-s-butylisopropylsilane is also exemplified. Ethylaminodimethylamino-s-butylvinylsilane is also exemplified. Ethylaminodimethylamino-s-butylphenylsilane is also exemplified. Ethylaminodimethylamino-n-butyl-s-butylsilane is also exemplified. Ethylaminodimethylamino-t-butylmethylsilane is also exemplified. Ethylaminodimethylamino-t-butylethylsilane is also exemplified. Ethylaminodimethylamino-t-butylpropylsilane is also exemplified. Ethylaminodimethylamino-t-butylisopropylsilane is also exemplified. Ethylaminodimethylamino-t-butylvinylsilane is also exemplified. Ethylaminodimethylamino-t-butylphenylsilane is also exemplified. Ethylaminodimethylamino-n-butyl-t-butylsilane is also exemplified. Ethylaminodimethylamino-s-butyl-t-butylsilane is also exemplified. Ethylaminodimethylaminomethylsilane is also exemplified. Ethylaminodimethylaminoethylsilane is also exemplified. Ethylaminodimethylaminopropylsilane is also exemplified. Ethylaminodimethylaminoisopropylsilane is also exemplified. Ethylaminodimethylaminovinylsilane is also exemplified. Ethylaminodimethylaminophenylsilane is also exemplified. Ethylaminodimethylamino-n-butylsilane is also exemplified. Ethylaminodimethylamino-s-butylsilane is also exemplified. Ethylaminodimethylamino-t-butylsilane is also exemplified. Ethylaminodimethylaminosilane is also exemplified. Diethylaminodimethylaminodimethylsilane is also exemplified. Diethylaminodimethylaminodiethylsilane is also exemplified. Diethylaminodimethylaminodipropylsilane is also exemplified. Diethylaminodimethylaminodiisopropylsilane is also exemplified. Diethylaminodimethylaminodivinylsilane is also exemplified. Diethylaminodimethylaminodiphenylsilane is also exemplified. Diethylaminodimethylaminodi(n-butyl)silane is also exemplified. Diethylaminodimethylaminodi(s-butyl)silane is also exemplified. Diethylaminodimethylaminodi(t-butyl)silane is also exemplified. Diethylaminodimethylaminoethylmethylsilane is also exemplified. Diethylaminodimethylaminomethylpropylsilane is also exemplified. Diethylaminodimethylaminoethylpropylsilane is also exemplified. Diethylaminodimethylaminomethylisopropylsilane is also exemplified. Diethylaminodimethylaminoethylisopropylsilane is also exemplified. Diethylaminodimethylaminoisopropylpropylsilane is also exemplified. Diethylaminodimethylaminomethylvinylsilane is also exemplified. Diethylaminodimethylaminoethylvinylsilane is also exemplified. Diethylaminodimethylaminopropylvinylsilane is also exemplified. Diethylaminodimethylaminoisopropylvinylsilane is also exemplified. Diethylaminodimethylaminomethylphenylsilane is also exemplified. Diethylaminodimethylaminoethylphenylsilane is also exemplified. Diethylaminodimethylaminophenylpropylsilane is also exemplified. Diethylaminodimethylaminopropylphenylsilane is also exemplified. Diethylaminodimethylaminophenylvinylsilane is also exemplified. Diethylaminodimethylamino-n-butylmethylsilane is also exemplified. Diethylaminodimethylamino-n-butylethylsilane is also exemplified. Diethylaminodimethylamino-n-butylpropylsilane is also exemplified. Diethylaminodimethylamino-n-butylisopropylsilane is also exemplified. Diethylaminodimethylamino-n-butylvinylsilane is also exemplified. Diethylaminodimethylamino-n-butylphenylsilane is also exemplified. Diethylaminodimethylamino-s-butylmethylsilane is also exemplified. Diethylaminodimethylamino-s-butylethylsilane is also exemplified. Diethylaminodimethylamino-s-butylpropylsilane is also exemplified. Diethylaminodimethylamino-s-butylisoprpylsilane is also exemplified. Diethylaminodimethylamino-s-butylvinylsilane is also exemplified. Diethylaminodimethylamino-s-butylphenylsilane is also exemplified. Diethylaminodimethylamino-n-butyl-s-butylsilane is also exemplified. Diethylaminodimethylamino-t-butylmethylsilane is also exemplified. Diethylaminodimethylamino-t-butylethylsilane is also exemplified. Diethylaminodimethylamino-t-butylpropylsilane is also exemplified. Diethylaminodimethylamino-t-butylisopropylsilane is also exemplified. Diethylaminodimethylamino-t-butylvinylsilane is also exemplified. Diethylaminodimethylamino-t-butylphenylsilane is also exemplified. Diethylaminodimethylamino-n-butyl-t-butylsilane is also exemplified. Diethylaminodimethylamino-s-butyl-t-butylsilane is also exemplified. Diethylaminodimethylaminomethylsilane is also exemplified. Diethylaminodimethylaminoethylsilane is also exemplified. Diethylaminodimethylaminopropylsilane is also exemplified. Diethylaminodimethylaminoisopropylsilane is also exemplified. Diethylaminodimethylaminovinylsilane is also exemplified. Diethylaminodimethylaminophenylsilane is also exemplified. Diethylaminodimethylamino-n-butylsilane is also exemplified. Diethylaminodimethylamino-s-butylsilane is also exemplified. Diethylaminodimethylamino-t-butylsilane is also exemplified. Diethylaminodimethylaminosilane is also exemplified.

As specific examples of the silicon compound including the part expressed by the chemical formula (15) are compounds as exemplified below. That is, tris(dimethylamino)chlorosilane is exemplified. Tris(diethylamino)chlorosilane is also exemplified. Tris(methylamino)chlorosilane is also exemplified. Tris(ethylamino)chlorosilane is also exemplified. Bis(dimethylamino)ethylaminochlorosilane is also exemplified. Bis(dimethylamino)diethylaminochlorosilane is also exemplified. Bis(dimethylamino)methylaminochlorosilane is also exemplified. Bis(diethylamino)dimethylaminochlorosilane is also exemplified. Bis(diethylamino)ethylaminochlorosilane is also exemplified. Bis(diethlamino)methylaminochlorosilane is also exemplified. Bis(methylamino)dimethylaminochlorosilane is also exemplified. Bis(methylamino)diethylaminochlorosilane is also exemplified. Bis(methylamino)ethylaminochlorosilane is also exemplified. Bis(ethylamino)dimethylaminochlorosilane is also exemplified. Bis(ethylamino)diethylaminochlorosilane is also exemplified. Bis(ethylamino)methylaminochlorosilane is also exemplified. Ethylaminodiethylaminomethylaminochlorosilane is also exemplified. Ethylaminodiethylaminodimethylaminochlorosilane is also exemplified. Ethylaminodimethylaminochlorosilane is also exemplified. Diethylaminomethylaminodimethylaminochlorosilane is also exemplified.

As specific examples of the silicon compound including the part expressed by the chemical formula (16) are compounds as exemplified below. That is, tetrakis(dimethylamino)silane is exemplified. Tetrakis(diethylamino)silane is also exemplified. Tetrakis(methylamino)silane is also exemplified. Tetrakis(ethylamino)silane is also exemplified. Tris(dimethylamino)diethylaminosilane is also exemplified. Tris(dimethylamino)methylaminosilane is also exemplified. Tris(dimethylamino)ethylaminosilane is also exemplified. Tris(diethylamino)dimethylaminosilane is also exemplified. Tris(diethylamino)methylaminosilane is also exemplified. Tris(diethylamino)ethylaminosilane is also exemplified. Tris(methylamino)diethylaminosilane is also exemplified. Tris(methylamino)dimethylaminosilane is also exemplified. Tris(methylamino)ethylaminosilane is also exemplified. Tris(ethylamino)dimethylaminosilane is also exemplified. Tris(ethylamino)methylaminosilane is also exemplified. Tris(ethylamino)diethylaminosilane is also exemplified. Bis(dimethylamino)bis(diethylamino)silane is also exemplified. Bis(dimethylamino)bis(methylamino)silane is also exemplified. Bis(dimethylamino)bis(ethylamino)silane is also exemplified. Bis(diethylamino)bis(dimethylamino)silane is also exemplified. Bis(diethylamino)bis(methylamino)silane is also exemplified. Bis(diethylamino)bis(ethylamino)silane is also exemplified. Bis(methylamino)bis(diethylamino)silane is also exemplified. Bis(methylamino)bis(dimethylamino)silane is also exemplified. Bis(methylamino)bis(ethylamino)silane is also exemplified. Bis(ethylamino)bis(dimethylamino)silane is also exemplified. Bis(ethylamino)bis(methylamino)silane is also exemplified. Bis(ethylamino)bis(diethylamino)silane is also exemplified. Bis(dimethylamino)diethylaminomethylaminosilane is also exemplified. Bis(dimethylamino)ethylaminomethylaminosilane is also exemplified. Bis(dimethylamino)ethylaminodiethylaminosilane is also exemplified. Bis(diehtlamino)methylaminodimethylaminosilane is also exemplified. Bis(diethylamino)ethylaminomethylaminosilane is also exemplified. Bis(diethylamino)ethylaminodimethylaminosilane is also exemplified. Bis(methylamino)diethylaminodimethylaminosilane is also exemplified. Bis(methylamino)ethylaminodimethylaminosilane is also exemplified. Bis(methylamino)ethylaminodiethylaminosilane is also exemplified. Bis(ethylamino)methylaminodimethylaminosilane is also exemplified. Bis(ethylamino)methylaminodiethylaminosilane is also exemplified. Bis(ethylamino)diethylaminodimethylaminosilane is also exemplified. Ethylaminodiethylaminomethylaminodimethylaminosilane is also exemplified.

As specific examples of the silicon compound including the part expressed by the chemical formula (17) are compounds as exemplified below. That is, hexamethyldisilazane is exemplified. 1,1,3,3-tetramethyldisilazaneis also exemplified. 1,3-dimethyldisilazane is also exemplified. Disilazane is also exemplified.

In addition to the compounds described above, as specific examples of the silicon compound including in one molecule at least any one of the parts expressed by the chemical formulas (1) and (2) are as exemplified below. That is, acetoxyethylmethyldichlorosilane is exemplified. Acetoxypropylmethyldichlorosilane is also exemplified. (3-acryloxypropyl)methyldichlorosilane is also exemplified. (3-acryloxypropyl)trichlorosilane is also exemplified. Adamantylethyltrichlorosilane is also exemplified. Allyl(chloropropyl)dichlorosilane is also exemplified. Allyldichlorosilane is also exemplified. Allylmethyldichlorosilane is also exemplified. Allylphenyldichlorosilane is also exemplified. Allytrichlorosilane is also exemplified. Benziltrichlorosilane is also exemplified. {(bicyclohepthenyl)ethyl}trichlorosilane is also exemplified. 5-(bicyclohepthenyl)methyldichlorosilane is also exemplified. 5-(bicyclohepthenyl)trichlorosilane is also exemplified. 2-(bicycloheptyl)trichlorosilane is also exemplified. Bis(chloromethyl)dichlorosilane is also exemplified. Bis(cyanopropyl)dichlorosilane is also exemplified. Bis(dichlorosilyl)methane is also exemplified. Bis(methyldichlorosilyl)butane is also exemplified. Bis(methyldichlorosilyl)ethane is also exemplified. Bis(trichlorosilyl)ethane is also exemplified. Bis(trichlorosilyl)acetylene is also exemplified. Bis(trichlorosilyl)methane is also exemplified. Bis(trimethylsilyl)dichlorosilane is also exemplified. 2-bromoethyltrichlorosilane is also exemplified. Bromophenyltrichlorosilane is also exemplified. 3-bromopropyltrichlorosilane is also exemplified. Butenylmethyldichlorosilane is also exemplified. p-(t-butyl)phenethyltrichlorosilane is also exemplified. 2-(carbomethoxy)ethylmethyldichlorosilane is also exemplified. 2-(carbomethoxy)ethyltrichlorosilane is also exemplified. 2-chloroethylmethyldichlorosilane is also exemplified. 1-chloroethyltrichlorosilane is also exemplified. 2-chloroethyltrichlorosilane is also exemplified. Chloromethylmethyldichlorosilane is also exemplified. {(chloromethyl)phenylethyl}methyldichlorosilane is also exemplified. {(chloromethyl)phenylethyl}trichlorosilane is also exemplified. (P-chloromethyl)phenyltrichlorosilane is also exemplified. Chloromethyltrichlorosilane is also exemplified. Chlorophenylmethyldichlorosilane is also exemplified. Chlorophenyltrichlorosilane is also exemplified. 3-chloropropylmethyldichlorosilane is also exemplified. 3-chloropropyltrichlorosilane is also exemplified. 2-cyanoethylmethyldichlorosilane is also exemplified. 2-cyanoethyltrichlorosilane is also exemplified. (3-cyanoisobutyl)methyldichlorosilane is also exemplified. (3-cyanoisobutyl)trichlorosilane is also exemplified. 3-cyanopropylmethyldichlorosilane is also exemplified. 3-cyanopropylphenyldichlorosilane is also exemplified. 3-cyanopropyltrichlorosilane is also exemplified. {2-(3-cyclohexenyl)ethyl}methyldichlorosilane is also exemplified. {2-(3-cyclohexenyl)ethyl}trichlorosilane is also exemplified. 3-cyclohexenyltrichlorosilane is also exemplified. Cyclohexylmethyldichlorosilane is also exemplified. (Cyclohexylmethyl)trichlorosilane is also exemplified. Cyclohexyltrichlorosilane is also exemplified. (4-cyclooctenyl)trichlorosilane is also exemplified. Cyclooctyltrichlorosilane is also exemplified. Cyclopentyltrichlorosilane is also exemplified. Cyclotetramethylenedichlorosilane is also exemplified. Cyclotrimethylenedichlorosilane is also exemplified. N-decylmethyldichlorosilane is also exemplified. N-decyltrichlorosilane is also exemplified. (Dichloromethyl)methyldichlorosilane is also exemplified. Dichlorophenyltrichlorosilane is also exemplified. Dicyclohexyldichlorosilane is also exemplified. Dichloropentyldichlorosilane is also exemplified. Dietoxydichlorosilane is also exemplified. Di-n-hexyldichlorosilane is also exemplified. Dimethylbis(s-butylamino)silane is also exemplified. Di-n-octyldichlorosilane is also exemplified. Di(p-tolyl)dichlorosilane is also exemplified. Dodecylmethyldichlorosilane is also exemplified. N-heptylmethyldichlorosilane is also exemplified. N-heptyltrichlorosilane is also exemplified. Hexachlorodisilane is also exemplified. Hexachlorodisiloxane is also exemplified. 1,1,3,3,5,5-hexamethylcyclotrisilazane is also exemplified. 1,2,3,4,5,6-hexamethylcyclotrisilazane is also exemplified. 5-hexenyltrichlorosilane is also exemplified. Hexyldichlorosilane is also exemplified. Hexylmethyldichlorosilane is also exemplified. Hexyltrichlorosilane is also exemplified. Isooctyltrichlorosilane is also exemplified. Methacryloxypropylmethyldichlorosilane is also exemplified. Methacryloxypropyltrichlorosilane is also exemplified. 3-(p-methoxyphenyl)propylmethyldichlorosilane is also exemplified. 3-(p-methoxyphenyl)propyltrichlorosilane is also exemplified. (P-methylphenethyl)methyldichlorosilane is also exemplified. (2-methyl-2-phenylethyl)methyldichlorosilane is also exemplified. Octamethylcyclotetrasilazane is also exemplified. 1,2,3,4,5,6,7,8-octamethylcyclotetrasilazane is also exemplified. 7-octenyltrichlorosilane is also exemplified. N-octylmethyldichlorosilane is also exemplified. N-octyltrichlorosilane is also exemplified. Pentyltrichlorosilane is also exemplified. Phenethylmethyldichlorosilane is also exemplified. Phenethyltrichlorosilane is also exemplified. 3-phenoxypropyltrichlorosilane is also exemplified. 4-phenylbutylmethyldichlorosilane is also exemplified. 4-phenylbutyltrichlorosilane is also exemplified. (3-phenylpropyl)methyldichlorosilane is also exemplified. 1-propenylmethyldichlorosilane is also exemplified. 1,1,3,3-tetrachloro-1,3-disilabutane is also exemplified. 1,3,5,7-tetravinyl-1,3,5,7-tetramethylcyclotetrasilazane is also exemplified. T-hexyltrichlorosilane is also exemplified.

P-tolylmethyldichlorosilane is also exemplified. P-tolyltrichlorosilane is also exemplified. Trichloromethyltrichlorosilane is also exemplified. 2-{2-(trichlorosilyl)ethyl}pyridine is also exemplified. 4-{2-(trichlorosilyl)ethyl}pyridine is also exemplified. (3,3,3-trifluoropropyl)trichlorosilane is also exemplified. 1,3,5-trivinyl-1,3,5-trimethylcyclotrisilazane is also exemplified. 10-undecenyltrichlorosilane is also exemplified. Undecyltrichlorosilane is also exemplified. Vinyloctyldichlorosilane is also exemplified.

The silicon compound including the parts expressed by the chemical formulas (3) to (17) is not limited to the specific examples described above.

The silicon compound used in the damage recovering treatment preferably satisfies at least either of the condition that the average molecular weight is not more than 300 and the condition that a number of Si atoms contained in 1 molecule is not more than 5. The silicon compound satisfying such conditions can act on the insulating film 102 of the silicon compound by the use of the easy process which will be described below and without affecting the other processes. On the other hand, the silicon compound whose average molecular weight exceed 300 and whose Si atom number contained in 1 molecule exceeds 5, or the silicon compound whose average molecular weight exceed 300 or whose Si atom number contained in 1 molecule exceed 5 has a risk of making the vapor processing to be described below difficult. There will be a risk that such silicon compound would reside on the interconnection 110, etc. to affect other processes to be made later.

The silicon compound used in the damage recovering treatment preferably contains, in a group directly bonded to Si atom, a functional group, e.g., double bond (>C=C<), triple bond (—C≡C—), carbonyl group (>C=O), aldehyde group (—CH=O), etc., which are addition reactive. The double bond includes, e.g., vinyl group (CH$_2$=CH—), allyl group (CH$_2$=CH—CH$_2$—), etc. Here, the group directly bonded to the Si atom is R1-R6, R9, R10, R11, R14, R25, R30, R31, R34, R39, R40, R57-R59 and R61-R63 in the parts expressed by the chemical formulas (3) to (17). Such functional groups, which are addition reactive, form, after the damage recovering treatment, a bond with a precursor of an insulating film 112 to be described below, which will be formed on the insulating film 102 with the interconnection 110 buried in, by addition reaction.

For example, the carbon multiple bond easily cleaves by, e.g., exposure to plasma and easily make additional reaction with SiH$_4$, etc. used as the precursor of the insulating film 112. For example, in forming the insulating film 112 by plasma CVD method, the double bond of carbon reacts with the SiH$_4$ used as the precursor of the insulating film 112 as follows, and forms covalent bond.

>C=C<+2SiH$_4$→—HSi—CH—CH—SiH—

The covalent bond is thus formed, whereby the adhesion strength of the insulating film 102 to the insulating film 112 formed on the insulating film 102 can be improved. Resultantly, the TDDB characteristics can be further improved. The electromigration characteristics of the interconnection 110 buried in the insulating film 102 can be improved.

The silicon compound to be used in the damage recovering treatment may contain components other than the above-described silicon compound. For example, the silicon compound may further contain a solvent for lowering the viscosity.

The damage recovering treatment using the silicon compound is not especially limited as far as the silicon compound can be contacted to the surface of the insulating film 102 to react the Si—OH group of the surface of the insulating film 102 with the silicon compound. For example, the processing described below can be used.

That is, as the damage recovering treatment, the vapor processing for the surface of the insulating film 102 is exposed to the vapor of the silicon compound can be used. The vapor processing may lead the vapor of the silicon compound to the surface of the insulating film 102 to contact thereto. In the vapor processing, the vapor of the silicon compound may be moved by a carrier gas to be led to the surface of the insulating film 102 to contact thereto.

The vapor processing may be made under the atmospheric pressure and may be made under reduced pressures or in a vacuum as required. The vapor processing is made preferably in an atmosphere containing no oxygen, e.g., nitrogen atmosphere. This is to prevent the increase of the dielectric constant of the insulating film, because there is a risk that the presence of oxygen will increase the dielectric constant of the insulating film 102.

As the damage recovering treatment, the coating processing which applies the liquid silicon compound by, e.g., spin coating method to the surface of the insulating film 102.

The damage recovering treatment by such vapor processing, the coating processing, etc. is made preferably by heating the semiconductor substrate 10 with the members upto the interconnection 110 formed on at, e.g., 50° C.-250° C. By heating the semiconductor substrate 100, the reaction between the Si—OH group and the silicon compound can be accelerated. The water on the surface of the insulating film 102 and in the insulating film 102 is reduced to suppress the corrosion of the interconnection 110 buried in the insulating film 102. The lower limit of the heating temperature is set at, e.g., 50° C. because there is a risk that the heating temperature of less than this lower limit will make the reaction between the Si—OH group and the silicon compound insufficient. The upper limit of the heating temperature is set at, e.g., 250° C. because there is a risk that the heating temperature exceeding this upper limit will affect the other processes.

The damage recovering treatment may be made with, electromagnetic ray, e.g., infrared ray, ultraviolet ray, X-ray, α ray, γ ray, electron beam or others, being irradiated to the surface of the insulating film 102 while the semiconductor substrate 100 is being heated or not being heated. The irradiation of the electromagnetic waves can accelerate the reaction between the Si—OH group and the silicon compound. Such irradiation of electromagnetic wave may be made separately after the damage recovering treatment.

When the damage recovering treatment with the silicon compound described above is made, bond of Si—(CH$_3$)$_3$, etc. derived from the silicon compound used in the treatment is present on the surface of the insulating film 102. Accordingly, whether or not the damage recovering treatment is being made can be confirmed by detecting the bond peak of Si—(CH$_3$)$_3$ derived from the silicon compound used in the processing by X-ray photoelectron spectroscopy or others.

Thus, by the damage recovering treatment using the silicon compound, the damages of the insulating film 102 made in polishing off the conductive film 108 and the barrier metal 106 by CMP can be recovered.

After the damage recovering treatment, furthermore, the semiconductor substrate 100 with the members up to the interconnection 110 formed on may be heated for, e.g., 0.1 minutes-20 minutes at, e.g., 50° C.-250° C. The semiconductor substrate 100 is heated after the damage recovering treatment, whereby the reaction of the Si—OH group on the surface of the insulating film 102 with the silicon compound can be further accelerated. The lower limit of the heating temperature is set at, e.g., 50° C., and the lower limit of the heating period of time is set at, e.g., 0.1 minutes, because there is a risk that heating temperatures and heating periods of time of less than these lower limits will make insufficient the reaction between the Si—OH group and the silicon compound. The upper limit of the heating temperature is set at, e.g., 250° C. and the upper limit of the heating period of time is set at, e.g., 20 minutes, because there is a risk that there heating temperature and the heating period of time exceeding these upper limits will affect the other processes.

Also heating the semiconductor substrate 100 after the damage recovering treatment is made preferably in an atmosphere containing no oxygen, e.g., nitrogen atmosphere. This is to prevent the dielectric constant rise of the insulating film 102 because there is a risk that the presence of oxygen will raise the dielectric constant of the insulating film 102. When the damage recovering treatment is made in an atmosphere containing no oxygen, the semiconductor substrate 100 may be heated subsequently after the damage recovering treatment has been made.

Figure 2C:
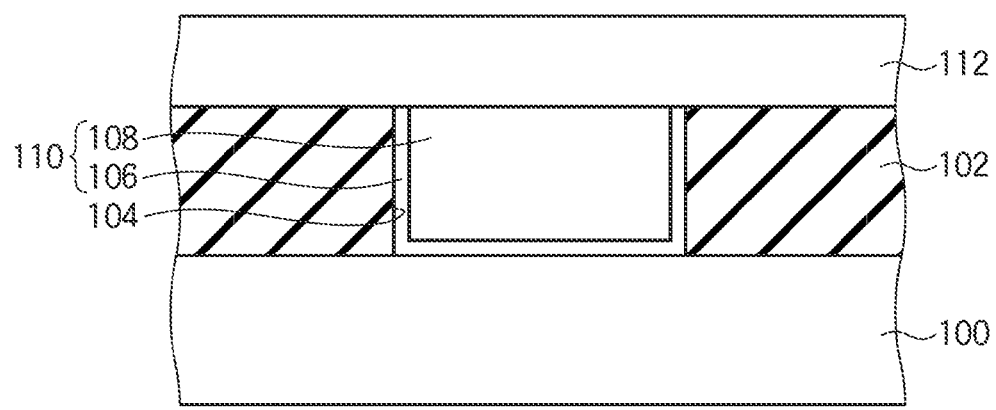

After the heating of the semiconductor substrate 100 has been made as required, an insulating film 112 is formed above the insulating film 102 and the interconnection 110 (FIG. 2C). The insulating film 112 functions as a barrier film for preventing the diffusion of Cu from the Cu interconnection. As the insulating film 112, silica-based insulating film, e.g., SiOC film, SiC film, SiN film, SiF film, etc. may be used, as is the insulating film 102. Other than these silica-based insulating films, various insulating films can be used. The method of forming the insulating film 112 can be selected suitably out of CVD method, coating method, etc. in accordance with the film species. The SiOC film may contain N, H, etc. therein. The SiC film may contain O, N, H, etc. therein. The SiN film may contain O, C, H, etc. therein. When the interconnection interval is not more than, e.g., 1 µm, for the reduction of the interconnection delay, the insulating film 112 preferably has low dielectric constant of, e.g., not more than 3.

As described above, in the damage recovering treatment, the silicon compound containing a functional group which is addition reactive to the bond directly bonded with the Si atom is used, whereby the adhesion strength between the insulating film 102 and the insulating film 112 can be improved. This can further improve the TDDB characteristics. The electromigration characteristics of the interconnection 110 can be improved.

As described above, according to the present embodiment, damage of the insulating film 102 made in the polish by CMP are recovered by the damage recovering treatment using the silicon compound, whereby the leakage current can be decreased while the TDDB characteristics can be improved. Thus, a semiconductor device of small power consumption and high reliability can be manufactured with high yields.

A Second Embodiment

A method of manufacturing a semiconductor device according to a second embodiment will be described with reference to FIGS. 3A to 14. FIGS. 3A-14 are sectional views illustrating the method of manufacturing the semiconductor device according to the present embodiment.

In the present embodiment, an example of the method of manufacturing semiconductor device according to the first embodiment is more specifically applied to will be described.

First, a device isolation film 12 defining a device region 14 is formed in a semiconductor substrate 10 of, e.g., a silicon substrate by, e.g., LOCOS (LOCal Oxidation of Silicon). The device isolation film 12 may be formed by STI (Shallow Trench Isolation) method.

Figure 3A:
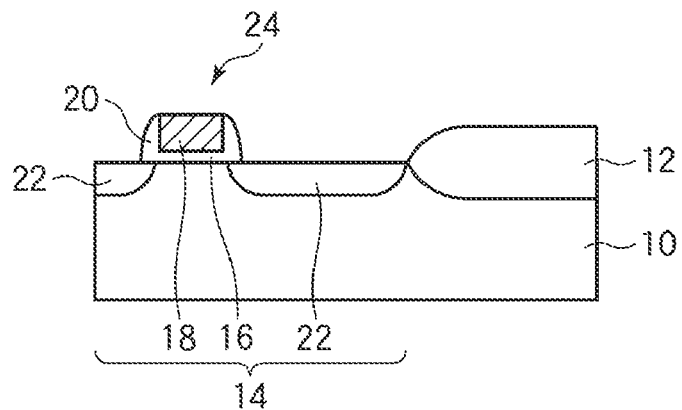
FIGS. 3A-3C, 4A-4C, 5A-5B, 6A-6B, 7A-7B and 8-14 are sectional views illustrating a method of manufacturing a semiconductor device according to a second embodiment.

Next, in the same way as in the ordinary MOS transistor manufacturing method, a MOS transistor 24 is formed on the semiconductor substrate 10 in the device region 14 (FIG. 3A). The MOS transistor 24 includes a gate electrode 18 formed above the semiconductor substrate 10 with a gate insulating film 16 formed therebetween, and source/drain regions 22 formed in the semiconductor substrate 10 on both sides of the gate electrode 18.

Next, above the semiconductor substrate 10 with the MOS transistor 24 formed on, a PSG (phosphorus glass) film, for example, is formed by, e.g., CVD method.

Next, the surface of the PSG film is polished and planarized by, e.g., CMP method to form an inter-layer insulating film 26 of the PSG film.

Then, above the inter-layer insulating film 26, an SiN film of, e.g., a 20 nm-thickness is deposited by, e.g., plasma CVD method to form an insulating film 28 of SiN film. The insulating film 28 functions as a polish stopper in the polish by CMP and as an etching stopper in forming an interconnection trench 46 in the inter-layer insulating film 38, etc. respectively in steps to be described below. The insulating film 28 can be, other than SiN film, SiC film or others.

Figure 3B:
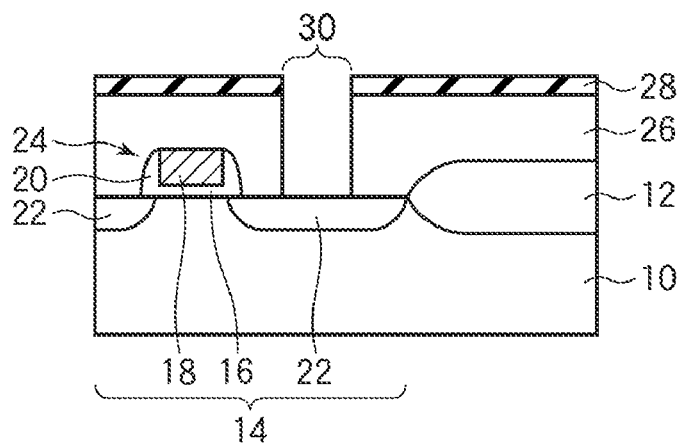

Next, by photolithography and dry etching, a contact hole 30 is formed in the stopper film 28 and the inter-layer insulating film 26 down to the source/drain regions 22 (FIG. 3B).

Next, above the entire surface, a titanium nitride (TiN) film of, e.g., a 10 nm-thickness is deposited by, e.g., sputtering method to form a barrier metal 32 of TiN film.

Figure 3C:
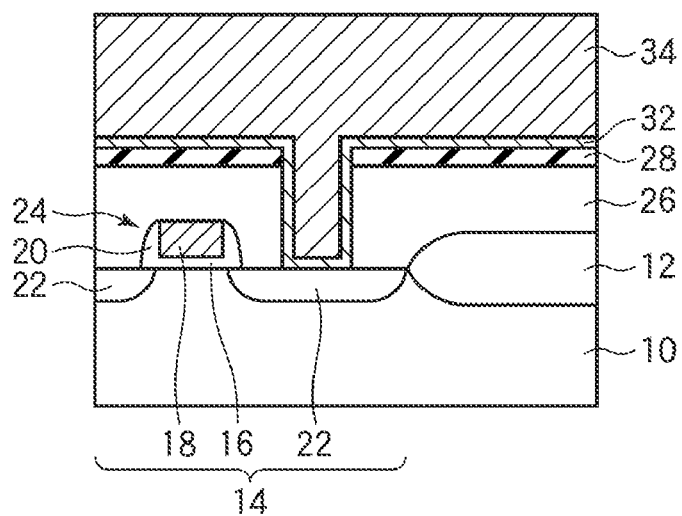

Next, above the barrier metal 32, a tungsten (W) film 34 of, e.g., a 1 µm-thickness is formed by, e.g., CVD method (FIG. 3C). The tungsten film 34 is formed, e.g., by reducing $WF_6$ with a mixed gas including tungsten hexafluoride ($WF_6$) gas and hydrogen gas.

Figure 4A:
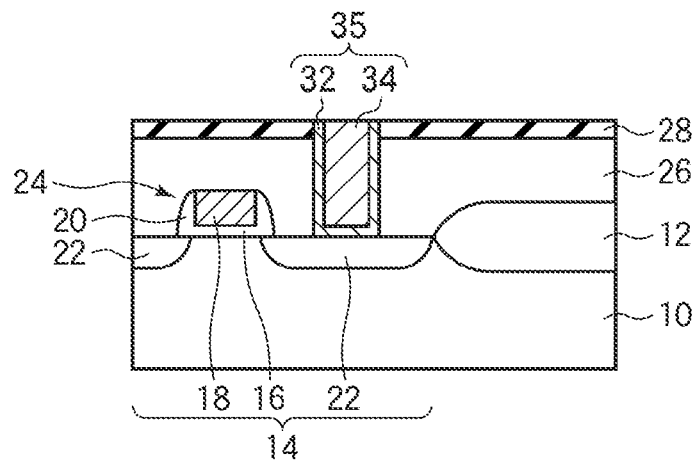

Then, by, e.g., CMP method, the tungsten film 34 and the barrier metal 32 are polished until the surface of the stopper film 28 is exposed to form a contact plug buried in the contact hole 30 and including the barrier metal 32 and the tungsten film 34 (FIG. 4A).

Figure 4B:
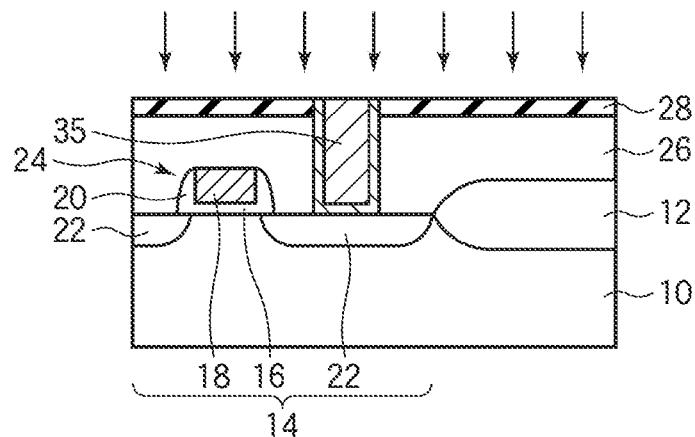

Next, the damage recovering treatment using the silicon compound described in the first embodiment is made, whereby the damage made in the stopper film 28 in polishing off the tungsten film 34 and the barrier metal by CMP are recovered (FIG. 4B). In this damage recovering treatment, the various silicon compounds used in the damage recovering treatment for the insulating film 102 and the processing method using them described in the first embodiment can be applied. As in the first embodiment, the heating of the substrate or the irradiation of the electromagnetic wave to the substrate may be made during or after the damage recovering treatment.

Next, above the stopper film 28 with the contact plug 35 buried in, an organic silica porous insulating film of, e.g., an 80 nm-thickness is deposited by, e.g., spin coating method to form a inter-layer insulating film 38 of organic silica porous insulating film, whose dielectric constant is low.

Figure 4C:
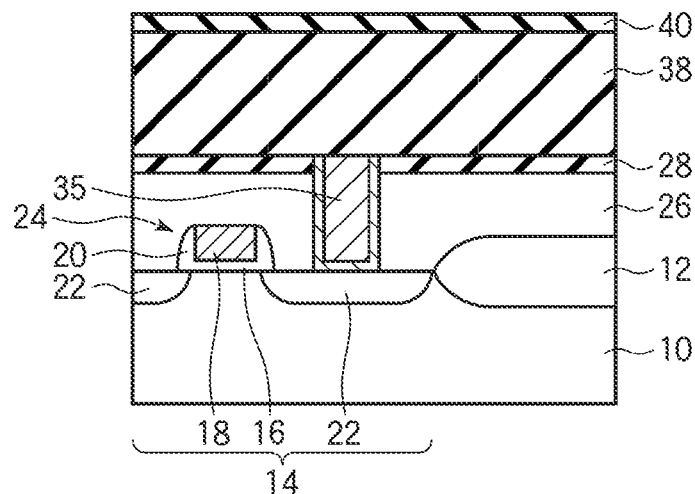

Next, above the inter-layer insulating film 38, a silicon oxide film of, e.g., a 20 nm-thickness is deposited by, e.g., plasma CVD method using TEOS to form an insulating film 40 of silicon oxide film (FIG. 4C). The insulating film 40 functions as a protection film for protecting the inter-layer insulating film 38.

Figure 5A:
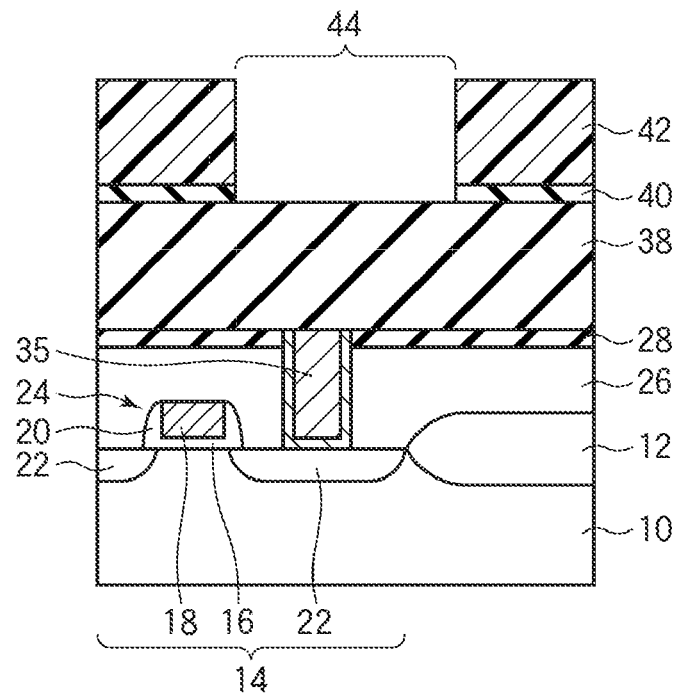

Then, by photolithography, a photoresist film 42 having an opening 44 exposing a region for the first level interconnection 51 to be formed in is formed above the insulating film 40 (FIG. 5A).

Figure 5B:
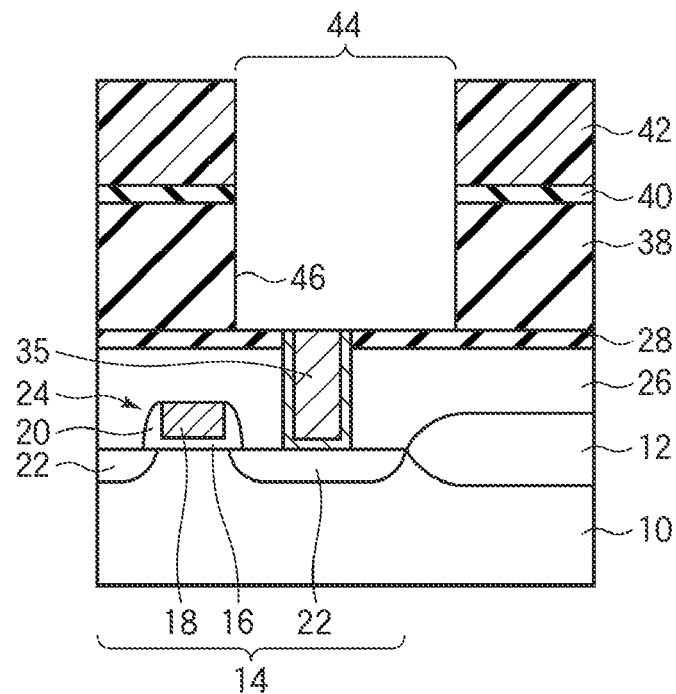

Then, by, e.g., dry etching using $CF_4$ gas and $CHF_3$ gas, the insulating film 40 and the inter-layer insulating film 38 are sequentially etched with the photoresist film 42 as the mask and the stopper film 28 as the stopper. Thus, the interconnection trench 46 for the interconnection 51 to be buried in is formed in the insulating film 40 and the inter-layer insulating film 38 (FIG. 5B).

Next, the photoresist film 42 is removed by, e.g., asking method.

Next, above the entire surface, a TiN film of, e.g., a 10 nm-thickness is deposited by, e.g., sputtering method to form a barrier metal 48 of TiN film. The barrier metal 48 is for preventing the diffusion of Cu from a Cu interconnection to be formed in a later step into the insulating film. The barrier metal 48 for preventing the diffusion of Cu into the insulating film is formed, whereby the leakage current can be decreased, and the reliability of the semiconductor device can be improved.

Then, above the barrier metal 48, a Cu film of, e.g., a 10 nm-thickness is deposited by, e.g., sputtering method to form a seed film of Cu film (not illustrated).

Figure 6A:
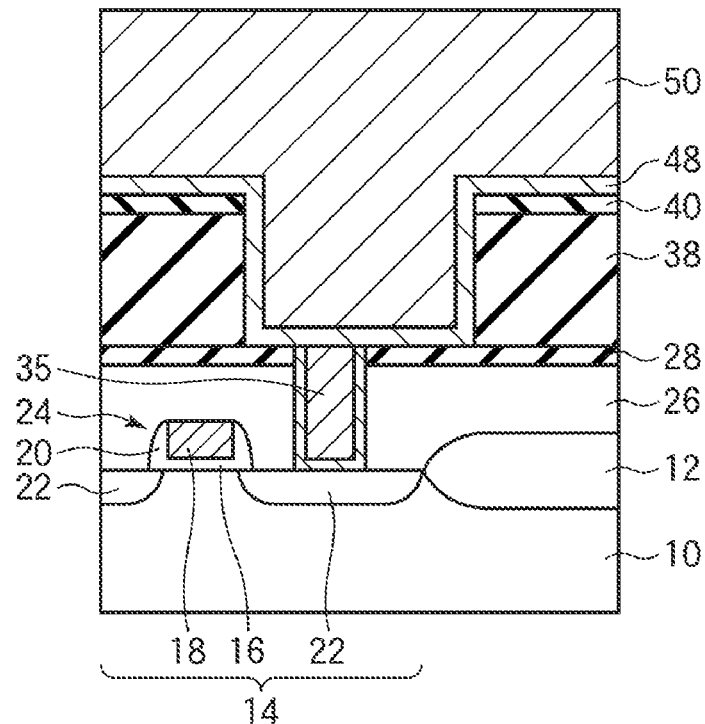

Next, a Cu film is deposited by, e.g., electroplating method with the seed film as the seed to form a Cu film 50 of a total film thickness including the film thickness of the seed layer of, e.g., 300 nm (FIG. 6A). In forming the Cu film 50 by electroplating method, by forming the seed film in advance, a copper film 50 of high quality can be formed. Thus, it is made possible to form an interconnection of high reliability.

Figure 6B:
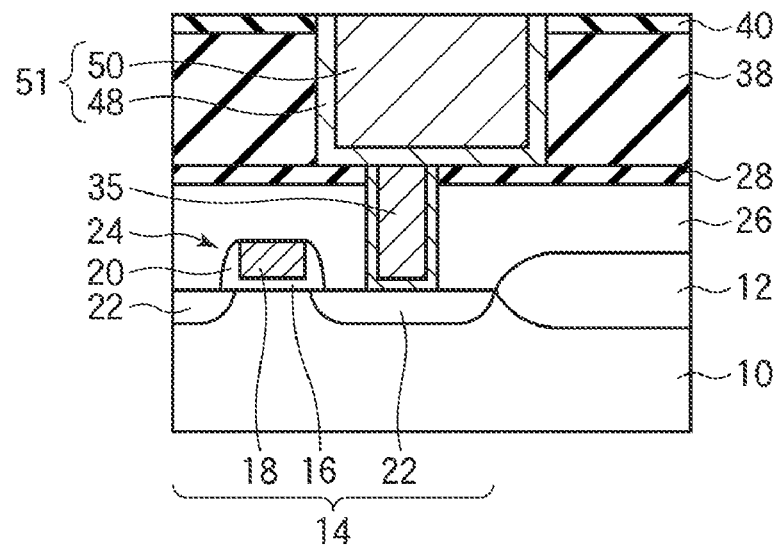

Then, the Cu film 50 and the barrier metal 48 above the insulating film 40 are polished off by CMP method. Thus, the interconnection 51 including the barrier metal 48 and the Cu film 50 buried in the interconnection trench 46 is formed (FIG. 6B). Such manufacturing process of the interconnection 52 is called single damascene method.

Figure 7A:
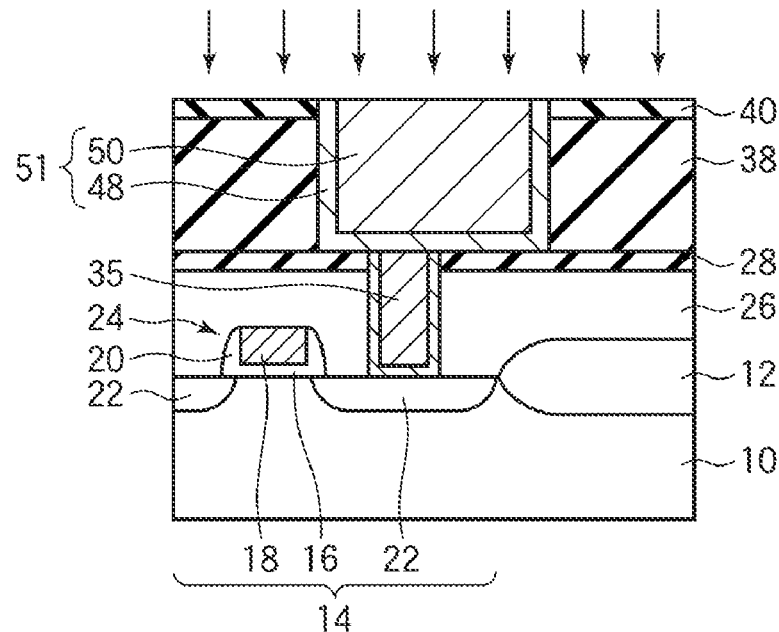

Next, the damage recovering treatment using the silicon compound described in the first embodiment is made. Thus, the damage made in the insulating film 40 in polishing off the Cu film 50 and the barrier metal 48 by CMP are recovered (FIG. 7A). To this damage recovering treatment, the various silicon compounds and the processing using the silicon compounds used in the damage recovering treatment for the insulating film 102 in the first embodiment can be applied. As described in the first embodiment, the heating of the substrate and the irradiation of the magnetic wave may be made during the damage recovering treatment or after the damage recovering treatment.

Figure 7B:
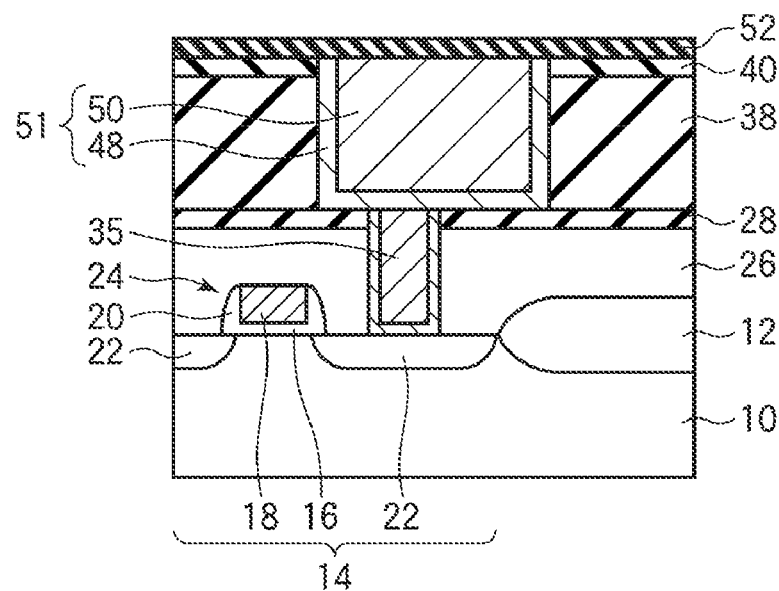

Then, above the entire surface, an SiN film of, e.g., a 20 nm-thickness is deposited by, e.g., plasma CVD method to form an insulating film 52 of the SiN film (FIG. 7B). The insulating film 62 functions as the barrier film for preventing the diffusion of Cu from the Cu interconnection.

Next, above the insulating film 52, an SiOC film of, e.g., a 100 nm-thickness is deposited by, e.g., plasma CVD method to form an inter-layer insulating film 54 of SiOC film.

Then, above the inter-layer insulating film 54, an SiN film of, e.g., a 20 nm-thickness is deposited by, e.g., plasma CVD using a raw material gas containing silane gas and ammonium gas to form an insulating film 56 of the SiN film. The insulating film 56 functions as the etching stopper for forming an interconnection trench 72 in the inter-layer insulating film 58, etc. The insulating film 56 can be, other than SiN film, SiC film or others.

Then, above the insulating film 56, an organic silica porous insulating film of, e.g., a 100 nm-thickness is deposited by, e.g., spin coating method to form an inter-layer insulating film 58 of the organic silica porous insulating film, whose dielectric constant is low.

Figure 8:
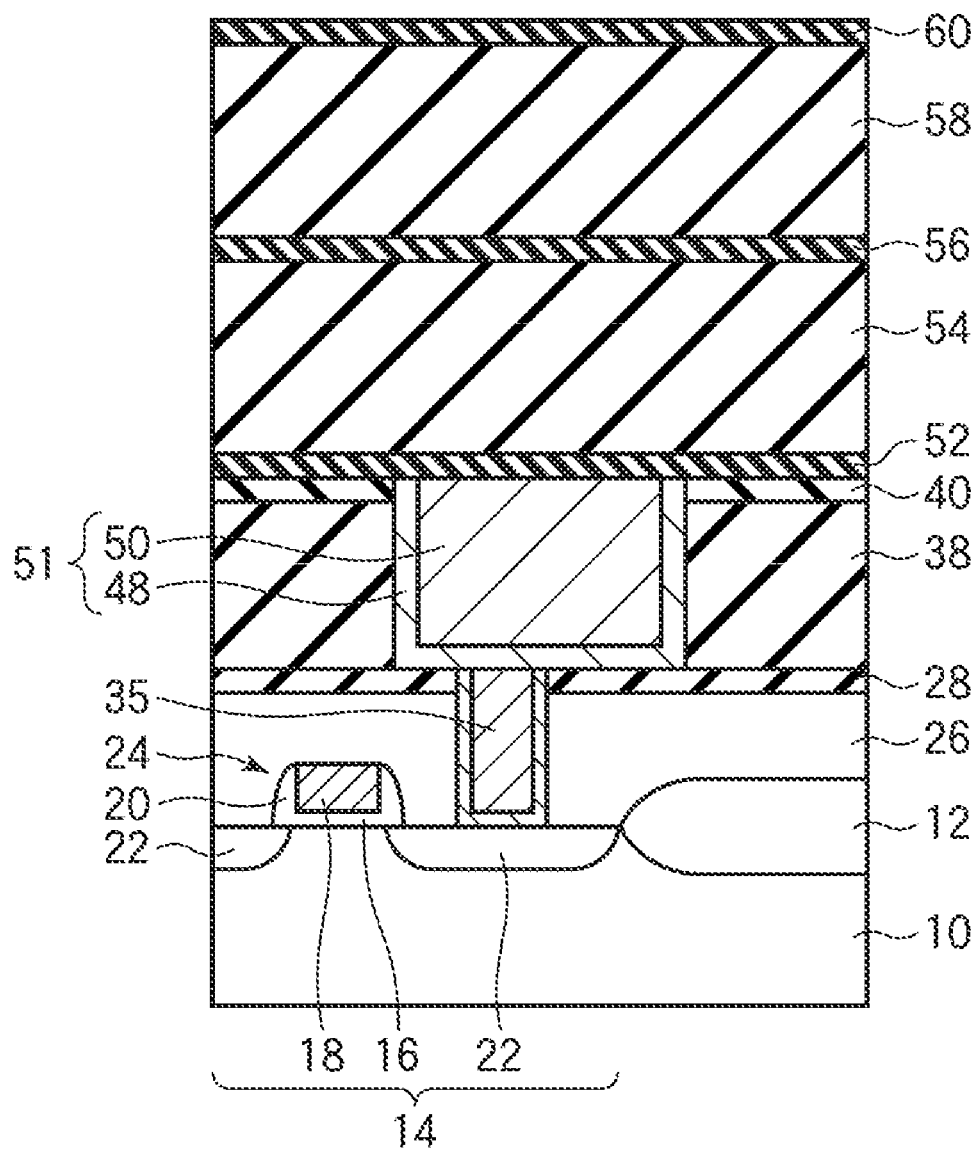

Next, above the inter-layer insulating film 58, a silicon oxide film of, e.g., a 20 nm-thickness is deposited by, e.g., plasma CVD using TEOS to form an insulating film 60 of the silicon oxide film (FIG. 8). The insulating film 60 functions as the protection film for protecting the inter-layer insulating film 58.

Next, by photolithography, a photoresist film 62 having an opening 64 exposing a region for a via-hole down to the interconnection 51 to be formed in is formed above the insulating film 60.

Figure 9:
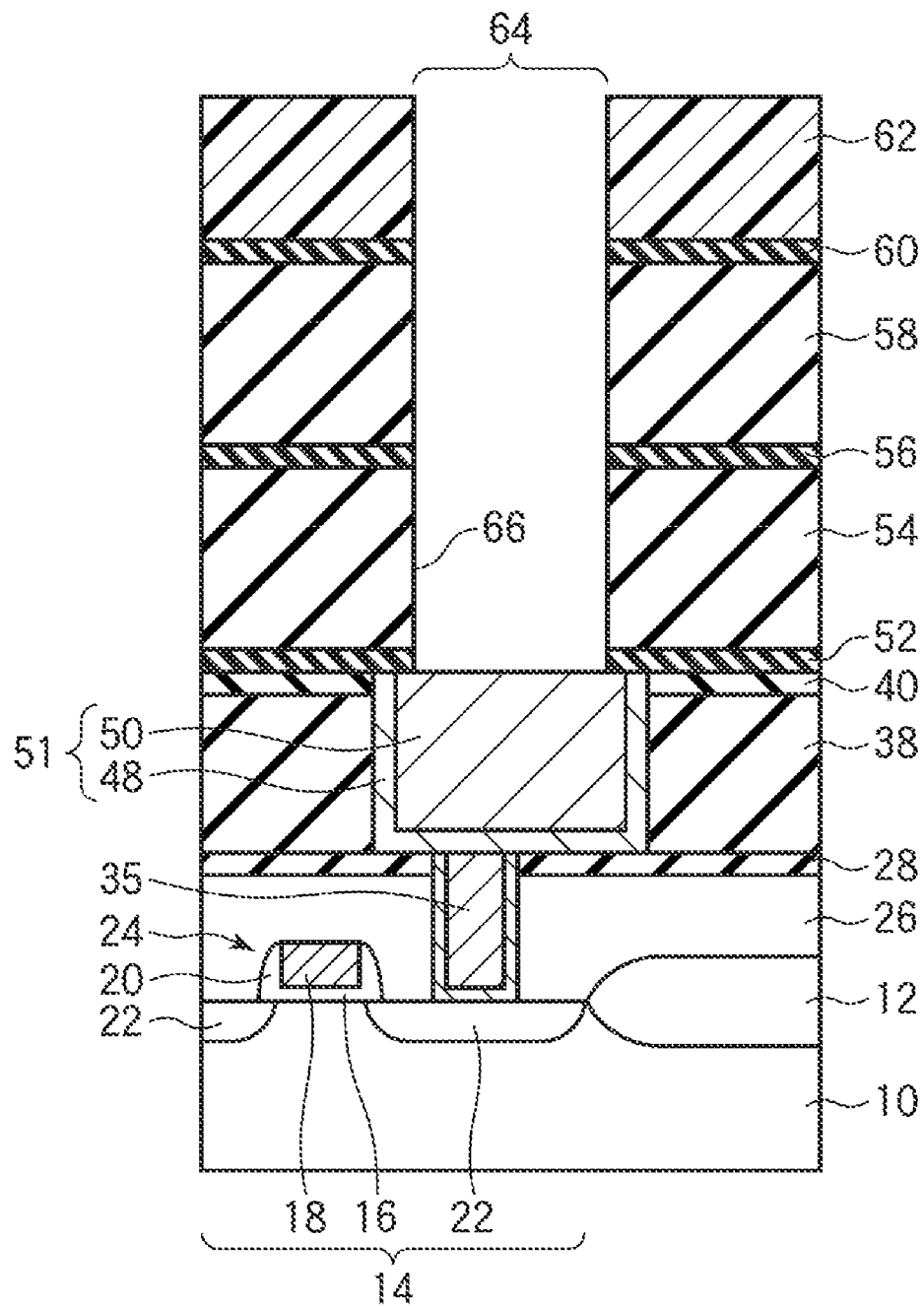

Next, by, e.g., dry etching using $CF_4$ gas and $CHF_3$ gas and with the photoresist film 62 as the mask, the insulating film 60, the inter-layer insulating film 58, the insulating film 56, the inter-layer insulating film 54 and the insulating film 52 are sequentially etched. Thus, a via-hole 66 down to the interconnection 51 is formed in the insulating film 60, the inter-layer insulating film 58, the insulating film 56, the inter-layer insulating film 54 and the insulating film 52 (FIG. 9). The respective insulating films can be sequentially etched by suitably varying the composition ratio of the etching gas, the pressure for the etching, etc.

Next, the photoresist film 62 is removed by, e.g., asking method.

Next, by photolithography, above the insulating film 60 with the via-hole 66 opened, a photoresist film 68 having an opening 70 exposing a region for the second level interconnection 77b to be formed in is formed.

Figure 10:
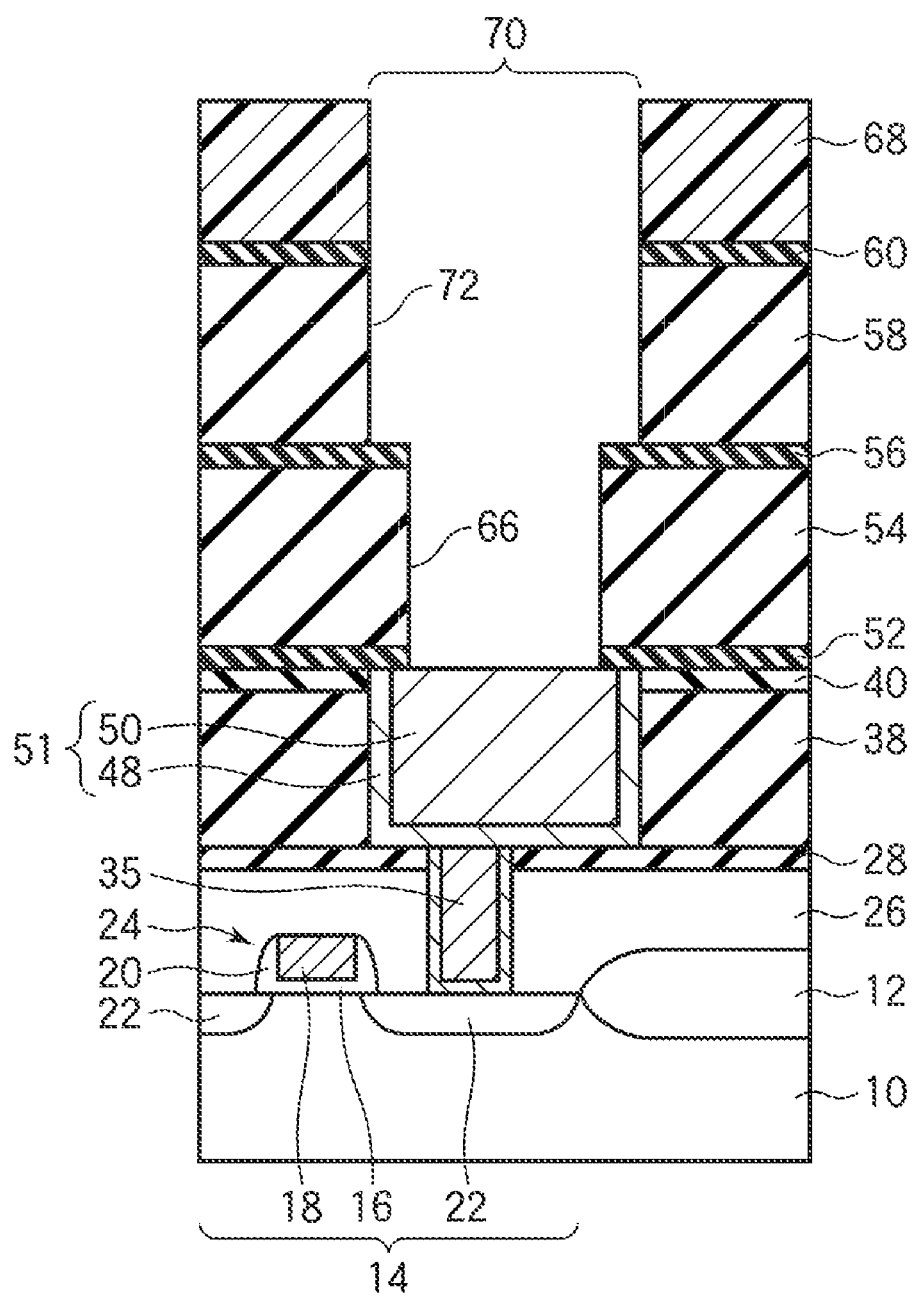

Next, by, e.g., dry etching using $CF_4$ gas and $CHF_3$ gas with the photoresist film 68 as the mask, the insulating film 60 and the inter-layer insulating film 58 are sequentially etched. Thus, in the insulating film 60 and the inter-layer insulating film 58, an interconnection trench 72 for the interconnection 77b to be buried in is formed (FIG. 10). The interconnection trench 72 is continuous with the via-hole 66.

Then, the photoresist film 68 is removed by, e.g., asking method.

Next, above the entire surface, a TiN film of, e.g., a 10 nm-thickness is deposited by, e.g., sputtering method to form a barrier metal 74 of the TiN film. The barrier film 74 is for preventing the diffusion of Cu into the insulating film from a Cu interconnection to be formed in a later step. Because of the barrier metal 74 for preventing the diffusion of Cu into the insulating film, the leakage current can be reduced, and the reliability of the semiconductor device can be improved.

Next, above the barrier metal 74, a Cu film of, e.g., a 10 nm-thickness is deposited by, e.g., sputtering method to form a seed film of the Cu film (not illustrated).

Figure 11:
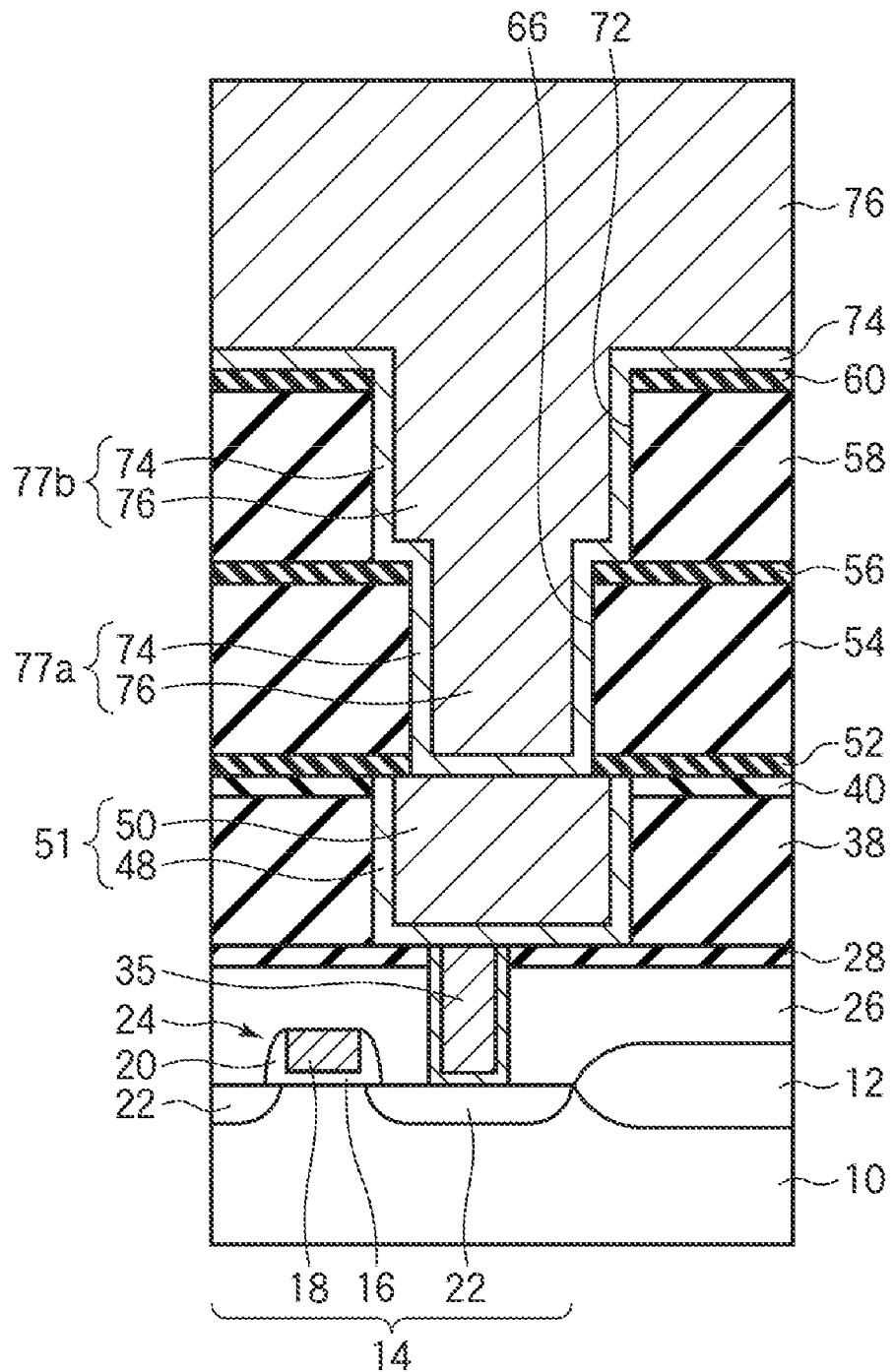

Then, by, e.g., electroplating with the seed film as the seed, a Cu film is deposited to form a Cu film 76 of, e.g., a total film thickness of 600 nm including the film thickness of the seed layer (FIG. 11). In forming the Cu film 76 by electroplating, the seed film is formed in advance, whereby the copper film 76 of high quality can be formed. Thus, the interconnection of high reliability can be formed.

Figure 12:
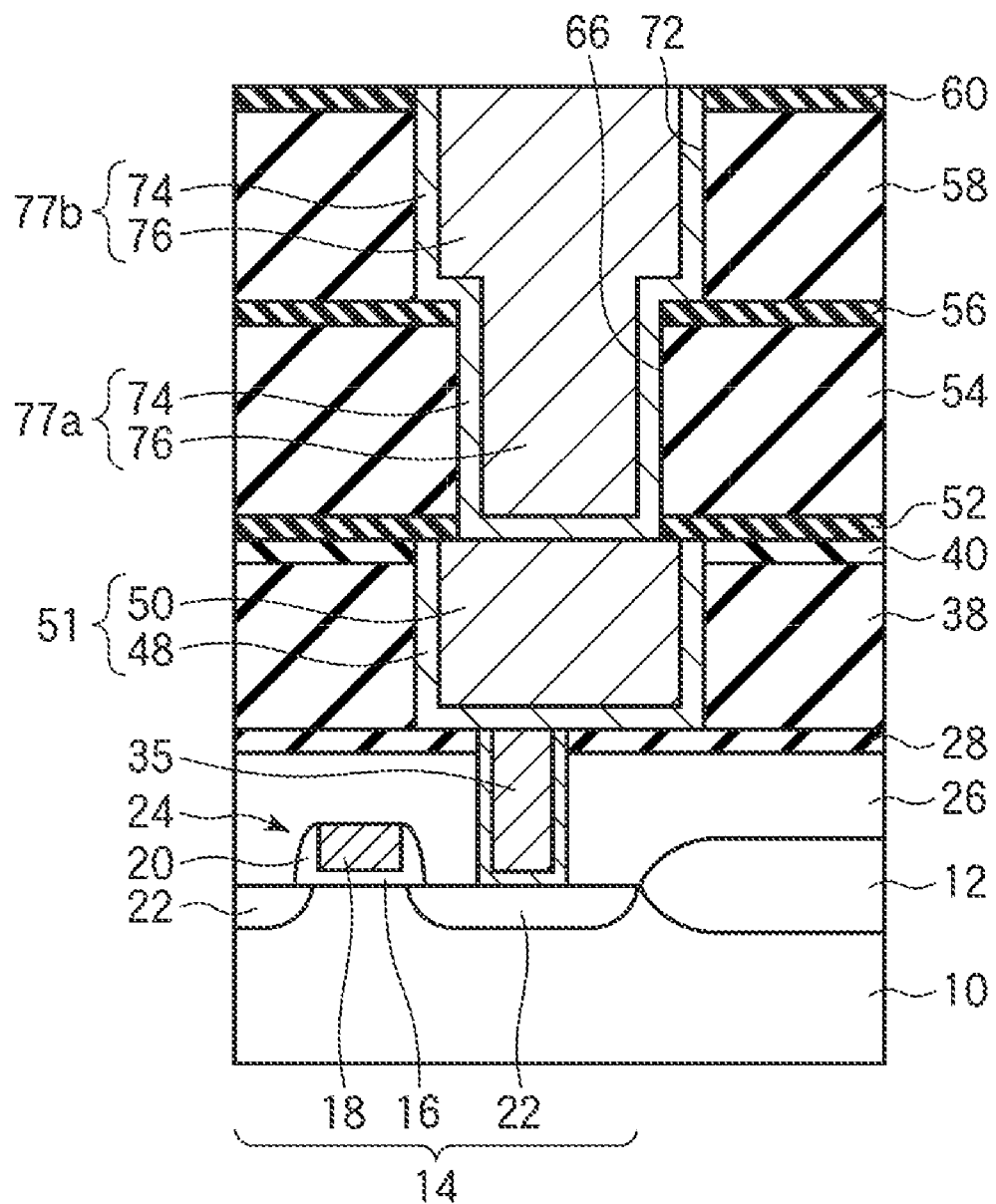

Then, by CMP method, the Cu film 76 and the barrier metal 74 above the insulating film 60 are polished off. Thus, the contact plug 77a including the barrier metal 74 and the Cu film 76 buried in the via-hole 66 and the interconnection 77b including the barrier metal 74 and the Cu film 76 buried in the interconnection trench 72 are formed integral and at once (FIG. 12). The manufacturing process of thus forming integral the contact plug 77*a* and the interconnection 77*b* is called dual damascene method.

Figure 13:
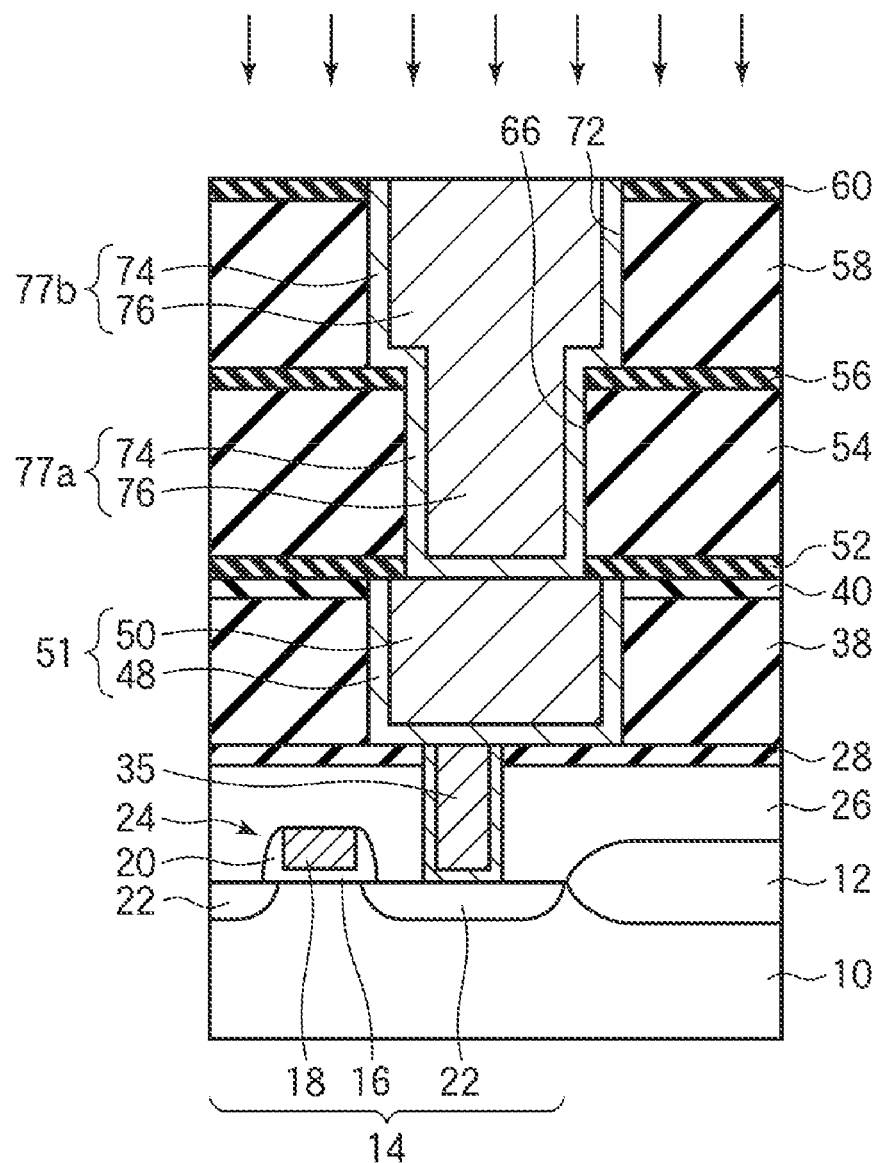

Then, the damage recovering treatment using the silicon compound described in the first embodiment is made. Thus, the damage made in the insulating film 60 in polishing off the Cu film 76 and the barrier metal 74 by CMP are recovered (FIG. 13). To this damage recovering treatment, the various silicon compounds and the damage recovering treatment using them used in the damage recovering treatment of the insulating film 102 described in the first embodiment can be applied. As described in the first embodiment, the heating of the substrate and the irradiation of the electromagnetic wave may be made during the damage recovering treatment or after the damage recovering treatment.

Figure 14:
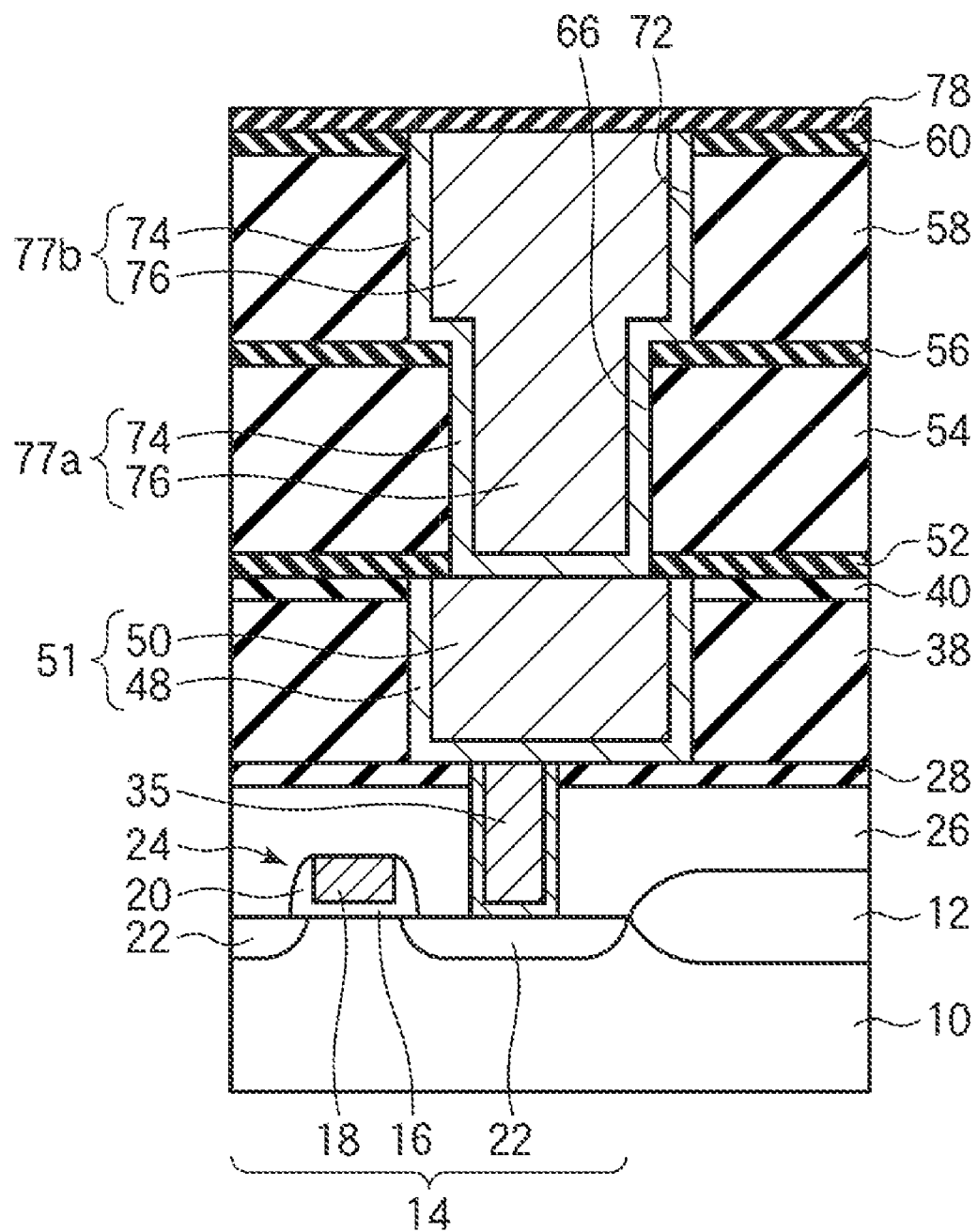

Next, above the entire surface, an SiN film of, e.g., a 20 nm-thickness is deposited by, e.g., plasma CVD method (FIG. 14). The insulating film 78 functions as the barrier film for preventing the diffusion of Cu from the Cu interconnection.

Hereafter, the same steps as described above are repeated suitably as required to form the third level interconnection, etc. not illustrated, and the semiconductor device according to the present embodiment is completed.

As described above, according to the present embodiment, the damage recovering treatment using the silicon compound is made to recover damages of the insulating films 28, 40, 60 made by CMP, whereby the leakage current can be reduced, and the TDDB characteristics can be improved. Thus, the semiconductor device of small power consumption and high reliability can be manufactured with high yields.

Modified Embodiments

The above-described embodiments can cover other various modifications. The embodiments are applicable widely to methods of manufacturing semiconductor devices including insulating films and conductive films buried therein. The structures, the film thicknesses of the respective layers, the constituent materials of the respective layers, the manufacturing conditions, etc. described in the above-described embodiments are one example and can be changed or modified suitably in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

EXAMPLES

Figure 15A:
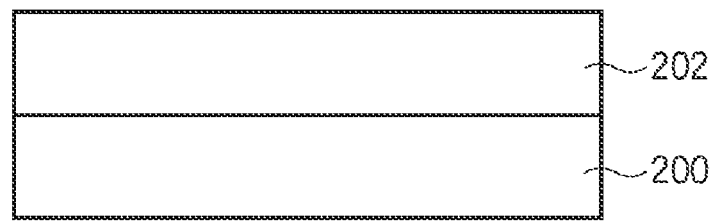
FIGS. 15A-15C are sectional views illustrating a method of preparing an evaluation sample.
Figure 15B:
Figure 15C:
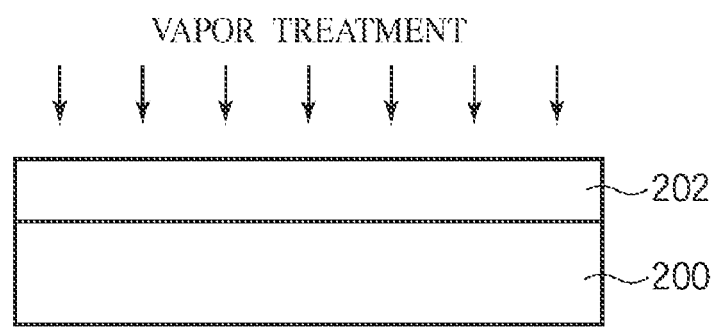

To verify the effect of the damage recovering treatment using the above-described silicon compounds, 7 kinds of evaluation samples described below were prepared and their characteristics were evaluated. FIGS. 15A-15C are sectional views illustrating the method of preparing the evaluation samples.

Example 1-1

Above a low resistance substrate (low resistance silicon wafer) 200, a liquid insulating film forming composition containing the silicon compound for forming a low dielectric constant insulating film of a 2.6 relative dielectric constant was coated in a 250 nm-thickness by spin coating method.

Then, the insulating film forming composition coated on the low resistance substrate 200 is prebaked under the conditions of 250° C. and 3 minutes.

Next, the prebaked insulating film forming composition is cured in an electric furnace of nitrogen ambient atmosphere under the conditions of 400° C. and 30 minutes, and a low dielectric constant insulating film 202 was formed (FIG. 15A).

Next, thus formed low dielectric constant insulating film 202 was polished by CMP (FIG. 15B). The low dielectric constant insulating film 202 was polished with IC1010 from Rodel Nitta Company as the polishing pad with the pressure (load) of the polishing head set at 280 weight/cm$^2$, the rotation number of the polishing head at 50 rotations/minute, the rotation number of the polishing table set at 60 rotations/minute, and the polishing period of time at 20 seconds. As the slurry, SS25 from Cabot Microelectronics Corporation diluted by 1:1 was used, and the flow rate of the slurry was set at 0.2 L/minute. By such polishing by CMP method, the low dielectric constant insulating film 202 has the film thickness reduced and the surface damaged.

Next, in nitrogen ambient atmosphere, with the low resistance substrate 200 with the low dielectric constant insulating film 202 formed on heated at 150° C., vapor processing with dimethylaminotrimethylsilane as the silicon compound was made on the surface of the low dielectric constant insulating film 202 for 1 minute (FIG. 15C).

Thus, the evaluation sample was prepared.

Example 1-2

The evaluation sample was prepared in the same way as Example 1-1 except that the vapor processing was made with chlorotrimethylsilane as the silicon compound in the step illustrated in FIG. 15C.

Example 1-3

The evaluation sample was prepared in the same way as Example 1-1 except that the vapor processing was made with 1,3-divinyltetramethyldisilazane as the silicon compound in the step illustrated in FIG. 15C.

[Control 1-1]

The evaluation sample was prepared in the same way as Example 1-1 except that the vapor processing illustrated in FIG. 15C is not made.

[Control 1-2]

The evaluation sample was prepared in the same way as Example 1-1 except that the vapor processing was made with trimethylethoxysilane as the silicon compound in the step illustrated in FIG. 15C.

[Control 1-3]

The evaluation sample was prepared in the same way as example 1-1 except that the vapor processing was made with 1,3-dichlorotetraphenyldisiloxane as the silicon compound in the step illustrated in FIG. 15C.

[Reference 1]

The evaluation sample was prepared in the same way as Example 1-1 except that the polish by CMP method illustrated in FIG. 15B and the vapor processing illustrated in FIG. 15C were not made.

First, the electric field-current characteristics were measured on the respective evaluation samples thus prepared.

Figure 16:
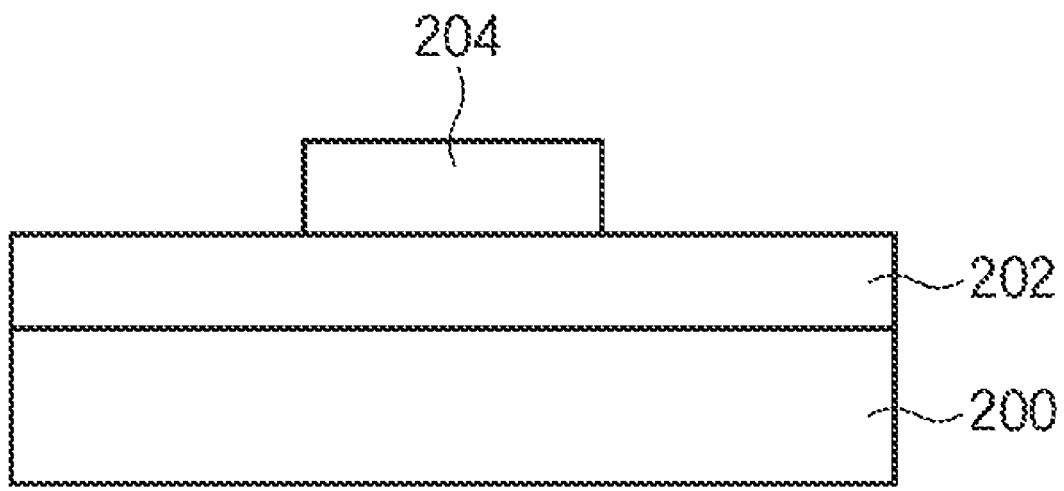
FIG. 16 is a sectional view illustrating an evaluation sample having an electrode formed on a low dielectric constant insulating film.

For the measurement of the electric field-current characteristics, in each evaluation sample, as illustrated in FIG. 16, an electrode 204 of an 100 nm-thickness Au film was formed on the low dielectric constant insulating film 202 by using a metal mask.

On each evaluation sample with the electrode 204 thus formed, the current density given when an electric field of 0.1 MV/cm was applied between the electrode 204 and the low resistance substrate 200 was measured. For the measurement of the current density, a precision semiconductor parameter analyzer (4156C from Agilent Technologies, Inc.) was used.

On each evaluation sample, the contact angle to water was measured. For the measurement of the contact angle, a contact angle meter (DM700 from Kyowa Interface Science Co., Ltd.) was used.

On each evaluation sample, a tensile test by Sebastian method was made to evaluate the adhesion of the insulating film to be formed on the low dielectric constant insulating film 202.

Figure 17:
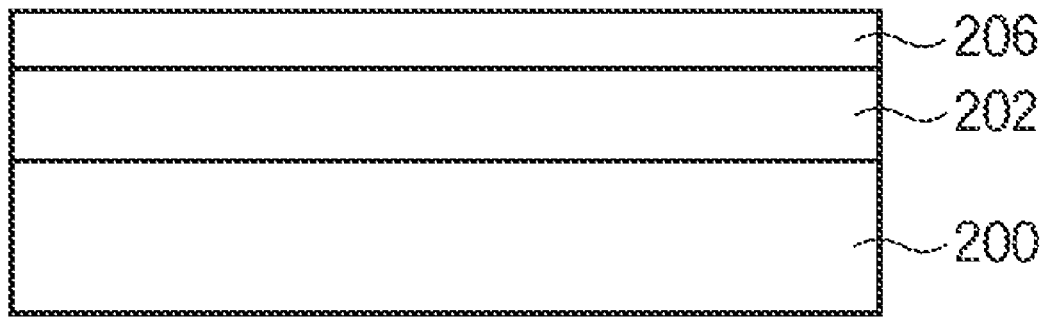
FIG. 17 is a sectional view illustrating an evaluation sample having an SiC film formed on a low dielectric constant insulating film.

For the tensile test, in each evaluation sample, an SiC film 206 of dielectric constant of 4.5 was formed above the low dielectric constant insulating film 202 by plasma CVD method as illustrated in FIG. 17.

On each evaluation sample with the SiC film 206 thus formed, the tensile test by Sebatial method was conducted 20 times, and times of the occurrence of peel in the interface between the low dielectric constant insulating film 202 and the SiC film 206 (a peel number) was counted.

The measured results of the electric field-current characteristics, the measured result of the contact angle, and the measured result of the tensile test described above are summarized in Table 1 with the silicon compounds used in the vapor processing and their molecular weights.

TABLE 1

| | Silicon Compound | Molecular Weight |
|---|---|---|
| Control 1-1 | No vapor processing | — |
| Example 1-1 | dimethylaminotrimethylsilane | 117.26 |
| Example 1-2 | Chlorotrimethylsilane | 108.64 |
| Example 1-3 | 1,3-divinyltetramethyldisilazane | 185.41 |
| Control 1-2 | Trimethyletoxysilane | 118.25 |
| Control 1-3 | 1,3-chlorotetraphenyldisiloxane | 451.50 |
| Reference 1 | NoCMP/No Vapor Processing | — |

| | Current Density ($A/cm^2$) | Contact Angle (degree) | Peel Number |
|---|---|---|---|
| Control 1-1 | $5 \times 10^{-8}$ | 34 | 8 |
| Example 1-1 | $1 \times 10^{-11}$ | 85 | 9 |
| Example 1-2 | $1 \times 10^{-11}$ | 87 | 8 |
| Example 1-3 | $1 \times 10^{-11}$ | 92 | 0 |
| Control 1-2 | $2 \times 10^{-9}$ | 48 | 13 |
| Control 1-3 | $8 \times 10^{-10}$ | 51 | 17 |
| Reference 1 | $1 \times 10^{-11}$ | 98 | 10 |

As apparent from the measured result of the electric field-current characteristics shown in Table 1, it is seen that Examples 1-1 to 1-3 have smaller current density than Controls 1-1 to 1-3. The current density of Examples 1-1 to 1-3 has the current density decreased to substantially the same level as Reference 1, which was not polished by CMP.

As apparent from the measured result of the contact angle shown in Table 1, it is seen that Examples 1-1 to 1-3 have larger contact angles to water than Controls 1-1 to 1-3. Thus, Examples 1-1 to 1-3 have the surface of the low dielectric constant insulating film 202 sufficiently made hydrophobic.

As apparent from the measured result of the tensile test shown in Table 1, is seen that Examples 1-1 and 1-2 have better adhesion between the low dielectric constant insulating film 202 and the SiC film 206 than Controls 1-2 and 1-3. Examples 1-1 and 1-2 have adhesion of substantially the same level as Control 1-1. Example 1-3, on which the vapor processing using the silicon compound including vinyl base was made, is free from peels in the interface between the low dielectric constant insulating film 202 and the SiC film 206 and has very good adhesion between the low dielectric constant insulating film 202 and the SiC film 206.

The nitrogen concentrations in the insulating film of the respective samples of Examples 1-1 to 1-3, Controls 1-1 to 1-3 and Reference 1 were not more than 500 wt ppm, respectively. The chlorine concentrations in the insulating film of the respective samples of Examples 1-1 to 1-3, Controls 1-1 to 1-3 and Reference 1 were also not more than 500 wt ppm, respectively.

On the respective evaluation samples, temperature-programmed desorption spectra were measured. The temperature-programmed desorption spectra were measured on 1 cm-square sample pieces cut from the respective evaluation samples by a temperature-programmed desorption analyzer (EMD1000 from ESCO Ltd.) in the measurement temperature range from room temperature to 600° C. raised by the temperature increasing rate of 1° C./second.

Figure 18:
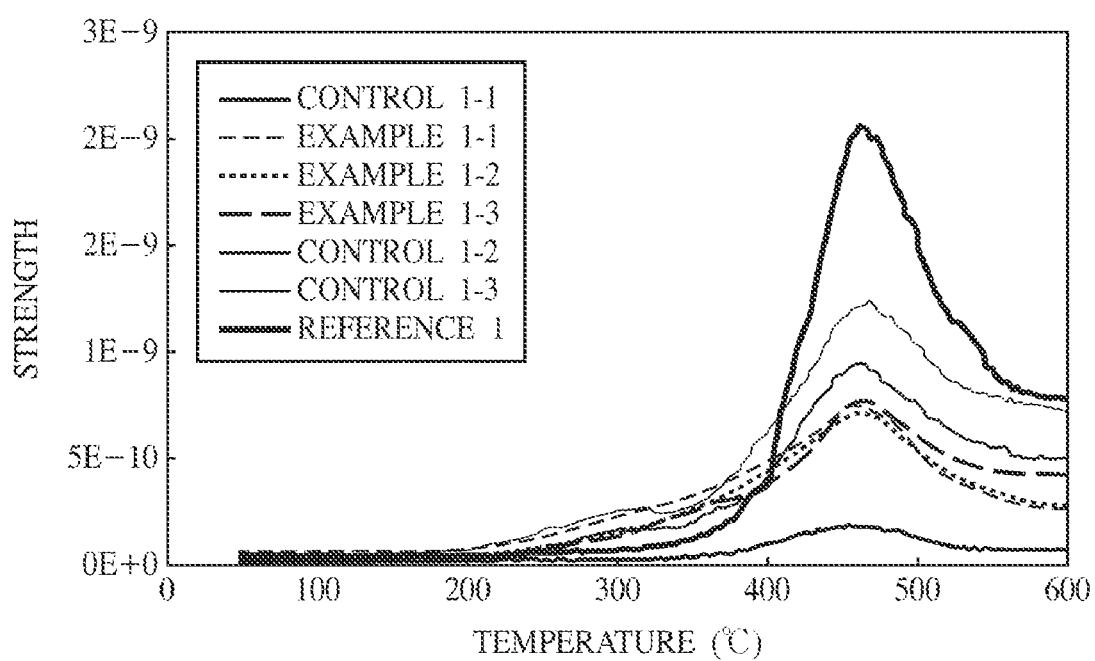
FIG. 18 is a graph illustrating temperature-programmed desorption spectra of the evaluation samples.

The temperature-programmed desorption spectra measured on the respective evaluation samples are shown in FIG. 18. In the graph shown in FIG. 18, the temperature is taken on the horizontal axis, and on the vertical axis, the strength of $H_2O$ is taken.

In the graph, in Control 1-1, the vapor processing with the silicon compound was not made. In Example 1-1, the vapor processing with dimethylaminotrimethylsilane was made. In Example 1-2, the vapor processing with chlorotrimethylsilane was made. Example 1-3, the vapor processing with 1,3-divinyltetramethyldisilazane was made. In Control 1-2, the vapor processing with trimethylethoxysilane was made. In Control 1-3, the vapor processing with 1,3-chlorotetraphenyldisiloxane was made. In Reference 1, the CMP processing and the vapor processing with the silicon compound were not made.

As apparent from the comparison among the respective spectra shown in FIG. 18, Examples 1-1 to 1-3 have water therein more decreased in comparison with Controls 1-1 to 1-3.

Next, a three level interconnection of a comb pattern was formed by the method of manufacturing the semiconductor device according to the second embodiment described above, and the TDDB characteristics were measured. The evaluation samples used in measuring the TDDB characteristics are as follows.

Example 2-1

By the method of manufacturing the semiconductor device according to the second embodiment described above, the interconnection up to the third level was formed. The damage recovering treatment made after the polish by CMP method was made by the vapor processing with dimethylaminotrimethylsilane as the silicon compound, as in Example 1-1.

Example 2-2

The interconnection up to the third level was formed by the same process as in Example 2-1 except that as the damage recovering treatment made after the polish by CMP method, the vapor processing with chlorotrimethylsilane as the silicon compound was made as in Example 1-2.

Example 2-3

The interconnection up to the third level was formed by the same process as in Example 2-1 except that as the damage recovering treatment made after the polish by CMP method, the vapor processing with 1,3-divinyltetramethyldisilane as the silicon compound was made as in Example 1-3.

[Control 2-1]

The interconnection up to the third level was formed by the same process as in Example 2-1 except that the damage recovering treatment made after the polish by CMP method was not made.

[Control 2-2]

The interconnection up to the third level was formed by the same process as in Example 2-1 except that as the damage recovering treatment made after the polish by CMP method, the vapor processing with trimethylethoxysilane as the silicon compound was made as in Control 1-2.

[Control 2-3]

The interconnection up to the third level was formed by the same process as in Example 2-1 except that as the damage recovering treatment made after the polish by CMP method, the vapor processing with 1,3-dichlorotetraphenyldisiloxane as the silicon compound was made as in Control 1-3.

The TDDB characteristics were evaluated on the respective evaluation samples thus prepared. The evaluation of the TDDB characteristics were measured by measuring periods of time up to the start of the insulation breakdown at 125° C. and with 3.3 MV/cm voltage being applied.

The periods of time up to the insulation breakdown measured on the respective evaluation samples are summarized in Table 2.

TABLE 2

| | Silicon Compound | Time up to insulation breakdown (s) |
|---|---|---|
| Control 2-1 | No vapor processing | 105 |
| Example 2-1 | Dimethylaminotrimethylsilane | 1078 |
| Example 2-2 | Chlorotrimethylsilane | 964 |
| Example 2-3 | 1,3-divinyltetramethyldisilazane | 1153 |
| Control 2-2 | Trimethyletoxysilane | 198 |
| Control 2-3 | 1,3-chlorotetraphenyldisiloxane | 307 |

As apparent from Table 2, it is seen that Examples 2-1 to 2-3 have better TDDB characteristics than Controls 2-1 to 2-3.

What is claimed is:

1. A method of manufacturing a semiconductor device comprising:
    forming an insulating film above a semiconductor substrate;
    forming an opening in the insulating film;
    forming a conductive film above the insulating film with the opening formed;
    removing the conductive film above the insulating film by CMP to bury the conductive film in the opening;
    making a processing of exposing a silicon compound including Si—N or Si—Cl to a surface of the insulating film or applying the silicon compound to the surface of the insulating film; and
    forming another insulating film above the insulating film and the conductive film buried in the opening after processing the surface of the insulating film with the silicon compound.

2. The method of manufacturing a semiconductor device according to claim 1, wherein
    in processing the surface of the insulating film with the silicon compound, the surface of the insulating film is processed with the silicon compound while the semiconductor substrate is being heated to 50° C.-250° C.

3. The method of manufacturing a semiconductor device according to claim 1, further comprising:
    heating the semiconductor substrate to 50° C.-250° C. after processing the surface of the insulating film with the silicon compound.

4. The method of manufacturing a semiconductor device according to claim 1, wherein
    in processing the surface of the insulating film with the silicon compound, the surface of the insulating film is exposed to a vapor including the silicon compound.

5. The method of manufacturing a semiconductor device according to claim 1, wherein
    in processing the surface of the insulating film with the silicon compound, the silicon compound of liquid state is applied to the surface of the insulating film.

6. The method of manufacturing a semiconductor device according to claim 1, wherein
    the silicon compound includes a part expressed by

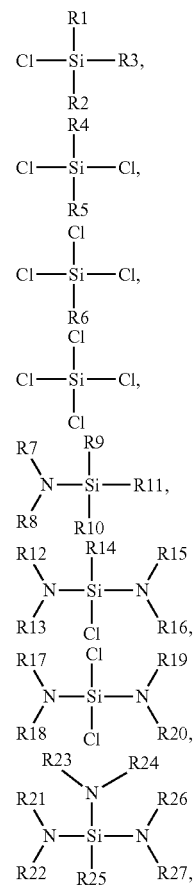

-continued

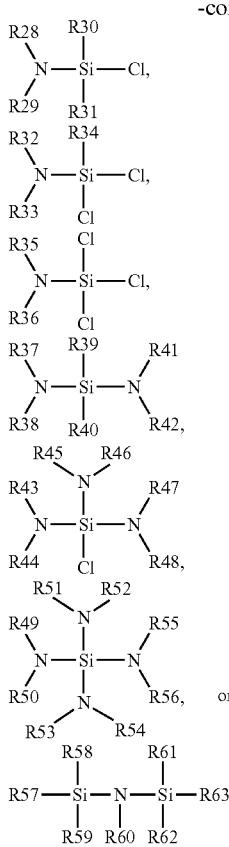

(wherein R1-R63 represent groups selected independently in the respective formulas or independently of the respective formulas out of a group consisting of hydrogen, alkyl group with a carbon number of 1-20, alkenyl group with a carbon number of 2-20, alkynyl group, alkylcarbonyl group, alkenylalkyl group, alkynylalkyl group and aryl group with a carbon number of 6-20).

7. The method of manufacturing a semiconductor device according to claim 1, wherein
the silicon compound has an average molecular weight of not more than 300.

8. The method of manufacturing a semiconductor device according to claim 1, wherein
the silicon compound includes a silicon atom number of not more than 5 in 1 molecule.

9. The method of manufacturing a semiconductor device according to claim 1, wherein the silicon compound includes a functional group having an additional reactivity.

10. The method of manufacturing a semiconductor device according to claim 1, wherein
in forming the opening, the opening including a via-hole formed in a part of the insulating film, and an interconnection trench formed in an upper part of the insulating film in connection with the via-hole is formed.

11. The method of manufacturing a semiconductor device according to claim 1, wherein
the insulating film has a relative dielectric constant of not more than 3.

12. The method of manufacturing a semiconductor device according to claim 1, wherein
in forming the opening, the opening is formed by dry etching.

13. The method of manufacturing a semiconductor device according to claim 1,
further comprising: forming a barrier metal on the insulating film with the opening formed after forming the opening and before forming the conductive film,
wherein in burying the conductive film in the opening, the conductive film and the barrier metal above the insulating film are removed by CMP.

* * * * *